(12) United States Patent
Okazaki et al.

(10) Patent No.: US 9,318,317 B2
(45) Date of Patent: *Apr. 19, 2016

(54) INSULATING FILM, METHOD FOR MANUFACTURING SEMICONDUCTOR DEVICE, AND SEMICONDUCTOR DEVICE

(71) Applicant: Semiconductor Energy Laboratory Co., Ltd., Atsugi-shi, Kanagawa-ken (JP)

(72) Inventors: Kenichi Okazaki, Tochigi (JP); Toshinari Sasaki, Shinagawa (JP); Shuhei Yokoyama, Tochigi (JP); Takashi Hamochi, Shimotsuga (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/543,287

(22) Filed: Nov. 17, 2014

(65) Prior Publication Data
US 2015/0072535 A1 Mar. 12, 2015

Related U.S. Application Data

(63) Continuation of application No. 13/795,770, filed on Mar. 12, 2013, now Pat. No. 8,901,556.

(30) Foreign Application Priority Data

Apr. 6, 2012 (JP) .................................. 2012-087432
Jul. 12, 2012 (JP) .................................. 2012-156492

(51) Int. Cl.
H01L 29/786 (2006.01)
H01L 21/02 (2006.01)
H01L 29/66 (2006.01)

(52) U.S. Cl.
CPC .... *H01L 21/02274* (2013.01); *H01L 21/02112* (2013.01); *H01L 29/66742* (2013.01); *H01L 29/66969* (2013.01); *H01L 29/7869* (2013.01)

(58) Field of Classification Search
CPC ...................... H01L 29/7869; H01L 29/78693
USPC ...................... 438/104, 786; 257/43, E29.296
See application file for complete search history.

(56) References Cited

U.S. PATENT DOCUMENTS 5,528,032 A   6/1996   Uchiyama
5,731,856 A   3/1998   Kim et al.
(Continued)

FOREIGN PATENT DOCUMENTS

CN   001129492 A   8/1996
CN   001245972 A   3/2000
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Daniel Shook
(74) *Attorney, Agent, or Firm* — Robinson Intellectual Property Law Office; Eric J. Robinson

(57) ABSTRACT

In a semiconductor device including a transistor including an oxide semiconductor film and a protective film over the transistor, an oxide insulating film containing oxygen in excess of the stoichiometric composition is formed as the protective film under the following conditions: a substrate placed in a treatment chamber evacuated to a vacuum level is held at a temperature higher than or equal to 180° C. and lower than or equal to 260° C.; a source gas is introduced into the treatment chamber so that the pressure in the treatment chamber is set to be higher than or equal to 100 Pa and lower than or equal to 250 Pa; and a high-frequency power higher than or equal to 0.17 W/cm² and lower than or equal to 0.5 W/cm² is supplied to an electrode provided in the treatment chamber.

12 Claims, 29 Drawing Sheets

(56) References Cited

U.S. PATENT DOCUMENTS

| | | | |
|---|---|---|---|
| 5,744,864 A | 4/1998 | Cillessen et al. |
| 5,834,827 A | 11/1998 | Miyasaka et al. |
| 5,858,819 A | 1/1999 | Miyasaka |
| 6,017,779 A | 1/2000 | Miyasaka |
| 6,146,928 A | 11/2000 | Ishiguro et al. |
| 6,294,274 B1 | 9/2001 | Kawazoe et al. |
| 6,335,542 B2 | 1/2002 | Miyasaka |
| 6,563,174 B2 | 5/2003 | Kawasaki et al. |
| 6,727,522 B1 | 4/2004 | Kawasaki et al. |
| 6,972,433 B2 | 12/2005 | Miyasaka |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,389,417 B2 | 3/2013 | Yamazaki et al. |
| 8,901,556 B2 * | 12/2014 | Okazaki ............ H01L 29/66742 257/43 |
| 2001/0013607 A1 | 8/2001 | Miyasaka |
| 2001/0032986 A1 | 10/2001 | Miyasaka |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0003429 A1 | 1/2011 | Oikawa et al. |
| 2011/0114945 A1 | 5/2011 | Yamazaki et al. |
| 2011/0127518 A1 | 6/2011 | Jung et al. |
| 2011/0216566 A1 | 9/2011 | Kamata |
| 2012/0138922 A1 | 6/2012 | Yamazaki et al. |
| 2012/0231580 A1 | 9/2012 | Yamazaki et al. |
| 2012/0286252 A1 | 11/2012 | Seo et al. |
| 2013/0153892 A1 | 6/2013 | Sasaki et al. |
| 2013/0187161 A1 * | 7/2013 | Yamazaki ............. H01L 29/786 257/57 |
| 2013/0270549 A1 | 10/2013 | Okazaki et al. |
| 2013/0270550 A1 | 10/2013 | Okazaki et al. |
| 2014/0030845 A1 | 1/2014 | Koezuka et al. |

FOREIGN PATENT DOCUMENTS

| | | |
|---|---|---|
| CN | 001495857 A | 5/2004 |
| CN | 001495869 A | 5/2004 |
| CN | 102473729 A | 5/2012 |
| DE | 69531654 | 7/2004 |
| EP | 0714140 A | 5/1996 |
| EP | 1335419 A | 8/2003 |
| EP | 1722403 A | 11/2006 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-167280 A | 6/2005 |
| JP | 2005-203800 A | 7/2005 |

(56) References Cited

FOREIGN PATENT DOCUMENTS

| | | |
|---|---|---|
| JP | 2007-096055 A | 4/2007 |
| JP | 2007-123861 A | 5/2007 |
| JP | 2009-044171 A | 2/2009 |
| JP | 2011-029637 A | 2/2011 |
| JP | 2011-124557 A | 6/2011 |
| JP | 2011-205882 A | 10/2011 |
| JP | 2012-160744 A | 8/2012 |
| KR | 2012-0046222 A | 5/2012 |
| TW | 201118957 | 6/2011 |
| TW | 201135913 | 10/2011 |
| TW | 201201496 | 1/2012 |
| WO | WO-95/34916 | 12/1995 |
| WO | WO-2004/114391 | 12/2004 |
| WO | WO-2011/001822 | 1/2011 |
| WO | WO-2011/058913 | 5/2011 |
| WO | WO-2011/108374 | 9/2011 |

OTHER PUBLICATIONS

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of TechnicalPapers, May 31, 2009, vol. 40, pp. 899-902.

Kanno.H et al., "White Stacked Electrophosphorecent Organic Light-Emitting Devices Employing MoO3 as a charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Parks et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44

Osada.T et al., "Development of Driver-Integrated Panel Using Amorphous In—Ga—Zn—Oxide TFT", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1984, vol. 26, No. 18, pp. 1216-1219.
Park.Sang-Hee et al., "42:3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B. (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202.1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
International Search Report (Application No. PCT/JP2013/058888) Dated Jun. 25, 2013.
Written Opinion (Application No. PCT/JP2013/058888) Dated Jun. 25, 2013.

* cited by examiner (0.025W/cm$^2$)　(0.17W/cm$^2$　(0.25W/cm$^2$)　(0.34W/cm$^2$)

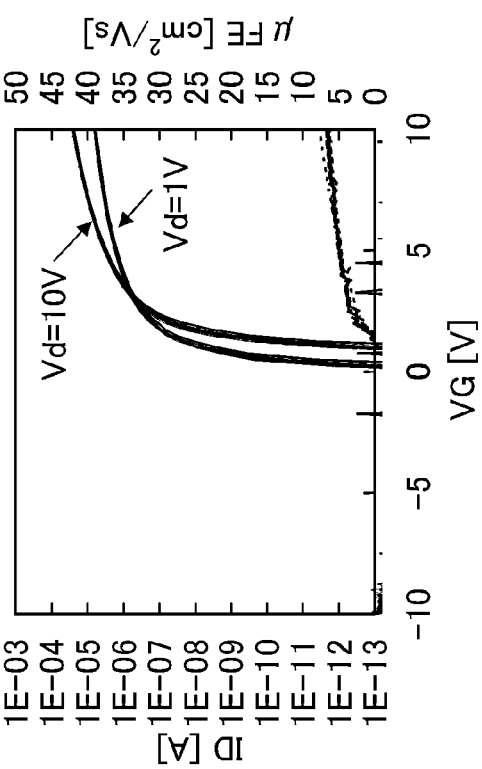
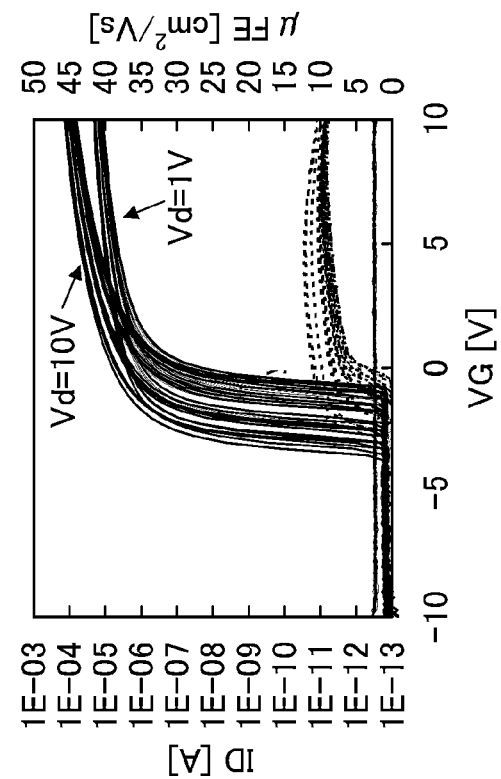
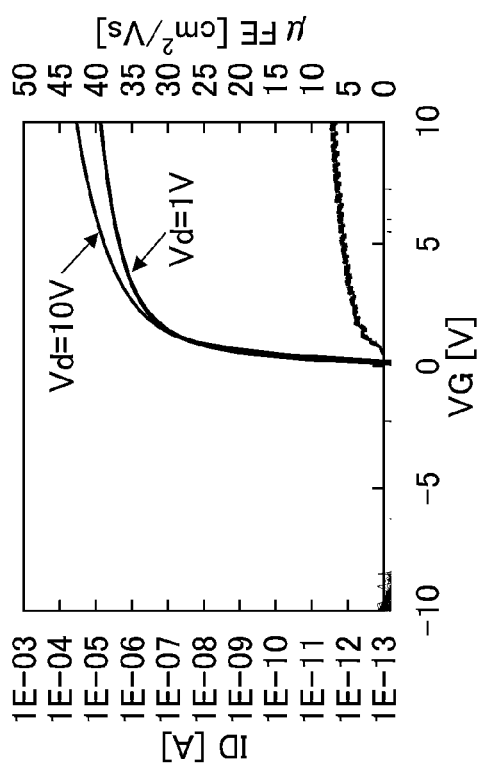
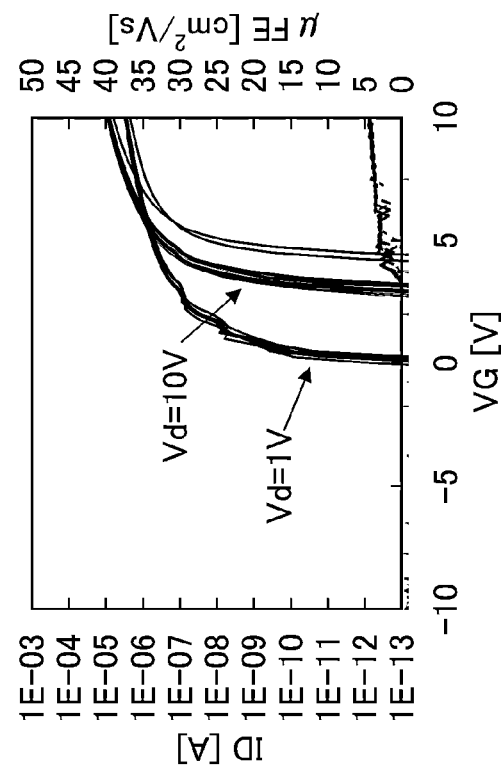

INSULATING FILM, METHOD FOR MANUFACTURING SEMICONDUCTOR DEVICE, AND SEMICONDUCTOR DEVICE

TECHNICAL FIELD

The present invention relates to a method for forming an insulating film and a method for manufacturing a semiconductor device including a field-effect transistor.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique is disclosed, in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

Patent Document

[Patent Document 1] Japanese Published Patent Application No. 2007-123861
[Patent Document 2] Japanese Published Patent Application No. 2007-096055

DISCLOSURE OF INVENTION

In a transistor using an oxide semiconductor, oxygen vacancies (oxygen defects) in an oxide semiconductor film cause defects of electric characteristics of the transistor. For example, the threshold voltage of a transistor using an oxide semiconductor film with oxygen vacancies easily shifts in the negative direction, and such a transistor tends to be normally-on. This is because electric charges are generated owing to oxygen vacancies in the oxide semiconductor, and the resistance is reduced.

In addition, a transistor using an oxide semiconductor film with oxygen vacancies has such a problem that the electric characteristics, typically, the threshold voltage, are changed with time or changed by a gate bias-temperature (BT) stress test under light.

Thus, an object of one embodiment of the present invention is to reduce the amount of oxygen vacancies contained in an oxide semiconductor used in a semiconductor device. Further, another object of one embodiment of the present invention is to improve electric characteristics of a semiconductor device using an oxide semiconductor.

According to one embodiment of the present invention, an oxide insulating film containing oxygen more than oxygen satisfying the stoichiometric composition (i.e., containing oxygen in excess of the stoichiometric composition) is formed by a plasma CVD method.

According to one embodiment of the present invention, in a semiconductor device including a transistor including an oxide semiconductor film and a protective film over the transistor, an oxide insulating film containing oxygen in excess of the stoichiometric composition is formed as the protective film by a plasma CVD method.

According to one embodiment of the present invention, in a semiconductor device including a transistor including an oxide semiconductor film and a protective film over the transistor, an oxide insulating film containing oxygen in excess of the stoichiometric composition is formed as the protective film under conditions where a substrate placed in a treatment chamber evacuated to a vacuum level is held at a temperature higher than or equal to 180° C. and lower than or equal to 260° C., a source gas is introduced into the treatment chamber to set a pressure in the treatment chamber to be higher than or equal to 100 Pa and lower than or equal to 250 Pa, and a high-frequency power higher than or equal to 0.17 W/cm$^2$ and lower than or equal to 0.5 W/cm$^2$ is supplied to an electrode provided in the treatment chamber.

According to one embodiment of the present invention, in a semiconductor device including a transistor including an oxide semiconductor film and a protective film over the transistor, an oxide insulating film containing oxygen in excess of the stoichiometric composition is formed as the protective film under conditions where a substrate placed in a treatment chamber evacuated to a vacuum level is held at a temperature higher than or equal to 180° C. and lower than or equal to 260° C., a source gas is introduced into the treatment chamber to set a pressure in the treatment chamber to be higher than or equal to 100 Pa and lower than or equal to 250 Pa, and a high-frequency power higher than or equal to 0.17 W/cm$^2$ and lower than or equal to 0.5 W/cm$^2$ is supplied to an electrode provided in the treatment chamber; and then heat treatment is performed so that oxygen contained in the protective film is diffused to the oxide semiconductor film.

Further, in one embodiment of the present invention, a transistor which includes a gate electrode, an oxide semiconductor film overlapping with part of the gate electrode with a gate insulating film interposed therebetween, and a pair of electrodes in contact with the oxide semiconductor film, and a protective film is provided over the oxide semiconductor film. The protective film is an oxide insulating film in which the spin density of a signal at g=2.001, measured by electron spin resonance, is lower than 1.5×10$^{18}$ spins/cm$^3$.

Note that the pair of electrodes is provided between the gate insulating film and the oxide semiconductor film. Alternatively, the pair of electrodes is provided between the oxide semiconductor film and the protective film.

Further, one embodiment of the present invention is a semiconductor device which includes a transistor including an oxide semiconductor film, a pair of electrodes in contact with the oxide semiconductor film, a gate insulating film over the oxide semiconductor film, and a gate electrode overlapping with part of the oxide semiconductor film with the gate insulating film interposed therebetween and a protective film covering the gate insulating film and the gate electrode. The protective film is an oxide insulating film in which the spin density of a signal at g=2.001, measured by electron spin resonance, is lower than 1.5×10$^{18}$ spins/cm$^3$.

In a transistor including an oxide semiconductor, an oxide insulating film containing oxygen in excess of the stoichiometric composition is formed as a protective film formed over the transistor, and the oxygen in the protective film is diffused to the oxide semiconductor film, so that the amount of oxygen vacancies contained in the oxide semiconductor film can be reduced. Therefore, according to one embodiment of the present invention, a semiconductor device having excellent electric characteristics can be provided.

BRIEF DESCRIPTION OF DRAWINGS

FIGS. 25A to 25D show initial characteristics of current-voltage characteristics of manufactured samples.

BEST MODE FOR CARRYING OUT THE INVENTION

Figure 1A:
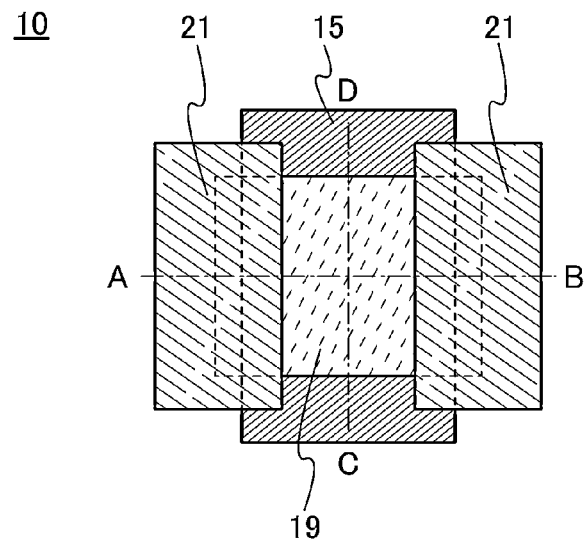
FIGS. 1A to 1C are a top view and cross-sectional views illustrating one embodiment of a transistor.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be interpreted as being limited to the description of the embodiments. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flowing is changed in circuit operation, for example.

In this specification, in the case where an etching step is performed after a photolithography step, a mask formed by the photolithography step is removed.

(Embodiment 1)

In this embodiment, a semiconductor device which is one embodiment of the present invention, and a method for manufacturing the semiconductor device will be described with reference to drawings.

Figure 1B:
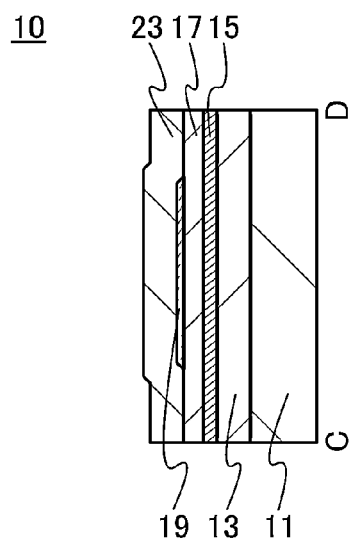
Figure 1C:
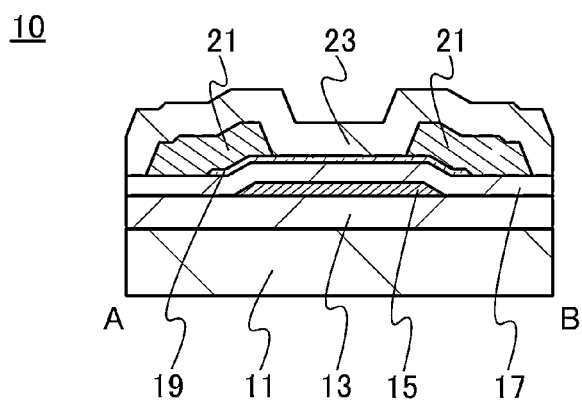

FIGS. 1A to 1C are a top view and cross-sectional views of a transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, some components of the transistor 10 (e.g., a substrate 11, a base insulating film 13, and a gate insulating film 17), a protective film 23, and the like are not illustrated for simplicity.

The transistor 10 illustrated in FIGS. 1B and 1C includes a gate electrode 15 over the base insulating film 13, the gate insulating film 17 over the base insulating film 13 and the gate electrode 15, an oxide semiconductor film 19 overlapping with the gate electrode 15 with the gate insulating film 17 interposed therebetween, and a pair of electrodes 21 in contact with the oxide semiconductor film 19. In addition, the protective film 23 covering the gate insulating film 17, the oxide semiconductor film 19, and the pair of electrodes 21 is provided.

The protective film 23 provided over the transistor 10 shown in this embodiment is an oxide insulating film containing oxygen in excess of the stoichiometric composition. It is preferable that the protective film 23 contain a larger amount of oxygen than that of oxygen vacancies in the oxide semiconductor film 19. Such an oxide insulating film containing oxygen in excess of the stoichiometric composition is an oxide insulating film from which part of oxygen is released by heating. Thus, when the oxide insulating film from which part of oxygen is released by heating is provided as the protective film 23, oxygen is diffused into the oxide semiconductor film 19 by performing heat treatment, so that oxygen vacancies in the oxide semiconductor film 19 can be filled. As a result, the amount of oxygen vacancies in the oxide semiconductor film 19 is reduced, the threshold voltage of the transistor can be prevented from shifting in the negative direction. Further, a shift in the threshold voltage with time or a shift in the threshold voltage due to a gate BT stress under light is small; thus, the transistor can have excellent electric characteristics.

In the transistor 10, some oxygen contained in the protective film 23 directly transfers to the oxide semiconductor film 19, and further some oxygen in a region where the gate insulating film 17 is in contact with the protective film 23 transfers to the oxide semiconductor film 19 through the gate insulating film 17.

Further, as for the protective film 23, the spin density of a signal at g=2.001, measured by electron spin resonance, is preferably lower than $1.5 \times 10^{18}$ spins/cm$^3$, further preferably lower than or equal to $1.0 \times 10^{18}$ spins/cm$^3$. When the spin density of the protective film 23 is within the above range, defects at the interface between the oxide semiconductor film 19 and the protective film 23 and defects in the protective film 23 can be reduced; electron traps in such regions can be reduced. As a result, as electric characteristics of the transistor, the rising voltage of the on-state current is the substantially same even when the drain voltage varies. In other words, a transistor with excellent electric characteristics can be provided. Note that the above spin density of the protective film 23 is a value obtained after heat treatment.

As the protective film 23, a silicon oxide film, a silicon oxynitride film, or the like can be formed to have a thickness greater than or equal to 30 nm and less than or equal to 500 nm, preferably greater than or equal to 100 nm and less than or equal to 400 nm.

Other details of the transistor 10 are described below.

There is no particular limitation on the property of a material and the like of the substrate 11 as long as the material has heat resistance enough to withstand at least heat treatment to be performed later. For example, a glass substrate, a ceramic substrate, a quartz substrate, a sapphire substrate, or the like may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11.

Still further alternatively, a flexible substrate may be used as the substrate 11, and the base insulating film 13 and the transistor 10 may be provided directly on the flexible substrate. Alternatively, a separation layer may be provided between the substrate 11 and the base insulating film 13. The separation layer can be used when part or the whole of a semiconductor device formed over the separation layer is separated from the substrate 11 and transferred onto another substrate. In such a case, the transistor 10 can be transferred to a substrate having low heat resistance or a flexible substrate as well.

Typical examples of the base insulating film 13 are films of silicon oxide, silicon oxynitride, silicon nitride, silicon nitride oxide, gallium oxide, hafnium oxide, yttrium oxide, aluminum oxide, aluminum oxynitride, and the like. When silicon nitride, gallium oxide, hafnium oxide, yttrium oxide, aluminum oxide, or the like is used for the base insulating film 13, diffusion of impurities such as alkali metal, water, or hydrogen from the substrate 11 to the oxide semiconductor film 19 can be suppressed.

The gate electrode 15 can be formed using a metal element selected from aluminum, chromium, copper, tantalum, titanium, molybdenum, and tungsten; an alloy containing any of these metal elements as a component; an alloy film containing these metal elements in combination; or the like. Further, one or more metal elements selected from manganese and zirconium may be used. Further, the gate electrode 15 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, between the gate electrode 15 and the gate insulating film 17, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like is preferably provided. These films each have a work function higher than or equal to 5 eV, preferably higher than or equal to 5.5 eV, which is higher than the electron affinity of the oxide semiconductor. Thus, the threshold voltage of the transistor including an oxide semiconductor can be a positive value, and a so-called normally-off switching element can be achieved. For example, in the case of using an In—Ga—Zn-based oxynitride semiconductor film, the In—Ga—Zn-based oxynitride semiconductor film preferably has a nitrogen concentration at least higher than that of the oxide semiconductor film 19; specifically, the In—Ga—Zn-based oxynitride semiconductor film preferably has a nitrogen concentration higher than or equal to 7 at. %.

As the gate insulating film 17, a single layer or a stacked layer using one or more of silicon oxide, silicon oxynitride, silicon nitride oxide, silicon nitride, aluminum oxide, hafnium oxide, gallium oxide, a Ga—Zn-based metal oxide, and the like can be used. In the gate insulating film 17, an oxide insulating film from which oxygen is released by heating may be used to be in contact with the oxide semiconductor film 19. With use of a film from which oxygen is released by heating as the gate insulating film 17, the interface state density at the interface between the oxide semiconductor film 19 and the gate insulating film 17 can be reduced. Thus, a transistor with less deterioration in electric characteristics can be obtained. Further, when an insulating film which blocks oxygen, hydrogen, water, and the like is provided on the gate electrode side in the gate insulating film 17, oxygen can be prevented from diffusing from the oxide semiconductor film 19 to the outside, and hydrogen and water can be prevented from entering the oxide semiconductor film 19 from the outside. As the insulating film which can block oxygen, hydrogen, water, and the like, an aluminum oxide film, an aluminum oxynitride film, a gallium oxide film, a gallium oxynitride film, a yttrium oxide film, a yttrium oxynitride film, a hafnium oxide film, a hafnium oxynitride film, or the like can be given.

The gate insulating film 17 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 17 is greater than or equal to 5 nm and less than or equal to 400 nm, preferably greater than or equal to 10 nm and less than or equal to 300 nm, further preferably greater than or equal to 50 nm and less than or equal to 250 nm.

The oxide semiconductor film 19 preferably contains at least indium (In) or zinc (Zn). Alternatively, the oxide semiconductor film 19 preferably contains both In and Zn. In order to reduce variation in electrical characteristics of the transistors including the oxide semiconductor film, the oxide semiconductor film 19 preferably contains one or more of stabilizers in addition to In or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, a single-component metal oxide such as an indium oxide, a tin oxide, or a zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide can be used.

For the above-listed metal oxides, an In—Ga—Zn-based metal oxide, for example, is an oxide whose main components are In, Ga, and Zn, and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

For example, an In—Ga—Zn-based metal oxide with an atomic ratio of In:Ga:Zn=1:1:1(=1/3:1/3:1/3), In:Ga:Zn=2:2:1(=2/5:2/5:1/5), In:Ga:Zn=3:1:1(=1/2:1/6:1/3), or an oxide with an atomic ratio close to the above atomic ratios can be used. Alternatively, an In—Sn—Zn-based metal oxide with an atomic ratio of In:Sn:Zn=1:1:1(=1/3:1/3:1/3), In:Sn:Zn=2:1:3(=1/3:1/6:1/2), or In:Sn:Zn=2:1:5(=1/4:1/8:5/8), or an oxide with an atomic ratio close to the above atomic ratios may be used. Note that a proportion of each atom in the atomic ratio of the metal oxide varies within a range of ±20% as an error.

However, without limitation to the materials given above, a material with an appropriate composition may be used depending on needed semiconductor characteristics and electric characteristics (e.g., field-effect mobility, the threshold voltage, and the like). In order to obtain necessary semiconductor characteristics and electric characteristics, it is preferable that the carrier density, the impurity concentration, the defect density, the atomic ratio of a metal element to oxygen, the interatomic distance, the density, and the like be set to be appropriate.

For example, high mobility can be obtained relatively easily in the case where the In—Sn—Zn-based metal oxide is used. However, the mobility can be increased by reducing the defect density in the bulk also in the case where the In—Ga—Zn-based metal oxide is used.

Further, the energy gap of a metal oxide that can form the oxide semiconductor film 19 is greater than or equal to 2 eV, preferably greater than or equal to 2.5 eV, further preferably greater than or equal to 3 eV. In this manner, the off-state current of a transistor can be reduced by using an oxide semiconductor having a wide energy gap.

Note that the oxide semiconductor film 19 may have an amorphous structure, a single crystal structure, or a polycrystalline structure.

The oxide semiconductor film 19 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystal oxide semiconductor). In the CAAC-OS, for example, c-axes are aligned, and a-axes and/or b-axes are not macroscopically aligned.

For example, the oxide semiconductor film 19 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film 19 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 19 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor film 19 may be in a single-crystal state, for example. An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Details of the CAAC-OS film are described. Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is reduced in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, change in electric characteristics of the transistor due to irradiation with visible light or ultraviolet light is small. Thus, the transistor has high reliability.

Alternatively, the oxide semiconductor film 19 may have a stacked-layer structure of a plurality of oxide semiconductor films. For example, the oxide semiconductor film 19 may be a stack of a first oxide semiconductor film and a second oxide semiconductor film that are formed using metal oxides with different compositions. For example, the first oxide semiconductor film may be formed using any of two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film are made to be the same and the composition of the constituent elements of the first oxide semiconductor film and the second oxide semiconductor film may be made to be different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3. Note that a proportion of each atom in the atomic ratio of the oxide semiconductor varies within a range of ±20% as an error.

At this time, one of the first oxide semiconductor film and the second oxide semiconductor film which is closer to the gate electrode (i.e., which is on a channel side) preferably contains In and Ga at a proportion of In>Ga. The other which is farther from the gate electrode layer (i.e., which is on a back channel side) preferably contains In and Ga at a proportion of In≤Ga.

In an oxide semiconductor, the s orbital of heavy metal mainly contributes to carrier transfer, and when the In content in the oxide semiconductor is increased, overlap of the s orbitals is likely to be increased. Therefore, an oxide having a composition of In>Ga has higher mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In>Ga.

An oxide semiconductor containing In and Ga at a proportion of In>Ga is used on a channel side, and an oxide semiconductor containing In and Ga at a proportion of In≤Ga is used on a back channel side; so that field-effect mobility and reliability of a transistor can be further improved.

Further, oxide semiconductors having different crystallinities may be used for the first oxide semiconductor film and the second oxide semiconductor film. That is, the oxide semiconductor film may be formed using any of a single crystal oxide semiconductor film, a polycrystalline oxide semiconductor film, a microcrystalline oxide semiconductor film, an amorphous oxide semiconductor film, and a CAAC-OS film, as appropriate. When an amorphous oxide semiconductor is used for at least one of the first oxide semiconductor film and the second oxide semiconductor film, internal stress or external stress of the oxide semiconductor film 19 is relieved, variation in characteristics of a transistor is reduced, and reliability of the transistor can be further improved.

The thickness of the oxide semiconductor film 19 is greater than or equal to 1 nm and less than or equal to 100 nm, preferably greater than or equal to 1 nm and less than or equal to 50 nm, further preferably, greater than or equal to 1 nm and less than or equal to 30 nm, still further preferably greater than or equal to 3 nm and less than or equal to 20 nm.

The concentration of alkali metals or alkaline earth metals in the oxide semiconductor film 19 is preferably lower than or equal to $1\times10^{18}$ atoms/cm$^3$, further preferably lower than or equal to $2\times10^{16}$ atoms/cm$^3$. This is because an alkali metal and an alkaline earth metal are bonded to an oxide semiconductor to generate carriers in some cases, which causes an increase in off-state current of the transistor.

The oxide semiconductor film 19 may contain nitrogen at a concentration lower than or equal to $5\times10^{18}$ atoms/cm$^3$.

The pair of electrodes 21 are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Although the pair of electrodes 21 is provided between the oxide semiconductor film 19 and the protective film 23 in this embodiment, the pair of electrodes 21 may be provided between the gate insulating film 17 and the oxide semiconductor film 19.

Next, a method for manufacturing the transistor illustrated in FIGS. 1A to 1C will be described with reference to FIGS. 2A to 2D.

Figure 2A:
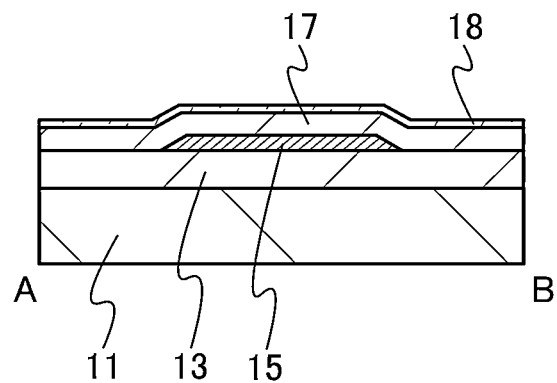
FIGS. 2A to 2D are cross-sectional views illustrating one embodiment of a method for manufacturing a transistor.

As illustrated in FIG. 2A, the base insulating film 13 and the gate electrode 15 are formed over the substrate 11, and the gate insulating film 17 is formed over the gate electrode 15. Next, an oxide semiconductor film 18 is formed over the gate insulating film 17.

The base insulating film 13 is formed by a sputtering method, a CVD method, or the like. Here, a 100-nm-thick silicon oxynitride film is formed by a CVD method.

A method for forming the gate electrode 15 is described below. First, a conductive film is formed by a sputtering method, a CVD method, an evaporation method, or the like. A mask is formed by a photolithography step over the conductive film. Next, with use of the mask, part of the conductive film is etched, so that the gate electrode 15 is formed. After that, the mask is removed.

Note that the gate electrode 15 may be formed by an electrolytic plating method, a printing method, an inkjet method, or the like, instead of the above formation method.

Here, a 100-nm-thick tungsten film is formed by a sputtering method. Next, a mask is formed by a photolithography step, and the tungsten film is dry-etched with use of the mask to form the gate electrode 15.

The gate insulating film 17 is formed by a sputtering method, a CVD method, an evaporation method, or the like.

Here, a 50-nm-thick silicon nitride film is formed by a CVD method, and then a 200-nm-thick silicon oxynitride film is formed by a CVD method, whereby the gate insulating film 17 is formed.

The oxide semiconductor film 18 is formed by a sputtering method, a coating method, a pulsed laser deposition method, a laser ablation method, or the like.

In the case where the oxide semiconductor film 18 is formed by a sputtering method, as a power supply device for generating plasma, an RF power supply device, an AC power supply device, a DC power supply device, or the like can be used as appropriate.

As a sputtering gas, a rare gas (typically argon), an oxygen gas, or a mixed gas atmosphere of a rare gas and oxygen is used as appropriate. In the case of using the mixed gas of a rare gas and oxygen, the proportion of oxygen is preferably higher than that of a rare gas.

Further, a target may be selected as appropriate in accordance with composition of the oxide semiconductor film 18 to be formed.

For example, in the case where the oxide semiconductor film 18 is formed by a sputtering method, deposition is performed at a substrate temperature higher than or equal to 150° C. and lower than or equal to 750° C., preferably higher than or equal to 150° C. and lower than or equal to 450° C., further preferably higher than or equal to 200° C. and lower than or equal to 350° C. to form the oxide semiconductor film 18, whereby a CAAC-OS film can be formed.

The CAAC-OS film is formed by, for example, a sputtering method using an oxide semiconductor sputtering target which is a polycrystal. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than a strain point of the substrate, preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based metal oxide target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Figure 2B:
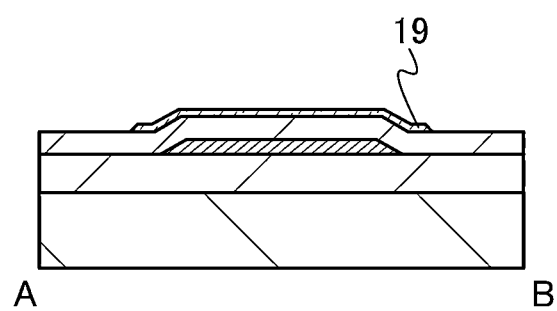

Next, as illustrated in FIG. 2B, the oxide semiconductor film 19 that is subjected to element isolation is formed to be over the gate insulating film 17 and overlap with part of the gate electrode 15. The oxide semiconductor film 19 that is subjected to element isolation can be formed by forming a mask over the oxide semiconductor film 18 through a photolithography step and etching part of the oxide semiconductor film 18 with use of the mask.

By using a printing method for forming the oxide semiconductor film 19, the oxide semiconductor film 19 that is subjected to element isolation can be formed directly.

In this case, the oxide semiconductor film 18 is formed to a thickness of 35 nm by a sputtering method, a mask is formed over the oxide semiconductor film 18, and part of the oxide semiconductor film 18 is etched, so that the oxide semiconductor film 19 is formed. After that, the mask is removed.

Figure 2C:
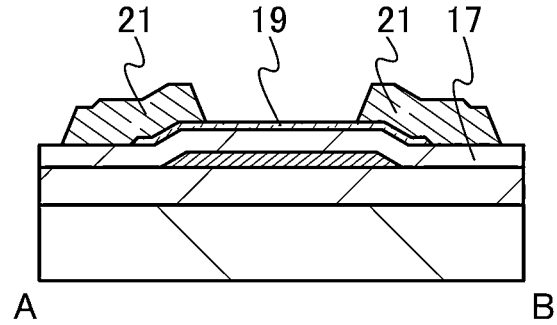

Next, as illustrated in FIG. 2C, the pair of electrodes 21 is formed.

A method for forming the pair of electrodes 21 is described below. First, a conductive film is formed by a sputtering method, a CVD method, an evaporation method, or the like. Then, a mask is formed over the conductive film by a photolithography step. Next, the conductive film is etched with use of the mask to form the pair of electrodes 21. After that, the mask is removed.

Here, a 50-nm-thick tungsten film, a 400-nm-thick aluminum film, and a 100-nm-thick titanium film are deposited by a sputtering method in this order to form a stack. Next, a mask is formed over the titanium film by a photolithography step and the tungsten film, the aluminum film, and the titanium film are dry-etched with use of the mask to form the pair of electrodes 21.

After the pair of electrodes 21 is formed, cleaning treatment is preferably performed to remove an etching residue. A short circuit of the pair of electrodes 21 can be suppressed by this cleaning treatment. The cleaning treatment can be performed using an alkaline solution such as a tetramethylammonium hydroxide (TMAH) solution, an acidic solution such as a diluted hydrofluoric acid solution, an oxalic acid solution, or a phosphorus acid solution, or water.

Figure 2D:
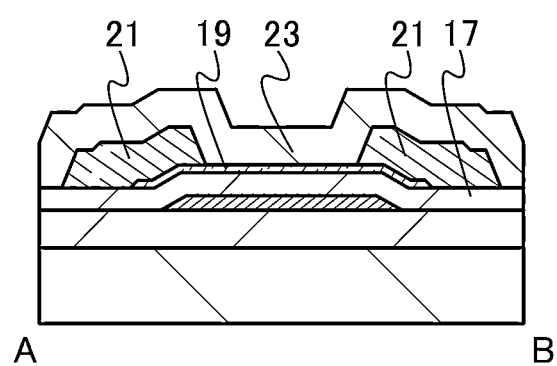

Next, as illustrated in FIG. 2D, the protective film 23 is formed.

After the pair of electrodes 21 is formed, as the protective film 23, a silicon oxide film or a silicon oxynitride film is formed over the substrate 11 under the following conditions: the substrate 11 placed in a treatment chamber evacuated to a vacuum level in a plasma CVD apparatus is held at a temperature higher than or equal to 180° C. and lower than or equal to 260° C., preferably higher than or equal to 180° C. and lower than or equal to 250° C., further preferably higher than or equal to 180° C. and lower than or equal to 230° C.; a source gas is introduced into the treatment chamber to set the pressure in the treatment chamber to be higher than or equal to 100 Pa and lower than or equal to 250 Pa, preferably higher than or equal to 100 Pa and lower than or equal to 200 Pa; and the high-frequency power supplied to an electrode provided in the treatment chamber is greater than or equal to 0.17 $W/cm^2$ and less than or equal to 0.5 $W/cm^2$, preferably greater than or equal to 0.25 $W/cm^2$ and less than or equal to 0.40 $W/cm^2$, further preferably greater than or equal to 0.26 $W/cm^2$ and less than or equal to 0.35 $W/cm^2$.

As a source gas of the protective film 23, a deposition gas containing silicon and an oxidation gas is preferably used. Typical examples of the deposition gas containing silicon include silane, disilane, trisilane, and silane fluoride. Examples of the oxidation gas include oxygen, ozone, dinitrogen monoxide, and nitrogen dioxide.

As the deposition condition of the protective film 23, the high-frequency power with the above power density is supplied in the treatment chamber under the above pressure, whereby the decomposition efficiency of the source gas in plasma is promoted, oxygen radicals are increased, and oxidation of the deposition gas containing silicon is promoted; thus, the amount of oxygen contained in the protective film 23 exceeds the stoichiometric composition. However, in the case where the substrate temperature is within the above temperature range, the bond between silicon and oxygen is weak, and accordingly, part of oxygen is released by heating. As a result, an oxide insulating film containing oxygen in excess of the stoichiometric composition can be formed. In other words, an oxide insulating film from which part of contained oxygen is released by heating can be formed.

In the source gas of the protective film 23, the ratio of the deposition gas containing silicon to the oxidation gas is increased, and the high-frequency power is set to have the above power density. Thus, the deposition rate can be increased, and the amount of oxygen contained in the protective film can be increased.

Here, a 400-nm-thick silicon oxynitride film is formed as the protective film 23 by a plasma CVD method under the following conditions: silane with a flow rate of 160 sccm and dinitrogen monoxide with a flow rate of 4000 sccm are used as a source gas; the pressure in the treatment chamber is 200 Pa; the substrate temperature is 220° C.; and a high-frequency power of 1500 W is supplied to parallel plate electrodes with a high-frequency power supply of 27.12 MHz. Note that a plasma CVD apparatus used here is a parallel plate plasma CVD apparatus in which the electrode area is 6000 $cm^2$, and the power per unit area (power density) into which the supplied power is converted is 0.25 $W/cm^2$.

Next, heat treatment is performed, whereby oxygen contained in the protective film 23 is diffused to the oxide semiconductor film 19 to fill oxygen vacancies in the oxide semiconductor film 19. Thus, the amount of oxygen vacancies contained in the oxide semiconductor film 19 can be reduced. In addition, by the heat treatment performed after formation of the protective film 23, the spin density of a signal at g=2.001 in the protective film 23, which is measured by electron spin resonance, is lower than $1.5 \times 10^{18}$ spins/$cm^3$, preferably lower than or equal to $1.0 \times 10^{18}$ spins/$cm^3$. The heat treatment is performed typically at a temperature higher than or equal to 150° C. and lower than the strain point of the substrate, preferably higher than or equal to 250° C. and lower than or equal to 450° C., further preferably higher than or equal to 300° C. and lower than or equal to 450° C.

Note that when the temperature in the heat treatment is higher than the temperature in depositing the protective film 23, more oxygen contained in the protective film 23 can be diffused to the oxide semiconductor film 19, and thus, oxygen vacancies in the oxide semiconductor film 19 can be filled more. The temperature at the heat treatment is higher than or equal to 250° C. and lower than the strain point of the substrate, preferably higher than or equal to 250° C. and lower than or equal to 450° C., further preferably higher than or equal to 300° C. and lower than or equal to 450° C.

An electric furnace, a rapid thermal annealing (RTA) apparatus, or the like can be used for the heat treatment. With the use of an RTA apparatus, the heat treatment can be performed at a temperature higher than or equal to the strain point of the substrate if the heating time is short. Thus, time for oxygen diffusion from the protective film 23 to the oxide semiconductor film 19 can be shortened.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like).

Here, the heat treatment is performed at 350° C. in an atmosphere of nitrogen and oxygen for 1 hour, so that oxygen contained in the protective film 23 is diffused to the oxide semiconductor film 19. In this embodiment, diffusion of oxygen from the protective film 23 to the oxide semiconductor film 19 is solid-phase diffusion; thus, oxygen can be supplied to the oxide semiconductor film 19 with less damage.

Through the above steps, a transistor with excellent electric characteristics in which a shift in the threshold voltage in the negative direction is suppressed can be manufactured. In addition, a highly reliable transistor in which a variation in electric characteristics with time or a variation in electric characteristics due to a gate BT stress test under light is small can be manufactured.

Next, a transistor having a structure different from that in FIGS. 1A to 1C will be described with reference to FIG. 3 and FIGS. 4A to 4E. In the transistor described here, films provided in contact with the oxide semiconductor film are dense films and have high film density as compared with those in the transistor 10. A structure of such a transistor is described with reference to FIG. 3.

Figure 3:
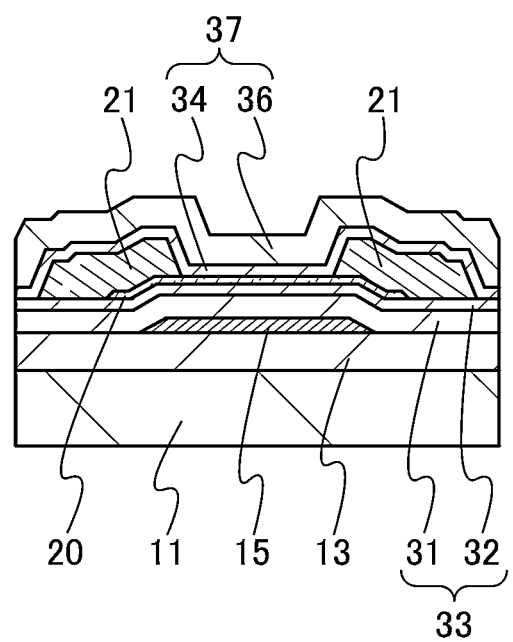
FIG. 3 is a cross-sectional view illustrating one embodiment of a transistor.

A transistor 30 illustrated in FIG. 3 includes the base insulating film 13 over the substrate 11 and the gate electrode 15 over the base insulating film 13. In addition, a gate insulating film 33 including an insulating film 31 and an insulating film 32 is provided over the base insulating film 13 and the gate electrode 15. An oxide semiconductor film 20 is provided to overlap with the gate electrode 15 with the gate insulating film 33 interposed therebetween, and the pair of electrodes 21 is provided to be in contact with the oxide semiconductor film 20. Further, a protective film 37 including an insulating film 34 and an insulating film 36 is formed over the gate insulating film 33, the oxide semiconductor film 20, and the pair of electrodes 21.

In the transistor 30 shown in this embodiment, the oxide semiconductor film 20 is exposed to plasma generated in an oxidation atmosphere. As the oxidation atmosphere, an atmosphere of oxygen, ozone, dinitrogen monoxide, or the like can be given. As a preferable method of plasma treatment, a parallel plate plasma CVD apparatus is used, plasma is generated under a condition where bias is applied to an upper electrode but is not applied to a lower electrode on which the substrate 11 is placed, and the oxide semiconductor film is exposed to the plasma. As a result, oxygen can be supplied to the oxide semiconductor film 20 with less damage, and the amount of oxygen vacancies in the oxide semiconductor film 20 can be reduced.

In the transistor 30, the insulating film 32 and the insulating film 34 are formed in contact with the oxide semiconductor film 20. The insulating film 32 and the insulating film 34 are each a dense film and have high film density. Thus, in a later step of forming the insulating film 36, damage on the oxide semiconductor film 20 can be reduced.

As each of the insulating film 32 and the insulating film 34, a silicon oxide film, a silicon oxynitride film, or the like can be formed to a thickness greater than or equal to nm and less than or equal to 400 nm, preferably greater than or equal to 5 nm and less than or equal to 50 nm, further preferably greater than or equal to 10 nm and less than or equal to 30 nm.

Further, the insulating film 36 included in the protective film 37 provided over the transistor 30 is an oxide insulating film containing oxygen in excess of the stoichiometric composition. It is preferable that the insulating film 36 contain a larger amount of oxygen than the amount of oxygen vacancies in the oxide semiconductor film 20. The oxide insulating film containing oxygen in excess of the stoichiometric composition is an oxide insulating film from which part of oxygen is released by heating. Thus, when the oxide insulating film from which part of oxygen is released by heating is provided as the protective film 37, oxygen can be diffused to the oxide semiconductor film 20 by heat treatment. By the heat treatment, oxygen contained in the insulating film 36 is diffused to the oxide semiconductor film 20, and thus, oxygen vacancies in the oxide semiconductor film 20 can be filled. As a result, the amount of oxygen vacancies in the oxide semiconductor film 20 is reduced, and accordingly, in the transistor, a shift in the threshold voltage in the negative direction can be suppressed. In addition, the transistor can have excellent electric characteristics in which a shift in the threshold voltage with time or a shift in the threshold voltage due to a gate BT stress test under light is small.

Note that in the transistor 30, oxygen contained in the insulating film 36 transfers to the oxide semiconductor film 20 through at least one of the insulating film 31, the insulating film 32, and the insulating film 34.

Next, a method for manufacturing the transistor in FIG. 3 will be described with reference to FIGS. 4A to 4E.

Figure 4A:
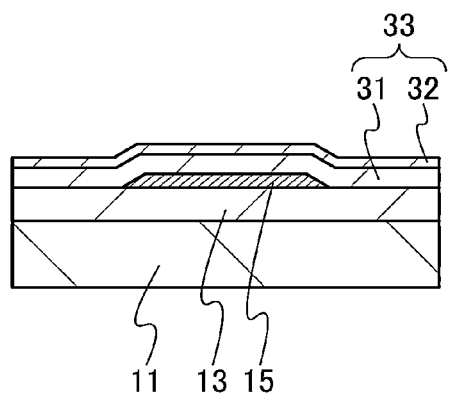
FIGS. 4A to 4E are cross-sectional views illustrating one embodiment of a method for manufacturing a transistor.

As illustrated in FIG. 4A, the base insulating film 13 and the gate electrode 15 are formed over the substrate 11, which is similar to Embodiment 1. Next, the insulating films 31 and 32 functioning as the gate insulating film 33 are formed.

As the insulating film 31, a silicon nitride film or a silicon nitride oxide film is formed by a CVD method to a thickness greater than or equal to 5 nm and less than or equal to 400 nm. Next, as the insulating film 32, a silicon oxide film or a silicon oxynitride film is formed by a CVD method to a thickness greater than or equal to 5 nm and less than or equal to 400 nm. Note that the thicknesses of the insulating film 31 and the insulating film 32 may be determined so that the sum of the thicknesses of the two insulating films is within the range of the thickness of the gate insulating film 17 in the transistor 10 in FIGS. 1A to 1C.

Here, a 50-nm-thick silicon nitride film is formed as the insulating film 31 by a plasma CVD method under the following conditions: silane with a flow rate of 50 sccm and dinitrogen monoxide with a flow rate of 5000 sccm are used as a source gas; the pressure in the treatment chamber is 60 Pa; the substrate temperature is 350° C.; and a high-frequency power of 1500 W is supplied to parallel plate electrodes with a high-frequency power supply of 27.12 MHz.

As the insulating film 32, a 200-nm-thick silicon oxynitride film is formed by a plasma CVD method under the following conditions: silane with a flow rate of 20 sccm and dinitrogen monoxide with a flow rate of 3000 sccm are used as a source gas; the pressure in the treatment chamber is 40 Pa; the substrate temperature is 350° C.; and a high-frequency power of 100 W is supplied to parallel plate electrodes with a high-frequency power supply of 27.12 MHz. With the above conditions, a dense silicon oxynitride film with higher film density than the insulating film 31 can be formed.

The gate insulating film 33 is formed to have a large thickness and preferably has a stacked structure of a silicon nitride film with resistivity higher than or equal to $5\times10^{13}$ Ω·cm and lower than or equal to $1\times10^{15}$ Ω·cm and a silicon oxynitride film, whereby in a transistor formed later, electrostatic breakdown caused between the gate electrode 15 and the oxide semiconductor film 20 or between the gate electrode 15 and the pair of electrodes 21 can be suppressed.

Figure 4B:
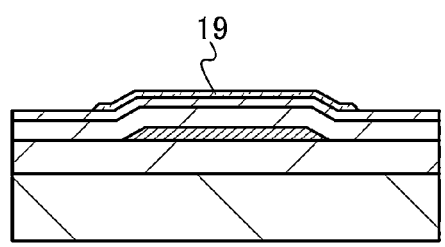

Next, as illustrated in FIG. 4B, the oxide semiconductor film 19 is formed over the gate insulating film 33, which is similar to Embodiment 1.

Figure 4C:
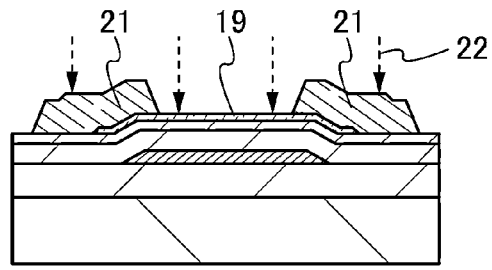
Figure 4D:
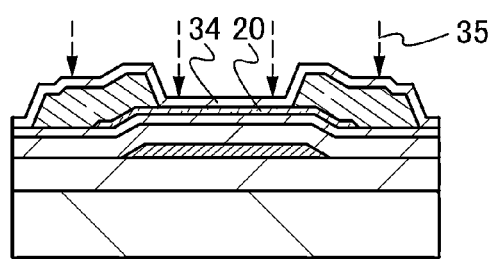

Next, as illustrated in FIG. 4C, the pair of electrode 21 is formed. Then, the oxide semiconductor film 19 is exposed to plasma generated in an oxidation atmosphere, and oxygen 22 is supplied to the oxide semiconductor film 19, so that the oxide semiconductor film 20 shown in FIG. 4D is formed. As the oxidation atmosphere, an atmosphere of oxygen, ozone, dinitrogen monoxide, or the like can be given. As a preferable method of plasma treatment, plasma is generated under a condition where bias is not applied to a lower electrode on which the substrate 11 is placed, and the oxide semiconductor film 19 is exposed to the plasma. As a result, oxygen can be supplied to the oxide semiconductor film 19 without damage.

Here, the oxide semiconductor film 19 is exposed to oxygen plasma generated in the following manner: dinitrogen monoxide is introduced into the treatment chamber of the plasma CVD apparatus; and a high-frequency power of 150 W is supplied to an upper electrode provided in the treatment chamber with a high-frequency power supply of 27.12 MHz.

Next, the insulating film 34 is formed over the oxide semiconductor film 20 and the pair of electrodes 21. Here, a 10-nm-thick silicon oxynitride film is formed by a plasma CVD method under the following conditions: silane with a flow rate of 20 sccm and dinitrogen monoxide with a flow rate of 3000 sccm are used as a source gas; the pressure in the treatment chamber is 200 Pa; the substrate temperature is 350° C.; and a high-frequency power of 100 W is supplied to parallel plate electrodes with a high-frequency power supply of 27.12 MHz. By the conditions, a dense silicon oxynitride film with higher film density than the insulating film 36 formed in a later step can be formed.

Next, oxygen 35 may be added to the insulating film 34. As a method for adding the oxygen 35 to the insulating film 34, an ion implantation method, an ion doping method, plasma treatment, or the like can be given. As a result, the insulating film 34 can be an oxide insulating film containing oxygen in excess of the stoichiometric composition.

Figure 4E:
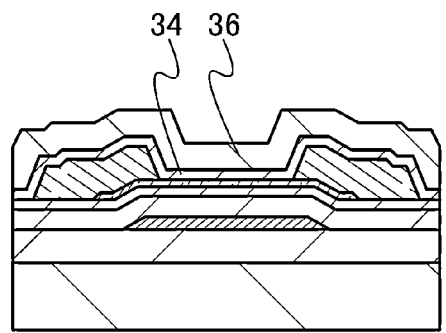

Next, the insulating film 36 is formed over the insulating film 34 as illustrated in FIG. 4E. As the insulating film 34, a silicon oxide film or a silicon oxynitride film is formed in a manner similar to that of the protective film 23 formed over the transistor 10. The formation conditions are as follows: the substrate 11 is placed in a treatment chamber evacuated to a vacuum level in a plasma CVD apparatus; the substrate is held at a temperature higher than or equal to 180° C. and lower than or equal to 260° C., preferably higher than or equal to 180° C. and lower than or equal to 250° C., further preferably higher than or equal to 180° C. and lower than or equal to 230° C.; a source gas is introduced into the treatment chamber to set a pressure in the treatment chamber to be higher than or equal to 100 Pa and lower than or equal to 250 Pa, preferably higher than or equal to 100 Pa and lower than or equal to 200 Pa; and a high-frequency power greater than or equal to 0.17 W/cm² and less than or equal to 0.5 W/cm², preferably greater than or equal to 0.25 W/cm² and less than or equal to 0.40 W/cm², further preferably greater than or equal to 0.26 W/cm² and less than or equal to 0.35 W/cm² is supplied to an electrode provided in the treatment chamber.

Then, as in the case of the transistor 10, heat treatment is performed, whereby oxygen contained in the insulating film 36 can be diffused to the oxide semiconductor film 20 to fill oxygen vacancies in the oxide semiconductor film 20. Thus, the amount of oxygen vacancies contained in the oxide semiconductor film 20 can be reduced.

Through the above steps, a transistor with excellent electric characteristics in which a shift in the threshold voltage in the negative direction can be suppressed can be manufactured. In addition, a highly reliable transistor in which a variation in electric characteristics with time or a variation in electric characteristics due to a gate BT stress test under light is small can be manufactured.

Note that the structures, methods, and the like described in this embodiment can be used as appropriate in combination with any of the structures, methods, and the like described in the other embodiments and examples.

(Embodiment 2)

In this embodiment, a transistor having a different structure from the transistor in Embodiment 1 will be described with reference to FIGS. 5A to 5C. A transistor 100 shown in this embodiment is a top-gate transistor, which is different from the transistor shown in Embodiment 1.

Figure 5A:
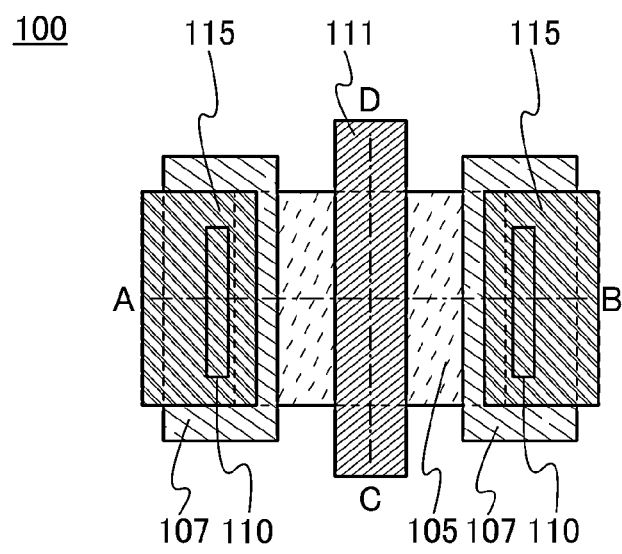
FIGS. 5A to 5C are a top view and cross-sectional views illustrating one embodiment of a transistor.
Figure 5C:
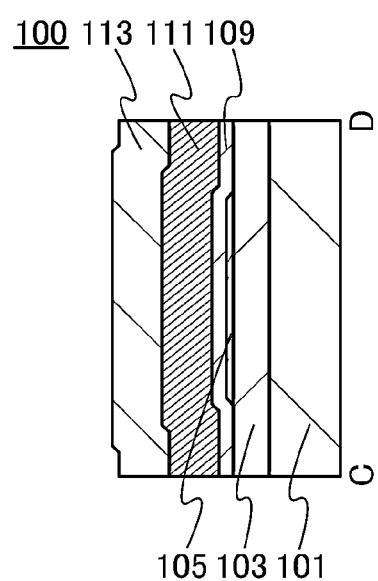
Figure 5B:
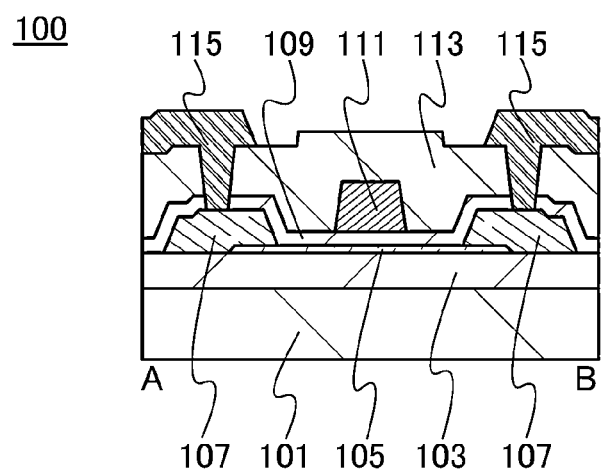

FIG. 5A to 5C are a top view and cross-sectional views of the transistor 100. FIG. 5A is a top view of the transistor 100, FIG. 5B is a cross-sectional view taken along dashed-dotted line A-B in FIG. 5A, and FIG. 5C is a cross-sectional view taken along dashed-dotted line C-D in FIG. 5A. Note that in FIG. 5A, some components of the transistor 100 (e.g., a substrate 101, a base insulating film 103, and a gate insulating film 109), a protective film 113, and the like are not illustrated for simplicity.

The transistor 100 illustrated in FIGS. 5B and 5C includes an oxide semiconductor film 105 over the base insulating film 103, a pair of electrodes 107 in contact with the oxide semiconductor film 105, the gate insulating film 109 in contact with the base insulating film 103, the oxide semiconductor film 105, and the pair of electrodes 107, and a gate electrode 111 overlapping with the oxide semiconductor film 105 with the gate insulating film 109 interposed therebetween. In addition, the protective film 113 covering the gate insulating film 109 and the gate electrode 111 and a wiring 115 in contact with the pair of electrodes 107 in openings 110 formed in the gate insulating film 109 and the protective film 113 (see FIG. 5A) may be provided.

The protective film 113 provided over the transistor 100 shown in this embodiment is an oxide insulating film containing oxygen in excess of the stoichiometric composition. It is preferable that the protective film 113 contain a larger amount of oxygen than the amount of oxygen vacancies in the oxide semiconductor film 105. The oxide insulating film containing oxygen in excess of the stoichiometric composition is an oxide insulating film from which part of oxygen is released by heating. Thus, when the oxide insulating film from which part of oxygen is released by heating is provided as the protective film 113, oxygen can be diffused to the oxide semiconductor film 105 by heat treatment. With the oxygen, oxygen vacancies in the oxide semiconductor film 105 can be filled. As a result, the amount of oxygen vacancies in the oxide semiconductor film 105 is reduced, and accordingly, a transistor in which a shift in the threshold voltage in the negative direction is suppressed can be provided. In addition, a shift in the threshold voltage with time or a shift in the threshold voltage due to a gate BT stress test under light is small; thus, a transistor with excellent electric characteristics can be manufactured.

Note that in the transistor 100, oxygen contained in the protective film 113 transfers to the oxide semiconductor film 105 through at least one of the base insulating film 103 and the gate insulating film 109.

Further, in the protective film 113, the spin density of a signal at g=2.001, which is measured by electron spin resonance, is preferably lower than $1.5 \times 10^{18}$ spins/cm$^3$, further preferably lower than or equal to $1.0 \times 10^{18}$ spins/cm$^3$. In that case, a transistor has excellent electric characteristics.

As the protective film 113, a silicon oxide film, a silicon oxynitride film, or the like can be formed to have a thickness greater than or equal to 30 nm and less than or equal to 500 nm, preferably greater than or equal to 100 nm and less than or equal to 400 nm.

Other details of the transistor 100 are described.

As the substrate 101, a substrate which is given as an example of the substrate 11 in Embodiment 1 can be used as appropriate.

The base insulating film 103 is preferably formed using an oxide insulating film from which part of oxygen is released by heating. As such an oxide insulating film from which part of oxygen is released by heating, an oxide insulating film containing oxygen in excess of the stoichiometric composition is preferably used. The oxide insulating film from which part of oxygen is released by heating can make oxygen diffuse into the oxide semiconductor film by heat treatment. Typical examples of the base insulating film 103 are films of silicon oxide, silicon oxynitride, silicon nitride oxide, gallium oxide, hafnium oxide, yttrium oxide, aluminum oxide, aluminum oxynitride, and the like.

The thickness of the base insulating film 103 is greater than or equal to 50 nm, preferably greater than or equal to 200 nm and less than or equal to 3000 nm, further preferably greater than or equal to 300 nm and less than or equal to 1000 nm. With use of the thick base insulating film 103, the amount of oxygen released from the base insulating film 103 can be increased, and the interface state density at the interface between the base insulating film 103 and an oxide semiconductor film formed later can be reduced.

Here, "to release part of oxygen by heating" means that the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

In the above structure, the insulating film from which part of oxygen is released by heating may be oxygen-excess silicon oxide (SiO$_X$ (X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

Here, in TDS analysis, the measurement method of the amount of desorbed oxygen at the oxygen atomic conversion is described below.

The desorption amount of gas in the TDS analysis is proportional to an integral value of spectrum. Therefore, the amount of a desorbed gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of the released oxygen molecules (N$_{O2}$) from an insulating film can be calculated according to Formula 1 using the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \quad \text{(Formula 1)}$$

N$_{H2}$ is the value obtained by conversion of the number of hydrogen molecules desorbed from the standard sample into densities. S$_{H2}$ is the integral value of a spectrum when the standard sample is subjected to TDS analysis. Here, the reference value of the standard sample is set to N$_{H2}$/S$_{H2}$. S$_{O2}$ is the integral value of a spectrum when the insulating film is subjected to TDS analysis. α is a coefficient affecting the intensity of the spectrum in the TDS analysis. Refer to Japanese Published Patent Application No. H6-275697 for details of Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of oxygen molecules, the number of the released oxygen atoms can also be estimated through the measurement of the number of the released oxygen molecules.

Note that N$_{O2}$ is the number of released oxygen molecules. For the insulating film, the amount of released oxygen when converted into oxygen atoms is twice the number of the released oxygen molecules.

By supplying oxygen from the base insulating film 103 to the oxide semiconductor film 105, an interface state density between the base insulating film 103 and the oxide semiconductor film 105 can be reduced. As a result, electric charge or the like which may be generated due to an operation of the transistor or the like can be prevented from being trapped at the interface between the base insulating film 103 and the oxide semiconductor film 105, and thereby a transistor with less variation in electric characteristics can be provided.

In other words, when oxygen vacancies are generated in the oxide semiconductor film 105, electric charge is trapped at the interface between the base insulating film 103 and the oxide semiconductor film 105, whereby the electric charge affects the electric characteristics of the transistor. However, by providing an insulating film from which oxygen is released by heating as the base insulating film 103, the interface state density between the oxide semiconductor film 105 and the base insulating film 103 can be reduced, and an influence of the trap of electric charge at the interface between the oxide semiconductor film 105 and the base insulating film 103 can be made small.

The oxide semiconductor film 105 can be formed in a manner similar to that of the oxide semiconductor film 19 in Embodiment 1.

The pair of electrodes 107 can be formed in a manner similar to that of the pair of electrodes 21 shown in Embodiment 1. Note that the length of the pair of electrodes 107 in the channel width direction is larger than that of the oxide semiconductor film 105, and seen in the cross section in the channel length direction, the pair of electrodes 107 covers end portions of the oxide semiconductor film 105. With such a structure, an area of contact between the pair of electrodes 107 and the oxide semiconductor film 105 is increased. Thus, the contact resistance between the oxide semiconductor film 105 and the pair of electrodes 107 can be reduced, and the on-state current of the transistor can be increased.

Note that although the pair of electrodes 107 is provided between the oxide semiconductor film 105 and the gate insulating film 109 in this embodiment, the pair of electrodes 107 may be provided between the base insulating film 103 and the oxide semiconductor film 105.

The gate insulating film 109 can be formed in a manner similar to that of the gate insulating film 17 in Embodiment 1.

The gate electrode 111 can be formed in a manner similar to that of the gate electrode 15 in Embodiment 1.

The wiring 115 can be formed using a material which can be used for the pair of electrodes 107 as appropriate.

Next, a method for manufacturing the transistor illustrated in FIGS. 5A to 5C will be described with reference to FIGS. 6A to 6D.

Figure 6A:
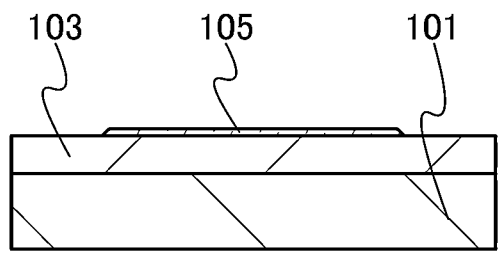
FIGS. 6A to 6D are cross-sectional views illustrating one embodiment of a method for manufacturing a transistor.

As illustrated in FIG. 6A, the base insulating film 103 is formed over the substrate 101. Next, the oxide semiconductor film 105 is formed over the base insulating film 103.

The base insulating film 103 is formed by a sputtering method, a CVD method or the like.

When the oxide insulating film from which part of oxygen is released by heating is formed by a sputtering method as the base insulating film 103, the amount of oxygen in a deposition gas is preferably large, and oxygen, a mixed gas of oxygen and a rare gas, or the like can be used. Typically, the oxygen concentration of a deposition gas is preferably from 6% to 100%.

In the case where an oxide insulating film is formed by a CVD method as the base insulating film 103, hydrogen or water derived from a source gas is sometimes mixed in the oxide insulating film. Thus, after the oxide insulating film is formed by a CVD method, heat treatment is preferably performed as dehydrogenation or dehydration.

In the case of adding oxygen to the oxide insulating film formed by a CVD method, the amount of oxygen released by heating can be increased. As the method for adding oxygen to the oxide insulating film, an ion implantation method, an ion doping method, a plasma immersion ion implantation method, plasma treatment, or the like can be used.

The oxide semiconductor film 105 can be formed as appropriate by a formation method similar to that of the oxide semiconductor film 19 described in Embodiment 1.

In order to improve the orientation of the crystal parts in the CAAC-OS film, planarity of the surface of the base insulating film 103 serving as a base insulating film of the oxide semiconductor film is preferably improved. Typically, the average surface roughness ($R_a$) of the base insulating film 103 is preferably 1 nm or less, further preferably 0.3 nm or less, still preferably 0.1 nm or less. In this specification and the like, average surface roughness ($R_a$) is obtained by three-dimensional expansion of arithmetic mean surface roughness that is defined by JIS B 0601:2001 (ISO4287:1997) so as to be applied to a curved surface, and is an average value of the absolute values of deviations from a reference surface to a specific surface. As planarization treatment, one or more can be selected from chemical mechanical polishing (CMP) treatment, dry etching treatment, plasma treatment (reverse sputtering), and the like. The plasma treatment is the one in which minute unevenness of the surface is reduced by introducing an inert gas such as an argon gas into a vacuum chamber and applying an electric field so that a surface to be processed serves as a cathode.

Next, heat treatment is preferably performed. By this heat treatment, part of oxygen contained in the base insulating film 103 can be diffused to the vicinity of the interface between the base insulating film 103 and the oxide semiconductor film 105. As a result, the interface state density in the vicinity of the interface between the base insulating film 103 and the oxide semiconductor film 105 can be reduced.

The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere do not contain hydrogen, water, and the like. The treatment time is 3 minutes to 24 hours.

Note that the oxide semiconductor film 105 may be formed in the following manner: an oxide semiconductor film that is to be the oxide semiconductor film 105 in a later step is formed over the base insulating film 103; heat treatment is performed thereon; and part of the oxide semiconductor film is etched. By the above steps, oxygen contained in the base insulating film 103 can be diffused more in the vicinity of the interface between the base insulating film 103 and the oxide semiconductor film 105.

Figure 6B:
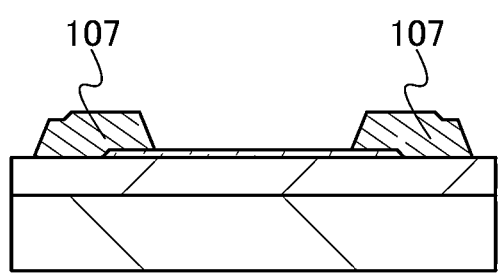

Next, as illustrated in FIG. 6B, the pair of electrodes 107 is formed. The pair of electrodes 107 can be formed as appropriate by a formation method similar to those of the pair of electrodes 21 described in Embodiment 1. Alternatively, the pair of electrodes 107 can be formed by a printing method or an inkjet method.

Figure 6C:
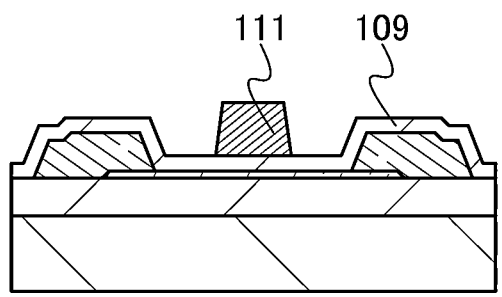

The gate insulating film 109 is formed, and then, the gate electrode 111 is formed over the gate insulating film 109 as illustrated in FIG. 6C.

The gate insulating film 109 can be formed as appropriated by a formation method similar to those of the gate insulating film 17 described in Embodiment 1.

In a CAAC-OS film, oxygen tends to move along the surface where the CAAC-OS film is formed or the surface of the CAAC-OS film. Thus, oxygen release occurs from the side surface of the oxide semiconductor film 105 that has been subjected to element isolation, and oxygen vacancies tend to be formed in the side surface. However, when as the gate insulating film 109, an oxide insulating film from which part of oxygen is released by heating and a metal oxide film (which is to be over the oxide insulating film) are formed over the oxide semiconductor film 105, oxygen release from the side surface of the oxide semiconductor film 105 can be suppressed. As a result, an increase in conductivity of the side surface of the oxide semiconductor film 105 can be suppressed.

The gate electrode 111 can be formed as appropriate by a formation method similar to those of the gate electrode 15 in Embodiment 1.

Here, an example of a method for forming a gate electrode whose width is reduced to a length shorter than or equal to the resolution limit of a light exposure apparatus is described. A slimming process is preferably performed on a mask used for forming the gate electrode 111 to make the mask have a further miniaturized structure. As the slimming process, an ashing process using an oxygen radical or the like can be employed, for example. However, the slimming process other than the ashing process may be used as long as the mask formed by a photolithography method or the like can be processed to have a further miniaturized structure. Since the channel length of a transistor is determined by the mask formed by the slimming process, a process with high controllability is preferably employed. As a result of the slimming process, the width of the mask formed by a photolithography method or the like can be reduced to a length shorter than or equal to the resolution limit of a light exposure apparatus, preferably less than or equal to half of the resolution limit of a light exposure apparatus, and further preferably less than or equal to one third of the resolution limit of the light exposure apparatus. For example, the width of the formed mask can be greater than or equal to 20 nm and less than or equal to 2000 nm, preferably greater than or equal to 50 nm and less than or equal to 350 nm. Further, when a conductive film is etched while the mask subjected to slimming is made to recede, the gate electrode 111 whose width is reduced to a length shorter than or equal to the resolution limit of a light exposure apparatus can be formed.

Figure 6D:
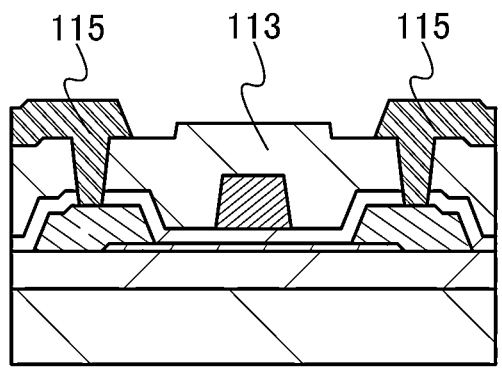

Next, the protective film 113 is formed over the gate insulating film 109 and the gate electrode 111, and then the wiring 115 connected to the pair of electrodes 107 is formed as illustrated in FIG. 6D.

As the protective film 113, a silicon oxide film or a silicon oxynitride film is formed in a manner similar to that of the protective film 23 in Embodiment 1. Specifically, the formation conditions are as follows: the substrate 101 is placed in a treatment chamber evacuated to a vacuum level in a plasma CVD apparatus; the substrate is held at a temperature higher than or equal to 180° C. and lower than or equal to 260° C., preferably higher than or equal to 180° C. and lower than or equal to 250° C., further preferably higher than or equal to 180° C. and lower than or equal to 230° C.; a source gas is introduced into the treatment chamber to set a pressure in the treatment chamber to be higher than or equal to 100 Pa and lower than or equal to 250 Pa, preferably higher than or equal to 100 Pa and lower than or equal to 200 Pa; and a high-frequency power greater than or equal to 0.17 W/cm$^2$ and less than or equal to 0.5 W/cm$^2$, preferably greater than or equal to 0.25 W/cm$^2$ and less than or equal to 0.40 W/cm$^2$, further preferably greater than or equal to 0.26 W/cm$^2$ and less than or equal to 0.35 W/cm$^2$ is supplied to an electrode provided in the treatment chamber.

As the conditions for forming the protective film 113, the high-frequency power with the above power density is supplied under the above pressure, whereby an oxide insulating film containing oxygen in excess of the stoichiometric composition can be formed.

Next, heat treatment is performed as in the case of Embodiment 1, whereby oxygen contained in the protective film 113 can be diffused to the oxide semiconductor film 105 to fill oxygen vacancies in the oxide semiconductor film 105. Thus, the amount of oxygen vacancies in the oxide semiconductor film 105 can be reduced. In addition, by the heat treatment performed after the protective film 113 is formed, the spin density of a signal at g=2.001 in the protective film 113, which is measured by electron spin resonance, is preferably lower than 1.5×10$^{18}$ spins/cm$^3$, further preferably lower than or equal to 1.0×10$^{18}$ spins/cm$^3$. The heat treatment is performed typically at a temperature higher than or equal to 150° C. and lower than the strain point of the substrate, preferably higher than or equal to 250° C. and lower than or equal to 450° C., further preferably higher than or equal to 300° C. and lower than or equal to 450° C.

After a conductive film is formed by a sputtering method, a CVD method, an evaporation method, or the like, a mask is formed over the conductive film and the conductive film is etched, so that the wiring 115 is formed. The mask formed over the conductive film can be formed by a printing method, an inkjet method, or a photolithography method as appropriate. Then, the mask is removed. Alternatively, the wiring 115 may be formed by a dual damascene method.

Through the above steps, a transistor with excellent electric characteristics in which a shift in the threshold voltage in the negative direction can be suppressed can be manufactured. In addition, a highly reliable transistor in which a variation in electric characteristics with time or a variation in electric characteristics due to a gate BT stress test under light is small can be manufactured.

Note that the structures, methods, and the like described in this embodiment can be used as appropriate in combination with any of the structures, methods, and the like described in the other embodiments and examples.

(Embodiment 3)

In this embodiment, a transistor having a structure different from those of Embodiment 1 and Embodiment 2 will be described with reference to FIGS. 7A and 7B. A transistor 120 shown in this embodiment is different from the transistor 100 shown in Embodiment 2 in that dopant is added to an oxide semiconductor film.

Figure 7A:
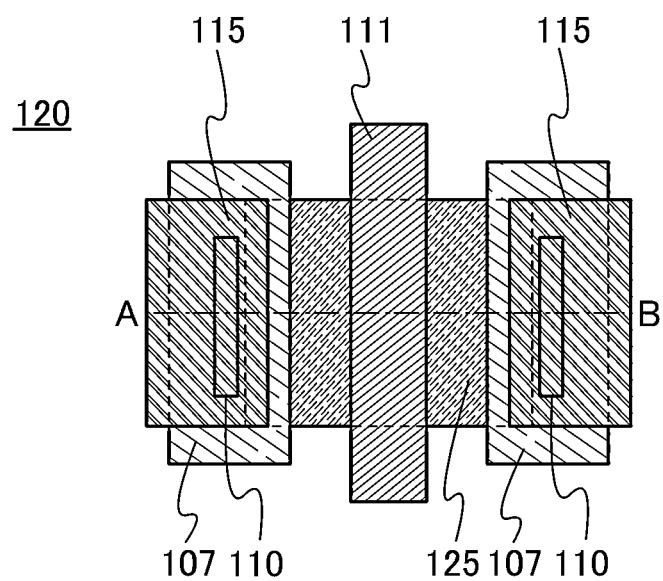
FIGS. 7A and 7B are a top view and a cross-sectional view illustrating one embodiment of a transistor.
Figure 7B:
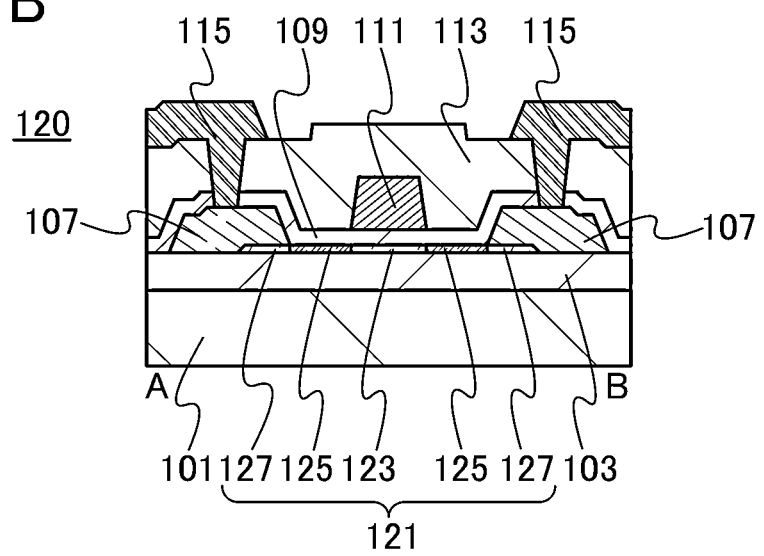

FIGS. 7A and 7B are a top view and a cross-sectional view of the transistor 120. FIG. 7A is a top view of the transistor 120, and FIG. 7B corresponds to a cross-sectional view taken along dashed line A-B in FIG. 7A. Note that in FIG. 7A, some components of the transistor 120 (e.g., a substrate 101, a base insulating film 103, and a gate insulating film 109), a protective film 113, and the like are not illustrated for simplicity.

The transistor 120 illustrated in FIG. 7B includes an oxide semiconductor film 121 over the base insulating film 103, a pair of electrodes 107 in contact with the oxide semiconductor film 121, the gate insulating film 109 in contact with the base insulating film 103, the oxide semiconductor film 121, and the pair of electrodes 107, and a gate electrode 111 overlapping with the oxide semiconductor film 121 with the gate insulating film 109 interposed therebetween. In addition, the protective film 113 covering the gate insulating film 109 and the gate electrode 111 is provided. Furthermore, a wiring 115 may provided to be in contact with the pair of electrodes 107 through openings 110 formed in the gate insulating film 109 and the protective film 113 (see FIG. 7A).

In the transistor 120 in this embodiment, the oxide semiconductor film 121 includes a first region 123 overlapping with the gate electrode 111 with the gate insulating film 109 interposed therebetween, a pair of second regions 125 to which dopant is added, and a pair of third regions 127 in contact with the pair of electrodes 107. Note that dopant is not added to the first region 123 or the third regions 127. The pair of second regions 125 is provided so that the first region 123 is sandwiched therebetween. The pair of third regions 127 is provided so that the first region 123 and the second regions 125 are sandwiched therebetween.

The first region 123 functions as a channel region in the transistor 120. From a region in the third regions 127, which is in contact with the pair of electrodes 107, part of contained oxygen is diffused to the pair of electrodes 107, so that oxygen vacancies are caused, and accordingly such a region becomes an n-type region. Thus, parts of the third regions 127 function as a source region or a drain region. The second regions have high conductivity because dopant is added thereto, and thus function as a low resistance region which has a function of reducing resistance between the channel region and the source or drain region. Therefore, the on-state current and field effect mobility of the transistor 120 can be increased as compared with the transistor 100 in Embodiment 1.

As the dopant added to the second region 125, at least one of boron, nitrogen, phosphorus, and arsenic can be given. Alternatively, at least one of helium, neon, argon, krypton, and xenon can be given. Still alternatively, dopant may contain at least one of boron, nitrogen, phosphorus, and arsenic and at least one of helium, neon, argon, krypton, and xenon in appropriate combination.

The dopant concentration of the pair of second regions 125 is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the dopant is included, the carrier density or defects in the second regions 125 can be increased. Therefore, the conductivity can be high as compared with the first region 123 and the third regions 127 which do not contain dopant. Note that when the dopant concentration is too high, the dopant inhibits carrier transfer, leading to lower conductivity of the second regions 125.

The conductivity of the second regions 125 is preferably higher than or equal to 0.1 S/cm and lower than or equal to 1000 S/cm, preferably higher than or equal to 10 S/cm and lower than or equal to 1000 S/cm.

Next, a method for manufacturing the transistor 120 shown in this embodiment is described with reference to FIGS. 6A to 6D and FIGS. 7A and 7B.

As in the case of Embodiment 1, the base insulating film 103 is formed over the substrate 101, the oxide semiconductor film 121 is formed over the base insulating film 103, and the pair of electrodes 107 is formed over the oxide semiconductor film 121 through the steps illustrated in FIGS. 6A to 6C. Then, the gate insulating film 109 is formed over the oxide semiconductor film 121 and the pair of electrodes 107. After that, the gate electrode 111 is formed to overlap with part of the oxide semiconductor film 121 with the gate insulating film 109 interposed therebetween.

Next, dopant is added to the oxide semiconductor film 121 with use of the pair of electrodes 107 and the gate electrode 111 as masks. As a method of adding a dopant to the oxide semiconductor film 121, an ion doping method or an ion implantation method can be used.

In the embodiment describe here, the addition of the dopant to the oxide semiconductor film 121 is conducted in a state where the oxide semiconductor film 121 is covered with the gate insulating film 109 and the like; alternatively, the addition of the dopant may be conducted in a state where the oxide semiconductor film 121 is exposed.

Further, the addition of the dopant may also be conducted using a method other than injection methods, such as an ion doping method and an ion implantation method. For example, the dopant can be added in the following manner: plasma is generated in an atmosphere of gas containing an element to be added and plasma treatment is performed on the oxide semiconductor film 121. A dry etching apparatus, a plasma CVD apparatus, or the like can be used to generate the plasma.

Note that the dopant may be added while the substrate 101 is being heated.

Here, phosphorus is added to the oxide semiconductor film 121 by an ion implantation method.

After that, heat treatment is performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

By this heat treatment, conductivity of the second region 125 can be increased. Note that through the heat treatment, the first region 123, the second regions 125, and the third regions 127 become a polycrystalline structure, an amorphous structure, or a CAAC-OS.

Then, as in the case of Embodiment 1, the protective film 113 is formed, and heat treatment is performed, so that oxygen contained in the protective film 113 is diffused to the oxide semiconductor film 121 and oxygen vacancies in the oxide semiconductor film 121 is reduced. After that, the wiring 115 is formed. Thus, the transistor 120 illustrated in FIGS. 7A and 7B can be completed.

In the transistor 120 in this embodiment, the oxide semiconductor film 121 includes the first region 123 functioning as a channel region, and the second regions 125 which are low resistance regions between the third regions 127 functioning as a source region and a drain region. Thus, as compared with the transistor 100 described in Embodiment 2, resistance between the channel region and the source or drain region can be reduced, so that the on-state current can be increased. In addition, when the protective film 113 is provided over the transistor 120, the transistor can have excellent characteristics in which the shift in the threshold voltage in the negative direction can be suppressed. Furthermore, a highly reliable transistor in which a variation in electric characteristics with time or a variation in electric characteristics due to a gate BT stress test under light is small can be manufactured.

Note that in the transistor 120, oxygen contained in the protective film 113 transfers to the oxide semiconductor film 121 through at least one of the base insulating film 103 and the gate insulating film 109.

Note that the structures, methods, and the like described in this embodiment can be used as appropriate in combination with any of the structures, methods, and the like described in the other embodiments and examples.

(Embodiment 4)

In this embodiment, a transistor having a different structure from the transistors in Embodiments 1 to 3 will be described with reference to FIGS. 8A and 8B. In a transistor 130 shown in this embodiment, a structure of an oxide semiconductor film is different from those of the transistors in the other embodiments. In the oxide semiconductor film of the transistor 130, an electric-field relaxation region is provided between a channel region and a source or drain region.

Figure 8A:
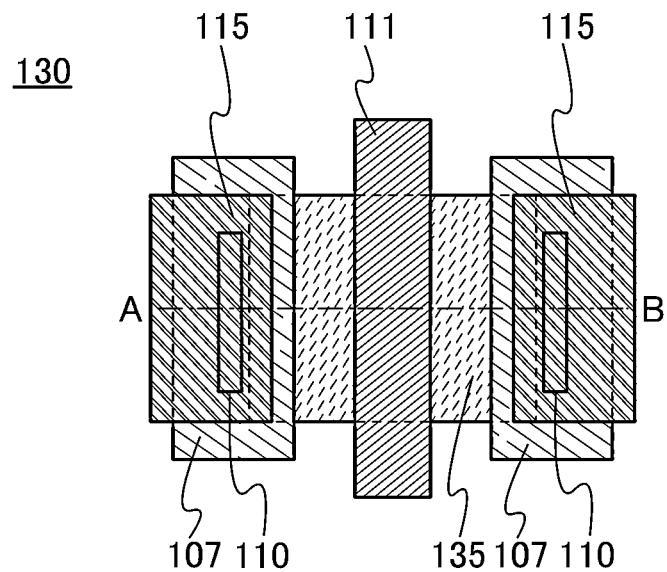
FIGS. 8A and 8B are a top view and a cross-sectional view illustrating one embodiment of a transistor.
Figure 8B:
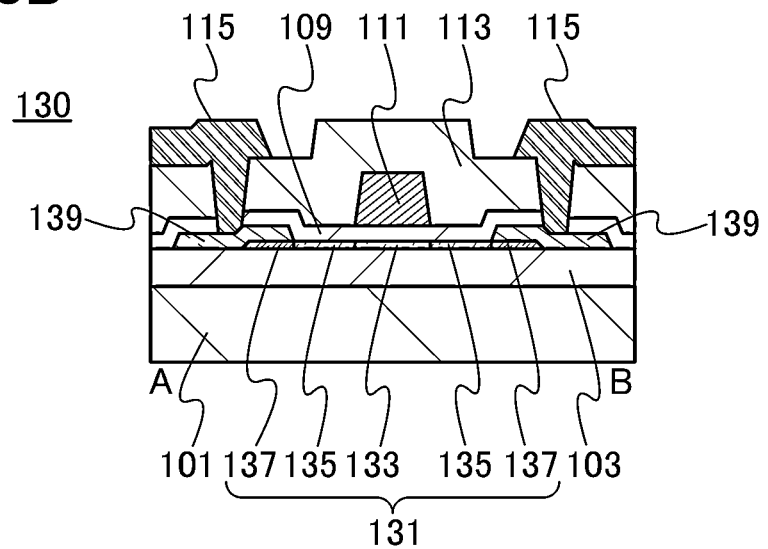

FIGS. 8A and 8B are a top view and a cross-sectional view of the transistor 130. FIG. 8A is a top view of the transistor 130, and FIG. 8B corresponds to a cross-sectional view taken along dashed-dotted line A-B in FIG. 8A. Note that in FIG. 8A, some components of the transistor 130 (e.g., a substrate 101, a base insulating film 103, and a gate insulating film 109), a protective film 113, and the like are not illustrated for simplicity.

The transistor 130 illustrated in FIG. 8B includes the base insulating film 103 over the substrate 101, an oxide semiconductor film 131 over the base insulating film 103, a pair of electrodes 139 in contact with the oxide semiconductor film 131, the gate insulating film 109 in contact with the base insulating film 103, the oxide semiconductor film 131, and the pair of electrodes 139, and a gate electrode 111 overlapping with the oxide semiconductor film 131 with the gate insulating film 109 interposed therebetween. In addition, the protective film 113 is provided to cover the gate insulating film 109 and the gate electrode 111. Furthermore, a wiring 115 may be provided to be in contact with the pair of electrodes 139 through openings 110 formed in the gate insulating film 109 and the protective film 113.

In the transistor 130 in this embodiment, the oxide semiconductor film 131 includes a first region 133 overlapping with the gate electrode 111 with the gate insulating film 109 interposed therebetween, a pair of second regions 135 to which dopant is added, and a pair of third regions 137 which is in contact with the pair of electrodes 139 and to which dopant is added. Note that dopant is not added to the first region 133. The pair of second regions 135 is provided so that the first region 133 is sandwiched therebetween. The pair of third regions 137 is provided so that the first region 133 and the second regions 135 are sandwiched therebetween.

As the dopant added to the second regions 135 and the third regions 137, dopant similar to that added to the second regions 125 in Embodiment 3 can be used as appropriate.

The dopant concentration and the conductivity in the second regions 135 and the third regions 137 can be equal to those in the second regions 125 in Embodiment 3. Note that in this embodiment, the dopant concentration and the conductivity of the third regions 137 are higher than those of the second regions 135.

The first region 133 functions as a channel region in the transistor 130. The second regions 135 function as electric-field relaxation regions. From a region in the third regions 137, which is in contact with the pair of electrodes 139, part of contained oxygen is diffused to the pair of electrodes 139 depending on a material of the pair of electrodes 139, so that oxygen vacancies are caused, and accordingly such a region becomes an n-type region. Since the third regions 137 include the dopant and have high conductivity, a contact resistance between the third regions 137 and the pair of electrodes 139 can be reduced as compared with the transistor 120 in Embodiment 2. Thus, the on-state current and the field effect mobility of the transistor 130 can be increased as compared with the transistor in Embodiment 2.

In order to add the dopant to the third regions 137, the pair of electrodes 139 is preferably formed thin: the thickness is typically greater than or equal to 10 nm and less than or equal to 100 nm, preferably, greater than or equal to 20 nm and less than or equal to 50 nm.

Next, a method for manufacturing the transistor 130 in this embodiment is described with reference to FIGS. 6A to 6D and FIGS. 8A and 8B.

As in the case of Embodiment 2, through the steps illustrated in FIGS. 6A to 6C, the base insulating film 103 is formed over the substrate 101, the oxide semiconductor film 131 is formed over the base insulating film 103, and the pair of electrodes 139 is formed over the oxide semiconductor film 131 (see FIG. 8B). Next, the gate insulating film 109 is formed over the oxide semiconductor film 131 and the pair of electrodes 139, and the gate electrode 111 is formed to overlap with part of the oxide semiconductor film 131 with the gate insulating film 109 interposed therebetween.

Next, the dopant is added to the oxide semiconductor film 131 with use of the gate electrode 111 as a mask. The dopant can be added by a method similar to that described in Embodiment 2 as appropriate. Note that in this embodiment, dopant is added to the third regions 137 as well as the second regions 135. The dopant concentration in the third regions 137 is higher than that in the second regions 135. The conditions of the adding method are adjusted appropriately so that a peak of the dopant concentration profile appears in the third regions 137. In this case, the third regions 137 overlap with the pair of electrodes 139, but the second regions 135 do not overlap with the pair of electrodes 139. Accordingly, as for the dopant concentration profile of the second regions 135, a peak is positioned in the base insulating film 103; thus, the dopant concentration in the second regions 135 is lower than that in the third regions 137.

After that, heat treatment is performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

By the heat treatment, the conductivity of the second regions 135 and the third regions 137 can be increased. Note that through the heat treatment, the first region 133, the second regions 135, and the third regions 137 become a polycrystalline structure, an amorphous structure, or a CAAC-OS.

After that, as in the case of Embodiment 2, the protective film 113 is formed, and heat treatment is performed so as to diffuse oxygen contained in the protective film 113 to the oxide semiconductor film 131, whereby oxygen vacancies are reduced. Then, the wiring 115 is formed, so that the transistor 130 illustrated in FIGS. 8A and 8B can be completed.

In the transistor 130 in this embodiment, the oxide semiconductor film 131 includes the first region 133 functioning as a channel region, and the second regions 135 functioning as an electric-field relaxation region between the third regions 137 functioning as a source region and a drain region. Thus, deterioration of the transistor can be suppressed as compared with the transistor 100 in Embodiment 2. In addition, the third regions 137 in contact with the pair of electrodes 139 include the dopant, which enables the contact resistance between the pair of electrodes 139 and the third regions 137 to be further reduced. Accordingly, the on-state current of the transistor can be increased. Further, when the protective film 113 is provided over the transistor 130, excellent electric characteristics of the transistor, in which a shift in the threshold voltage in the negative direction can be suppressed, can be obtained. Moreover, a highly reliable transistor in which a variation in electric characteristics with time or a variation in electric characteristics due to a gate BT stress test under light is small can be provided.

Note that in the transistor 130, oxygen contained in the protective film 113 transfers to the oxide semiconductor film 131 through at least one of the base insulating film 103 and the gate insulating film 109.

Note that the structures, methods, and the like described in this embodiment can be used as appropriate in combination with any of the structures, methods, and the like described in the other embodiments and examples.

(Embodiment 5)

In this embodiment, structures of transistors applicable to Embodiments 2 to 4 will be described with reference to FIGS. 9A to 9C.

The transistors shown in this embodiment includes sidewall insulating films in contact with side surfaces of the gate electrode 111. Here, description will be made using the transistor described in Embodiment 2.

Figure 9A:
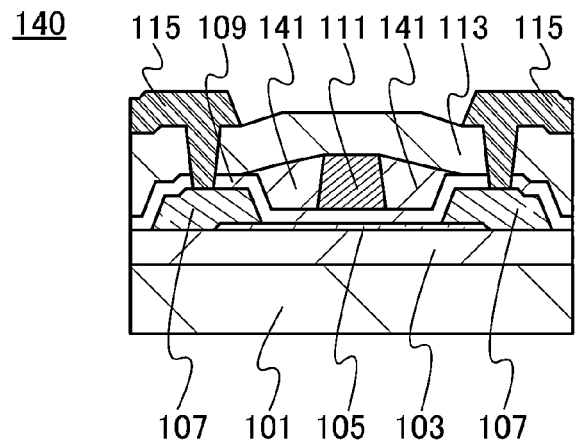
FIGS. 9A to 9C are cross-sectional views each illustrating one embodiment of a transistor.

A transistor 140 illustrated in FIG. 9A includes an oxide semiconductor film 105 over the base insulating film 103, a pair of electrodes 107 in contact with the oxide semiconductor film 105, the gate insulating film 109 in contact with the base insulating film 103, the oxide semiconductor film 105, and the pair of electrodes 107, and a gate electrode 111 overlapping with the oxide semiconductor film 105 with the gate insulating film 109 interposed therebetween. Further, the transistor includes sidewall insulating films 141 in contact with the side surfaces of the gate electrode 111. In addition, a protective film 113 is provided to cover the gate insulating film 109, the gate electrode 111, and the sidewall insulating films 141. Furthermore, a wiring 115 may be provided to be in contact with the pair of electrodes 107 through openings formed in the gate insulating film 109 and the protective film 113.

End portions of the sidewall insulating films 141 overlap with the pair of electrodes 107. The sidewall insulating films 141 are provided to fill a space between the pair of electrodes 107 and the gate electrode 111, which makes it possible to reduce unevenness generated between the pair of electrodes 107 and the gate electrode 111. Thus, coverage with the protective film 113 can be improved.

Figure 9B:
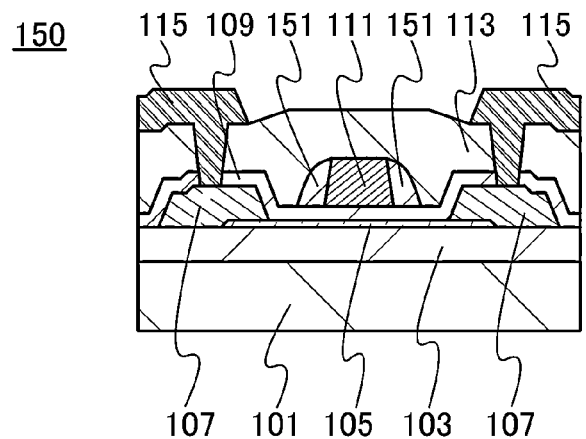

A difference between a transistor 150 illustrated in FIG. 9B and the transistor 140 is a shape of sidewall insulating films 151 in contact with the side surfaces of the gate electrode 111. Specifically, end portions of the sidewall insulating films 151 do not overlap with the pair of electrodes 107, and the sidewall insulating films 151 are positioned between the gate electrode 111 and the pair of electrodes 107.

Figure 9C:
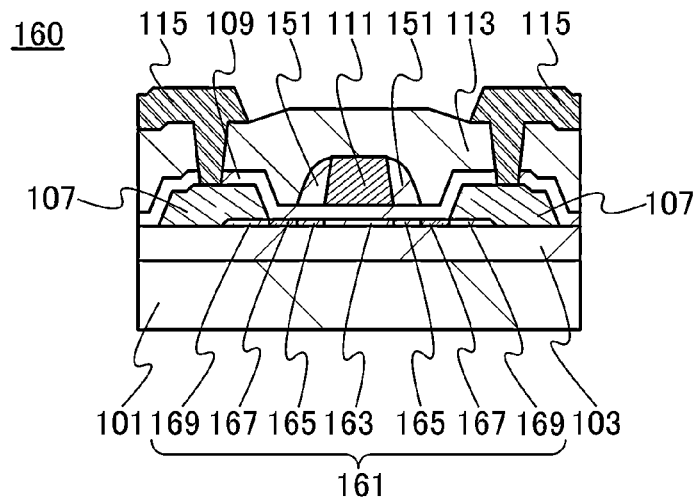

A difference between a transistor 160 illustrated in FIG. 9C and the transistor 150 in FIG. 9B is that dopant is added to an oxide semiconductor film 161.

The oxide semiconductor film 161 includes a first region 163 overlapping with the gate electrode 111 with the gate insulating film 109 interposed therebetween, a pair of second regions 165 to which dopant is added and which overlap with the sidewall insulating films 151, a pair of third regions 167 to which dopant is added, and a pair of fourth regions 169 in contact with the pair of electrodes 107. Note that dopant is not added to the first region 163 and the fourth regions 169. The pair of second regions 165 is provided so that the first region 163 is sandwiched therebetween. The pair of third regions 167 is provided so that the first region 163 and the second regions 165 are sandwiched therebetween. The pair of fourth regions 169 is provided so that the first region 163 to the third regions 167 are sandwiched therebetween.

The first region 163 functions as a channel region in the transistor 160.

Since the second regions 165 and the third regions 167 include the dopant and thus have high conductivity, they function as low resistance regions and enable the resistance between the channel region and a source or drain region to be reduced. Further, the second regions 165 functions as electric-field relaxation regions because the second regions 165 have a lower dopant concentration and lower conductivity than the third regions 167. Thus, deterioration of the transistor 160 can be suppressed.

As the dopant added to the second regions 165 and the third regions 167, dopant similar to that added to the second regions 125 in Embodiment 3 can be used as appropriate.

The dopant concentration and the conductivity in the second regions 165 and the third regions 167 can be equal to those of the second regions 125 in Embodiment 3. Note that in this embodiment, the dopant concentration and the conductivity of the third regions 167 are higher than those of the second regions 165.

From a region in the fourth regions 169, which is in contact with the pair of electrodes 107, part of contained oxygen is diffused to the pair of electrodes 107, so that oxygen vacancies are caused, and accordingly such a region becomes an n-type region. As a result, parts of the fourth regions 169 function as a source region and a drain region.

In the oxide semiconductor film 161 of the transistor 160 in this embodiment, the first region 163 is provided between the second regions 165 and the third regions 167 which are low resistance regions. With such a structure, the resistance between the channel regions and the source or drain region can be reduced, and the on-state current of the transistor can be increased.

By providing the protective film 113 over the transistor (here, the transistors 140, 150, and 160), the transistor can have excellent electric characteristics. In addition, the transistor can have high reliability where a variation in electric characteristics with time or a variation in electric characteristics due to a gate BT stress test under light is small.

Note that in each of the transistors 140, 150, and 160, oxygen contained in the protective film 113 transfers to the oxide semiconductor film through at least one of the base insulating film 103 and the gate insulating film 109.

Note that the structures, methods, and the like described in this embodiment can be used as appropriate in combination with any of the structures, methods, and the like described in the other embodiments and examples.

(Embodiment 6)

In this embodiment, a transistor having a structure different from those of Embodiments 2 to 5 will be described with reference to FIG. 10. In the transistor shown in this embodiment, a pair of electrodes overlap with a gate electrode with a gate insulating film interposed therebetween, which is different from the transistors of Embodiments 2 to 5.

Figure 10:
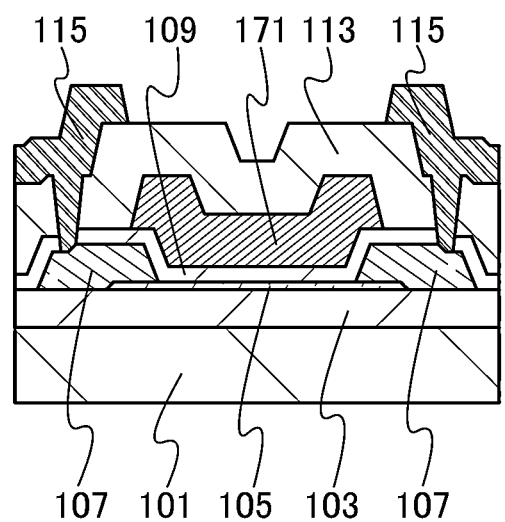
FIG. 10 is a cross-sectional view illustrating one embodiment of a transistor.

A transistor 170 illustrated in FIG. 10 includes an oxide semiconductor film 105 over the base insulating film 103, a pair of electrodes 107 in contact with the oxide semiconductor film 105, a gate insulating film 109 in contact with the base insulating film 103, the oxide semiconductor film 105, and the pair of electrodes 107, and a gate electrode 171 overlapping with the oxide semiconductor film 105 with the gate insulating film 109 interposed therebetween. In addition, a protective film 113 covering the gate insulating film 109 and the gate electrode 171 is provided. Furthermore, a wiring 115 may be provided to be in contact with the pair of electrodes 107 in openings formed in the gate insulating film 109 and the protective film 113.

In the transistor 170 in this embodiment, the pair of electrodes 107 and the gate electrode 171 overlap with each other with the gate insulating film 109 interposed therebetween. Thus, in the oxide semiconductor film 105, a region facing the gate electrode 171 with the gate insulating film 109 interposed therebetween functions as a channel region, and regions in contact with the pair of electrodes 107 function as a source region and a drain region. In other words, the channel region and the source or drain region are in contact with each other. There is no region functioning as a resistance component between the channel region and the source or drain region. Therefore, the on-state current and the field effect mobility are higher than those of the transistors in Embodiments 2 to 5.

Further, with a structure in which the protective film 113 is provided over the transistor 170, the transistor can have excellent characteristics in which the shift in the threshold voltage in the negative direction can be suppressed. Furthermore, a highly reliable transistor in which a variation in electric characteristics with time or a variation in electric characteristics due to a gate BT stress test under light is small can be provided.

Note that in transistor 170, oxygen contained in the protective film 113 transfers to the oxide semiconductor film 105 through at least one of the base insulating film 103 and the gate insulating film 109.

Note that the structures, methods, and the like described in this embodiment can be used as appropriate in combination with any of the structures, methods, and the like described in the other embodiments and examples.

(Embodiment 7)

In this embodiment, a transistor having a different structure from those of Embodiments 1 to 6 will be described with reference to FIGS. 11A and 11B.

Figure 11A:
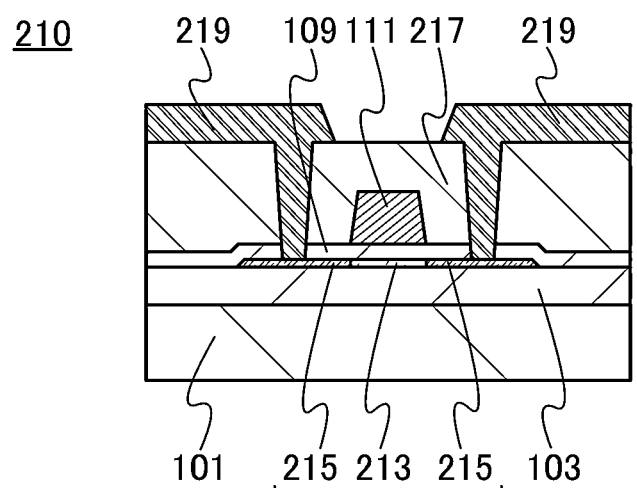
FIGS. 11A and 11B are cross-sectional views each illustrating one embodiment of a transistor.

A transistor 210 illustrated in FIG. 11A includes an oxide semiconductor film 211 over the base insulating film 103, a gate insulating film 109 in contact with the base insulating film 103 and the oxide semiconductor film 211, and a gate electrode 111 overlapping with the oxide semiconductor film 211 with the gate insulating film 109 interposed therebetween. In addition, a protective film 217 covering the gate insulating film 109 and the gate electrode 111 is provided, and a wiring 219 is also provided to be in contact with the oxide semiconductor film 211 through openings formed in the gate insulating film 109 and the protective film 217.

In the transistor 210 in this embodiment, the oxide semiconductor film 211 includes a first region 213 overlapping with the gate electrode 111 with the gate insulating film 109 interposed therebetween and a pair of second regions 215 to which dopant is added. Note that dopant is not added to the first region 213. Further, the pair of second regions 215 is provided so that the first region 213 is sandwiched therebetween.

The first region 213 functions as a channel region in the transistor 210. The second regions 215 function as a source region and a drain region.

The dopant similar to that added to the second regions 125 in Embodiment 3 can be used as appropriate for the dopant added to the second regions 215.

The dopant concentration and the conductivity in the second regions 215 can be equal to those in the second regions 125 in Embodiment 3.

Figure 11B:
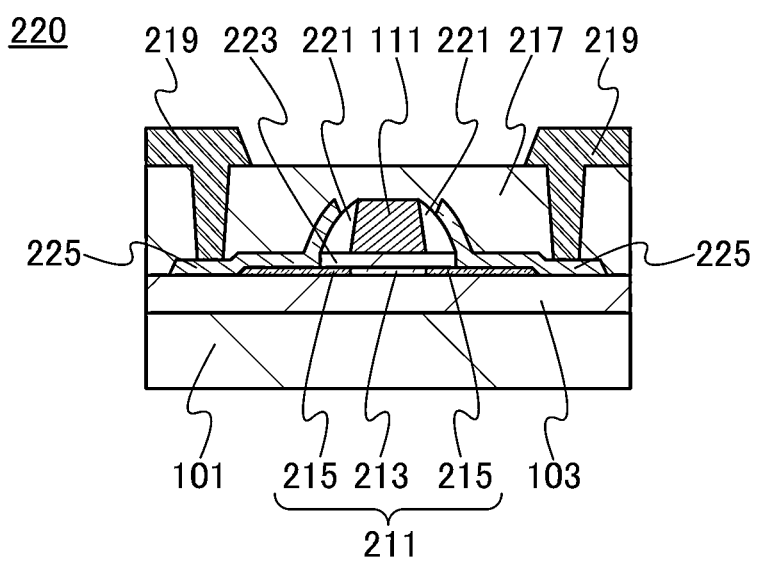

The transistor 220 illustrated in FIG. 11B includes the oxide semiconductor film 211 over the base insulating film 103, a pair of electrodes 225 functioning as a source electrode and a drain electrode in contact with the oxide semiconductor film 211, a gate insulating film 223 in contact with at least part of the oxide semiconductor film 211, and the gate electrode 111 over the gate insulating film 223 and overlapping with the oxide semiconductor film 211.

Further, the transistor includes sidewall insulating films 221 in contact with side surfaces of the gate electrode 111. Moreover, a protective film 217 is provided over the base insulating film 103, the gate electrode 111, the sidewall insulating films 221 and the pair of electrodes 225. In addition, the wiring 219 is provided to be in contact with the oxide semiconductor film 211 though openings formed in the protective film 217.

In the transistor in FIG. 11B, the oxide semiconductor film 211 includes the first region 213 overlapping with the gate electrode 111 with the gate insulating film 223 interposed therebetween and a pair of second regions 215 to which dopant is added. Note that dopant is not added to the first region 213. The pair of second regions 215 is provided so that the first region 213 is sandwiched therebetween.

End portions of the pair of electrodes 225 in the transistor are positioned over the sidewall insulating films 221, and the pair of electrodes 225 completely covers an exposed portion of the pair of second regions 215 including the dopant in the oxide semiconductor film 211. Thus, in the channel length direction, the distance between the source and the drain (more precisely, the distance in the oxide semiconductor film 211 between a portion in contact with the one of the pair of electrodes 225 and a portion in contact with the other of the electrodes) can be controlled by the lengths of the sidewall insulating films 221. That is, in a minute device in which patterning using a mask is difficult, end portions on the channel side of the pair of electrodes 225 in contact with the oxide semiconductor film 211 can be formed without a mask. Further, because a mask is not used, variation of a plurality of transistors due to process can be reduced.

The protective film 217 provided over each of the transistors 210 and 220 in this embodiment is an oxide insulating film containing oxygen in excess of the stoichiometric composition, like the protective film 23 in Embodiment 1. Further, it is preferable that the protective film 217 contain a larger amount of oxygen than the amount of oxygen vacancies in the oxide semiconductor film 211. The oxide insulating film containing oxygen in excess of the stoichiometric composition is an oxide insulating film from which part of oxygen is released by heating. Thus, with use of the oxide insulating film from which part of oxygen is released by heating as the protective film, oxygen can be diffused to the oxide semiconductor film by heat treatment, and oxygen vacancies in the oxide semiconductor film 211 can be filled. As a result, the amount of oxygen vacancies in the oxide semiconductor film 211 can be reduced, and a shift in the threshold voltage of the transistor in the negative direction can be suppressed. Moreover, a highly reliable transistor in which a variation in the threshold voltage with time or a variation in the threshold voltage due to a gate BT stress test under light is small can be provided.

Further, the transistor can have such excellent electric characteristics that the spin density of a signal at g=2.001 in the protective film 217, which is measured by electron spin resonance, is lower than $1.5 \times 10^{18}$ spins/cm$^3$, preferably lower than or equal to $1.0 \times 10^{18}$ spins/cm$^3$.

Note that in the transistor 220, oxygen contained in the protective film 217 transfers to the oxide semiconductor film 211 through at least one of the base insulating film 103, the, gate insulating film 223, and the sidewall insulating films 221.

Note that the structures, methods, and the like described in this embodiment can be used as appropriate in combination with any of the structures, methods, and the like described in the other embodiments and examples.

(Embodiment 8)

In this embodiment, a transistor having a different structure from those of Embodiments 1 to 7 will be described with reference to FIG. 12. A transistor in this embodiment includes a plurality of gate electrodes facing each other with an oxide semiconductor film interposed therebetween. Note that in this embodiment, description is made using the transistor shown in Embodiment 6; however, this embodiment can be combined with the other embodiments as appropriate.

Figure 12:
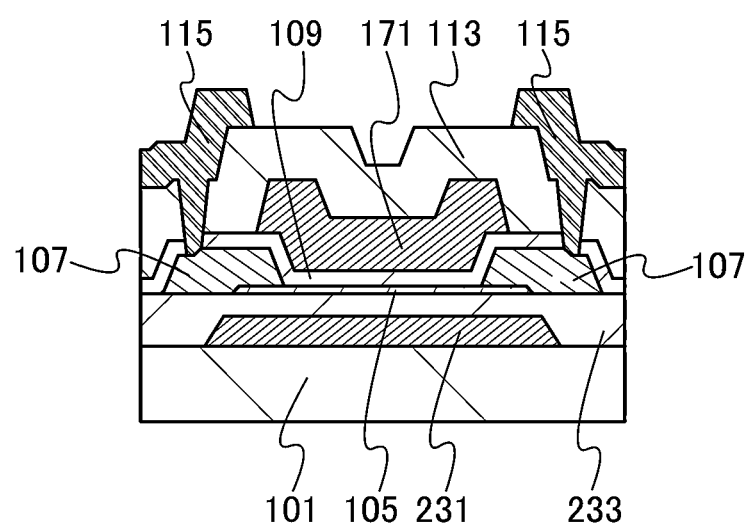
FIG. 12 is a cross-sectional view illustrating one embodiment of a transistor.

A transistor 230 illustrated in FIG. 12 includes a gate electrode 231 over a substrate 101 and an insulating film 233 covering the gate electrode 231. Further, the transistor includes an oxide semiconductor film 105 over the insulating film 233, a pair of electrodes 107 in contact with the oxide semiconductor film 105, a gate insulating film 109 in contact with the insulating film 233, the oxide semiconductor film 105, and the pair of electrodes 107, and a gate electrode 171 overlapping with the oxide semiconductor film 105 with the gate insulating film 109 interposed therebetween. In addition, a protective film 113 covering the gate insulating film 109 and the gate electrode 171 is provided. Furthermore, a wiring 115 may be provided to be in contact with the pair of electrodes 107 through openings formed in the gate insulating film 109 and the protective film 113.

The gate electrode 231 can be formed in a manner similar to that of the gate electrode 15 in Embodiment 1. The gate electrode 231 preferably has a tapered side surface in order to improve coverage of the insulating film 233 that is to be formed. The angle between the substrate 101 and the gate electrode 231 is greater than or equal to 20° and less than or equal to 70°, preferably greater than or equal to 30° and less than or equal to 60°.

The insulating film 233 can be formed in a manner similar to that of the base insulating film 103 in Embodiment 2. Note that the insulating film 233 preferably has a flat surface because the oxide semiconductor film 105 is formed over the insulating film 233 in a later step. Thus, an insulating film that is to be the insulating film 233 is formed over the substrate 101 and the gate electrode 231, and the insulating film is subjected to planarization treatment, so that the insulating film 233 with less surface unevenness is formed.

The transistor 230 in this embodiment has the gate electrode 231 and the gate electrode 171 facing each other with the oxide semiconductor film 105 interposed therebetween. By application of different potentials to the gate electrode 231 and the gate electrode 171, the threshold voltage of the transistor 230 is preferably controlled: the threshold voltage can be made to shift in the positive direction.

The protective film 113 is provided over the transistor 230 in this embodiment. The protective film 113 is an oxide insulating film containing in excess of the stoichiometric composition, like the protective film 23 in Embodiment 1. It is preferable that the protective film 113 contain a larger amount of oxygen than the amount of oxygen vacancies in the oxide semiconductor film 105. As a result, the amount of oxygen vacancies in the oxide semiconductor film 105 is reduced, which leads to suppression of a shift of the threshold voltage in the negative direction. Moreover, a highly reliable transistor in which a variation in the threshold voltage with time or a variation in the threshold voltage due to a gate BT stress test under light is small can be provided.

(Embodiment 9)

In this embodiment, a method for manufacturing a transistor in which the hydrogen concentration in an oxide semiconductor film is reduced will be described. Such a transistor is any of the transistors described in Embodiments 1 to 8. Here, description is made with use of Embodiments 1 and 2 typically; however, this embodiment can be combined with any of the other embodiments as appropriate. Note that at least one of steps described in this embodiment has to be combined with the process of manufacturing the transistor described in any of Embodiments 1 and 2; it is not necessary to combine all steps therewith.

In each of the oxide semiconductor film 19 in Embodiment 1 and the oxide semiconductor film 105 in Embodiment 2, the hydrogen concentration is lower than $5\times10^{19}$ atoms/cm$^3$, preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, yet further preferably lower than or equal to $1\times10^{16}$ atoms/cm$^3$.

Hydrogen contained in each of the oxide semiconductor films 19 and 105 reacts with oxygen bonded to a metal atom to produce water, and a defect is formed in a lattice from which oxygen is released (or a portion from which oxygen is removed). In addition, a bond of hydrogen and oxygen causes generation of electrons serving as carrier. Thus, the impurities containing hydrogen are reduced as much as possible in the step of forming the oxide semiconductor film, whereby the hydrogen concentration in the oxide semiconductor film can be reduced. When an oxide semiconductor which is highly purified by removing hydrogen as much as possible is used as a channel region, a shift of the threshold voltage in the negative direction can be reduced, and the leakage current between a source and a drain of the transistor (typically, the off-state current per channel width) can be decreased to several yA/μm to several zA/μm. As a result, electric characteristics of the transistor can be improved.

One of methods (a first method) of reducing the hydrogen concentration in the oxide semiconductor film 19 is as follows: before the oxide semiconductor film 19 is formed, hydrogen or water contained in each of the substrate 11, the base insulating film 13, the gate electrode 15, and the gate insulating film 17 is released by heat treatment or plasma treatment. As a result of this method, hydrogen or water attached to or contained in the substrate 11 to the gate insulating film 17 can be prevented from diffusing into the oxide semiconductor film 19 by performing heat treatment in a later step. The heat treatment is performed at a temperature higher than or equal to 100° C. and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, dinitrogen monoxide, or nitrogen dioxide) is used. Note that in Embodiments 2 to 8, before the oxide semiconductor film 105 is formed, hydrogen or water contained in each of the substrate 101 and the base insulating film 103 is released by heat treatment or plasma treatment.

Another method (a second method) of reducing the hydrogen concentration in the oxide semiconductor films 19 and 105 is as follows: before the oxide semiconductor film is formed with a sputtering apparatus, a dummy substrate is put into the sputtering apparatus, and an oxide semiconductor film is formed over the dummy substrate, so that hydrogen, water, and the like attached to the target surface or a deposition shield are removed. As a result, entry of hydrogen, water, or the like into the oxide semiconductor film can be suppressed.

Another method (a third method) of reducing the hydrogen concentration in the oxide semiconductor films 19 and 105 is as follows: in the case where an oxide semiconductor film is formed by a sputtering method, for example, an oxide semiconductor film is deposited at a substrate temperature higher than or equal to 150° C. and lower than or equal to 750° C., preferably higher than or equal to 150° C. and lower than or equal to 450° C., further preferably higher than or equal to 200° C. and lower than or equal to 350° C. As a result of this method, entry of hydrogen, water, or the like into the oxide semiconductor film can be suppressed.

Here, a sputtering apparatus with which the oxide semiconductor films 19 and 105 can be formed to have a low hydrogen concentration is described in detail below.

The leakage rate of a treatment chamber in which the oxide semiconductor film is formed is preferably lower than or equal to $1\times10^{-10}$ Pa·m$^3$/sec., whereby entry of hydrogen, water, or the like into the film to be formed by a sputtering method can be decreased.

Evacuation of the treatment chamber in the sputtering apparatus is preferably performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen and water. Further, a combination with a sputter ion pump having a high capability in evacuating hydrogen or a cryopump having a high capability in evacuating water is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film, entry of impurities is suppressed as much as possible through control of the pressure of the treatment chamber, leakage rate of the treatment chamber, and the like, whereby entry of hydrogen, water, or the like into the oxide semiconductor film can be reduced.

Another method (a fourth method) of reducing the hydrogen concentration in the oxide semiconductor films 19 and 105 is as follows: a high-purity gas from which an impurity including hydrogen is removed is used a source gas. As a result of this method, entry of hydrogen, water, or the like into the oxide semiconductor film can be suppressed.

Another method (a fifth method) of reducing the hydrogen concentration in the oxide semiconductor films 19 and 105 is as follows: heat treatment is performed after the oxide semiconductor film is formed. By the heat treatment, dehydrogenation or dehydration of the oxide semiconductor film can be performed.

The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere do not contain hydrogen, water, and the like. The treatment time is 3 minutes to 24 hours.

After the oxide semiconductor films 19 and 105 which have been subjected to element isolation are formed as illustrated in FIG. 2B and FIG. 6A, the heat treatment for dehydration or dehydrogenation can be performed. Through the above step, hydrogen, water, or the like included in the gate insulating film 17 or the base insulating film 103 can be efficiently released in the treatment for dehydration or dehydrogenation.

The heat treatment for dehydration or dehydrogenation may be performed plural times, and may also serve as another heat treatment.

At least one of the first to fifth methods of reducing the hydrogen concentration in the oxide semiconductor film is combined with any of the methods for manufacturing a transistor described in Embodiments 1 to 8, which makes it possible to manufacture a transistor in which a highly purified oxide semiconductor film from which hydrogen, water, or the like is removed as much as possible can be used for a channel region. As a result, a shift in the threshold voltage of the transistor in the negative direction can be reduced, and the leakage current between a source and a drain of the transistor (typically, the off-state current per channel width) can be decreased to several yA/μm to several zA/μm. Thus, electric characteristics of the transistor can be improved. According to the description of this embodiment, a transistor having excellent electric characteristics in which a shift in the threshold voltage of the transistor in the negative direction is reduced and the amount of leakage current is small can be manufactured.

(Embodiment 10)

In this embodiment, a semiconductor device which includes a transistor including a first semiconductor material in a lower portion and a transistor including a second semiconductor material in an upper portion and in which the transistor including the first semiconductor material includes a semiconductor substrate is described with reference to FIG. 13.

Figure 13:
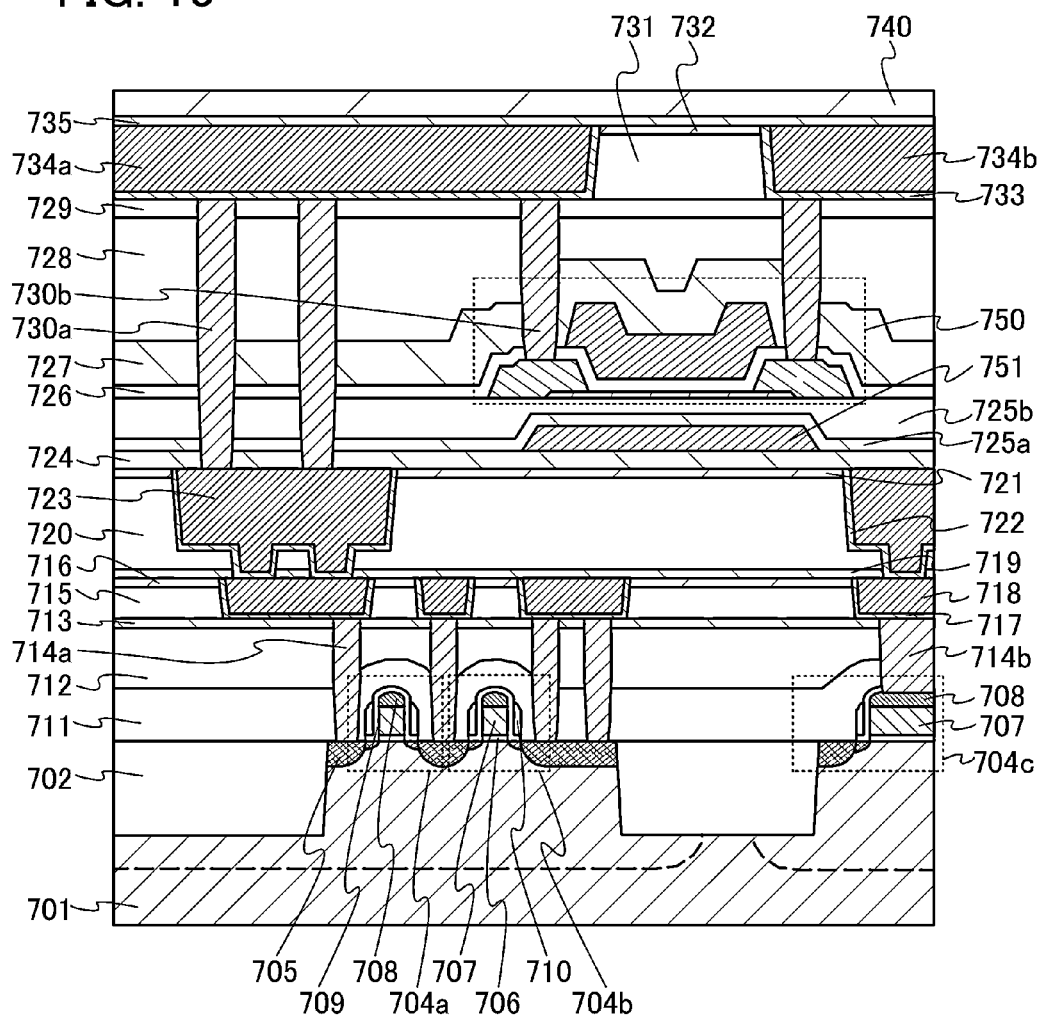
FIG. 13 is a cross-sectional view illustrating one embodiment of a semiconductor device.

FIG. 13 illustrates an example of a cross-sectional structure of the semiconductor device that includes the transistor including the first semiconductor material in the lower portion and the transistor including the second semiconductor material in the upper portion. Here, the first semiconductor material and the second semiconductor material are different from each other. For example, a semiconductor material other than an oxide semiconductor can be used as the first semiconductor material, and an oxide semiconductor can be used as the second semiconductor material. The semiconductor material other than an oxide semiconductor may be, for example, silicon, germanium, silicon germanium, silicon carbide, gallium arsenide, or the like and is preferably a single crystal semiconductor or a polycrystalline semiconductor. A transistor formed using single crystal semiconductor can operate at high speed easily. In contrast, a transistor formed using an oxide semiconductor can be used for a circuit utilizing characteristics of sufficiently low off-state current per channel width, which is approximately several yA/μm to several zA/μm. Thus, a logic circuit with low power consumption can be formed using the semiconductor device illustrated in FIG. 13. Alternatively, an organic semiconductor material or the like may be used as the first semiconductor material.

Either an n-channel transistor (NMOSFET) or a p-channel transistor (PMOSFET) can be used as each of transistors 704a, 704b, and 704c. Here, as the transistors 704a and 704b, p-channel transistors are used, and as the transistor 704c, an n-channel transistor is used. In the example illustrated in FIG. 13, the transistors 704a and 704b in one island are electrically isolated from other elements by a shallow trench isolation (STI) 702. On the other hand, the transistor 704c in another island is electrically isolated from the transistors 704a and 704b by the STI 702. The use of the STI 702 can reduce the generation of a bird's beak in an element isolation region, which is caused in an LOCOS element isolation method, and can reduce the size of the element isolation region. On the other hand, in a semiconductor device in which a transistor is not required to be structurally miniaturized or downsized, the STI 702 is not necessarily formed, and an element isolation means such as LOCOS can be used.

The transistors 704a, 704b, and 704c in FIG. 13 each include a channel region provided in a substrate 701, impurity regions 705 (also referred to as a source region and a drain region) provided such that the channel formation region is provided therebetween, a gate insulating film 706 provided over the channel region, and gate electrodes 707 and 708 provided over the gate insulating film 706 so as to overlap with the channel region. A gate electrode can have, but is not limited to, a stacked structure of the gate electrode 707 including a first material for increasing processing accuracy and the gate electrode 708 including a second material for decreasing the resistance as a wiring; the material, the number of stacked layers, the shape, or the like can be adjusted as appropriate for required specifications. Note that a transistor whose source electrode and drain electrode are not illustrated in a drawing may also be referred to as a transistor for the sake of convenience.

Further, contact plugs 714a are connected to the impurity regions 705 provided in the substrate 701. Here, the contact plugs 714a also function as a source electrode and a drain electrode of the transistor 704a or the like. In addition, impurity regions which are different from the impurity regions 705 are provided between the impurity regions 705 and the channel region. The impurity regions function as LDD regions or extension regions for controlling the distribution of an electric field in the vicinity of the channel region, depending on the concentration of an impurity introduced thereto. Sidewall insulating films 710 are provided at side surfaces of the gate electrodes 707 and 708 with an insulating film 709 provided therebetween. By using the insulating film 709 and the sidewall insulating films 710, the LDD regions or extension regions can be formed.

The transistors 704a, 704b, and 704c are covered with an insulating film 711. The insulating film 711 can function as a protective film and can prevent impurities from entering the channel region from the outside. In addition, when the insulating film 711 is formed using a material such as silicon nitride by a CVD method, in the case where single crystal silicon is used for the channel region, hydrogenation of single crystal silicon can be performed by heat treatment. When an insulating film having tensile stress or compressive stress is used as the insulating film 711, distortion can be caused in the semiconductor material in the channel region. By subjecting a silicon material in the channel region to tensile stress in the case of an n-channel transistor or subjecting a silicon material in the channel region to compressive stress in the case of a p-channel transistor, the mobility of the transistor can be improved.

Here, the transistor 750 in FIG. 13 has a structure similar to that of the transistor 170 in Embodiment 6. A base insulating film of the transistor 750 has a two-layer structure including an insulating film 725a and an insulating film 725b, and a gate electrode 751 is provided to face an oxide semiconductor film of the transistor 750 with the base insulating film provided therebetween. The insulating film 725a is preferably formed using an insulating film having a function of blocking hydrogen, water, and oxygen so that oxygen can be prevented from diffusing from the oxide semiconductor film to the outside, and hydrogen and water can be prevented from entering the oxide semiconductor film from the outside. The insulating film having a function of blocking hydrogen, water, and oxygen is typically formed using an aluminum oxide film. For the insulating film 725b, the base insulating film 103 in Embodiment 2 can be used as appropriate.

Although the transistor 170 in Embodiment 6 is used for description of the transistor 750, any of the transistors in Embodiments 1 to 9 can be used as appropriate.

The transistor 750 including the second semiconductor material is electrically connected to a transistor including the first semiconductor material in a lower layer, such as the transistor 704a, depending on a needed circuit configuration. FIG. 13 illustrates an example structure in which a source or a drain of the transistor 750 is electrically connected to a source or a drain of the transistor 704a.

One of the source and the drain of the transistor 750 including the second semiconductor material is connected to a wiring 734a formed above the transistor 750, through a contact plug 730b penetrating a gate insulating film 726 of the transistor 750 and insulating films 727, 728, and 729. For the gate insulating film 726 and the insulating film 727, any of the structures and materials described in Embodiments 1 to 9 can be used as appropriate.

The wiring 734a is embedded in an insulating film 731. For the wiring 734a, it is preferable to use a low-resistance conductive material such as copper or aluminum. By using a low-resistance conductive material, RC delay of signals transmitted through the wiring 734a can be reduced. In the case of using copper for the wiring 734a, a barrier film 733 is formed in order to prevent copper from diffusing into the channel region. The barrier film can be formed using a film of tantalum nitride, a stacked-layer film of tantalum nitride and tantalum, a film of titanium nitride, a stacked-layer film of titanium nitride and titanium, or the like for example, but are not limited to the films of these materials as long as their function of preventing diffusion of a wiring material and their adhesion to the wiring material, a base film, or the like are secured. The barrier film 733 may be formed as a layer that is separate from the wiring 734a, or may be formed in such a manner that a barrier film material contained in a wiring material is separated out by heat treatment to the inner walls of the openings provided in the insulating film 731.

For the insulating film 731, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In particular, in the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. In addition, since CMP treatment is performed after the wiring is embedded in the insulating film, the insulating film needs to have high mechanical strength. As long as their mechanical strength can be secured, the insulating film can be made porous to have a lower dielectric constant. The insulating film 731 is formed by a sputtering method, a CVD method, a coating method including a spin coating method (also referred to as spin on glass (SOG)), or the like.

An insulating film 732 may be provided over the insulating film 731. The insulating film 732 functions as an etching stopper when planarization treatment by CMP or the like is performed after the wiring material is embedded in the insulating film 731.

Over the wiring 734a, a barrier film 735 is provided, and over the barrier film 735, a protective film 740 is provided. The barrier film 735 is provided in order to prevent diffusion of the wiring material such as copper. The barrier film 735 may be formed not only over a surface of the wiring 734a but also over the insulating films 731 and 732. The barrier film 735 can be formed using an insulating material such as silicon nitride, SiC, or SiBON. However, when the barrier film 735 is thick, capacitance between wirings is increased; thus, a material having barrier properties and a low dielectric constant is preferably selected.

The wiring 734a is connected to a wiring 723 provided in a lower layer than a barrier film 724 through a contact plug 730a. The contact plug 730a is electrically connected to the wiring 723 through the barrier film 724, the insulating films 725a and 725b, the gate insulating film 726, the insulating films 727, 728, and 729, which is different from the contact plug 730b. Thus, the contact plug 730a has a larger height than the contact plug 730b. In the case where the diameter of the contact plug 730a is the same as that of the contact plug 730b, the aspect ratio of the contact plug 730a is larger than that of the contact plug 730b. The diameter of the contact plug 730a may be different from that of the contact plug 730b. The contact plug 730a is illustrated like a continuous plug formed using one material; however, a contact plug penetrating the barrier film 724 and the insulating films 725a and 725b and a contact plug penetrating the gate insulating film 726 and the insulating films 727, 728, and 729 may be separately formed.

In a manner similar to that of the wiring 734a and a wiring 734b, the wiring 723 is covered with a barrier film 722 and the barrier film 724 and embedded in the insulating film 720. As illustrated in FIG. 13, the wiring 723 includes an upper wiring portion and a lower via hole portion. The lower via hole portion is connected to a wiring 718 in a lower layer. The wiring 723 having this structure can be formed by a so-called dual damascene method or the like. Wirings in upper and lower layers may be connected using a contact plug instead of the dual damascene method. An insulating film 721 functioning as an etching stopper when planarization treatment such as CMP is performed may be provided over the insulating film 720.

The wiring 718 electrically connected to the wiring 723 can also be formed to have a structure similar to that of the above-described wiring layer above the transistor 750. The transistor 704a in which the first semiconductor material such as silicon is used for the channel region is connected to the wiring 718 through a contact plug 714a penetrating the insulating film 711, an insulating film 712, and an insulating film 713. A gate electrode of the transistor 704c in which the first semiconductor material such as silicon is used for the channel region is connected to the wiring 718 through a contact plug 714b penetrating the insulating film 711, an insulating film 712, and an insulating film 713. The wiring 718 is covered with barrier films 717 and 719 and embedded in an insulating film 715, which is a manner similar to those of the wirings 734a and 734b. Over the insulating film 715, an insulating film 716 functioning as an etching stopper when planarization treatment such as CMP is performed may be provided.

As described above, through a plurality of contact plugs and a plurality of wirings, the transistor 704a, which includes the first semiconductor material and is provided in the lower portion of the semiconductor device, is electrically connected to the transistor 750, which includes the second semiconductor material and is provided in the upper portion of the semiconductor device. With the above-described structure in which the transistor including the first semiconductor material and being capable of operating at high speed is combined with the transistor including the second semiconductor material and having significantly low off-state current, a semiconductor device including a logic circuit capable of operating at high speed with low power consumption can be manufactured.

Such a semiconductor device is not limited to the above structure and can be changed as desired unless they deviate from the spirit of the present invention. For example, in the above description, two wiring layers are provided between the transistor including the first semiconductor material and the transistor including the second semiconductor material, but one wiring layer or three or more wiring layers may be provided, or without wirings, the transistors may be directly connected through only a contact plug. In this case, a through-silicon via (TSV) technique can also be used, for example. In addition, in the above description, a material such as copper is embedded in an insulating film to form a wiring, but a wiring having a three-layer structure of a barrier film, a wiring material layer, a barrier film, for example, may be obtained by patterning through a photolithography process.

In the case where a copper wiring is formed in a tier between the transistors 704a and 704b including the first semiconductor material and the transistor 750 including the second semiconductor material, it is particularly necessary to take into consideration the influence of heat treatment performed in the process for manufacturing the transistor 750 including the second semiconductor material. In other words, it is necessary to take care that the temperature of heat treatment performed in the process for manufacturing the transistor 750 including the second semiconductor material is appropriate to the properties of the wiring material. This is because, in the case where high-temperature heat treatment is performed on a component of the transistor 750 for example, thermal stress is caused in case of using the copper wiring, leading to a problem such as stress migration.

(Embodiment 11)

As examples of the semiconductor device described in any of the above embodiments, a central processing unit, a microprocessor, a microcomputer, a memory device, an image sensor, an electro-optical device, a light-emitting display device, and the like can be given. The semiconductor device can be applied to a variety of electronic devices. Examples of the electronic devices are as follows: display devices, lighting devices, personal computers, word processors, image reproducing devices, portable compact disc (CD) players, radio receivers, tape recorders, headphone stereos, stereos, clocks, cordless phone handsets, transceivers, portable wireless devices, cellular phones, smart phones, electronic books, car phones, portable game machines, calculators, portable information terminals, e-book readers, electronic translators, audio input devices, cameras such as video cameras or digital still cameras, electric shavers, high-frequency heating appliances, electric rice cookers, electric washing machines, electric vacuum cleaners, water heaters, electric fans, hair dryers, air conditioners, humidifiers, dehumidifiers, air-conditioning systems, dishwashing machines, dish drying machines, clothes dryers, futon dryers, electric refrigerators, electric freezers, electric refrigerator-freezers, freezers for preserving DNA, flashlights, electric power tools, smoke detectors, medical equipments, guide lights, traffic lights, belt conveyors, elevators, escalators, industrial robots, power storage systems, electric vehicles, hybrid electric vehicles, plug-in hybrid electric vehicles, tracked vehicles, motorized bicycles, motorcycles, electric wheelchairs, golf carts, boats, ships, submarines, helicopters, aircrafts, rockets, artificial satellites, space probes, planetary probes, and spacecrafts. In this embodiment, examples of application of the semiconductor device described in any of the above embodiments to portable devices such as cellular phones, smartphones, or e-book readers are described with reference to FIGS. 14A and 14B, FIG. 15, FIG. 16, and FIG. 17.

In portable electronic devices such as a cellular phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 14A:
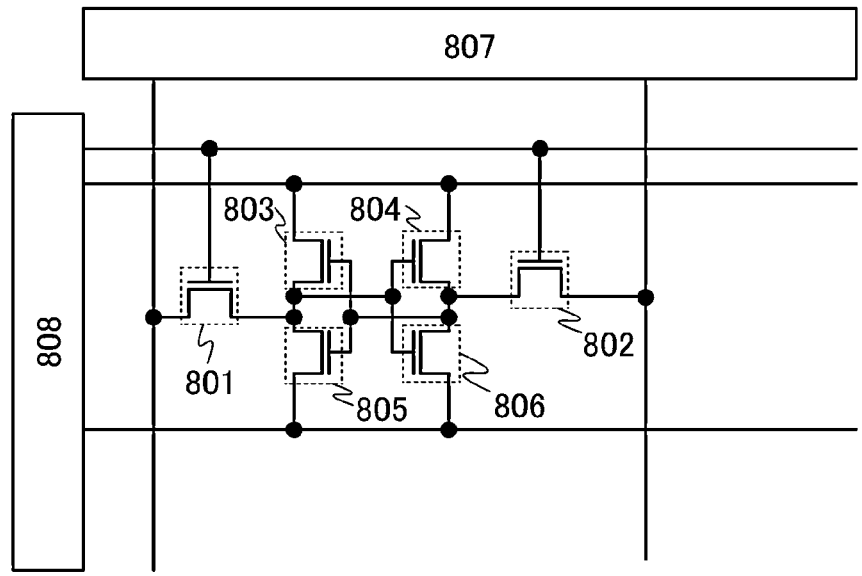
FIGS. 14A and 14B are circuit diagrams each illustrating one embodiment of a semiconductor device.

In an ordinary SRAM, as illustrated in FIG. 14A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 14B:
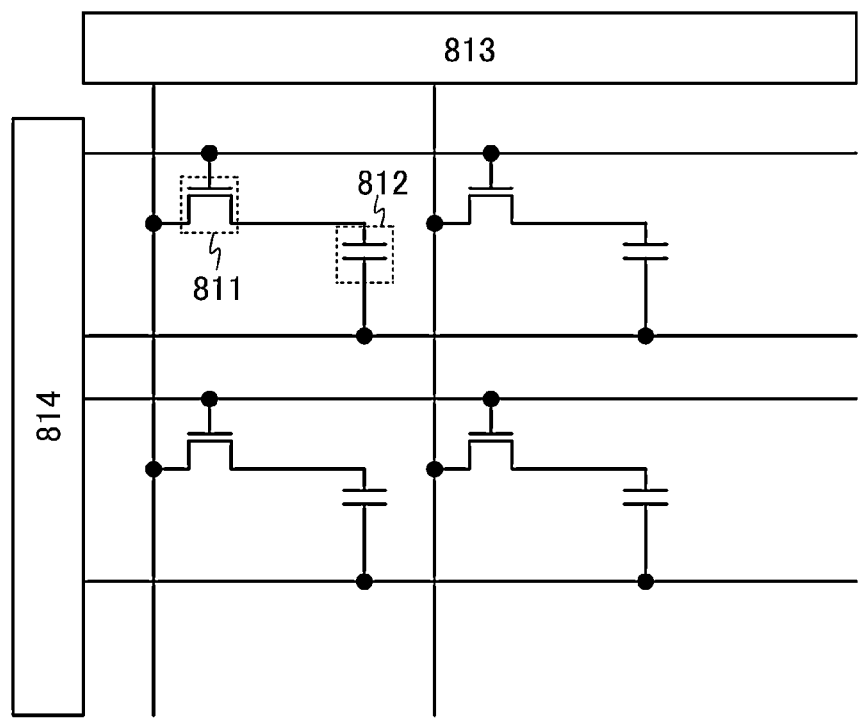

On the other hand, as illustrated in FIG. 14B, a memory cell in a DRAM includes a transistor 811 and a storage capacitor 812, and is driven by an X decoder 813 and a Y decoder 814. One cell includes one transistor and one capacitor and has a small area. The area of a memory cell of a DRAM is generally less than or equal to 10 $F^2$. Note that in the case of a DRAM, a refresh operation is always necessary and power is consumed even when a rewriting operation is not performed.

However, with use of the transistor with low off-state current, which is described in the above embodiment, for the transistor 811, electric charge in the storage capacitor 812 can be held for a long time, and thus it is not necessary to perform refresh operation frequently. Therefore, the area of a memory cell can be decreased, and power consumption can be reduced.

Figure 15:
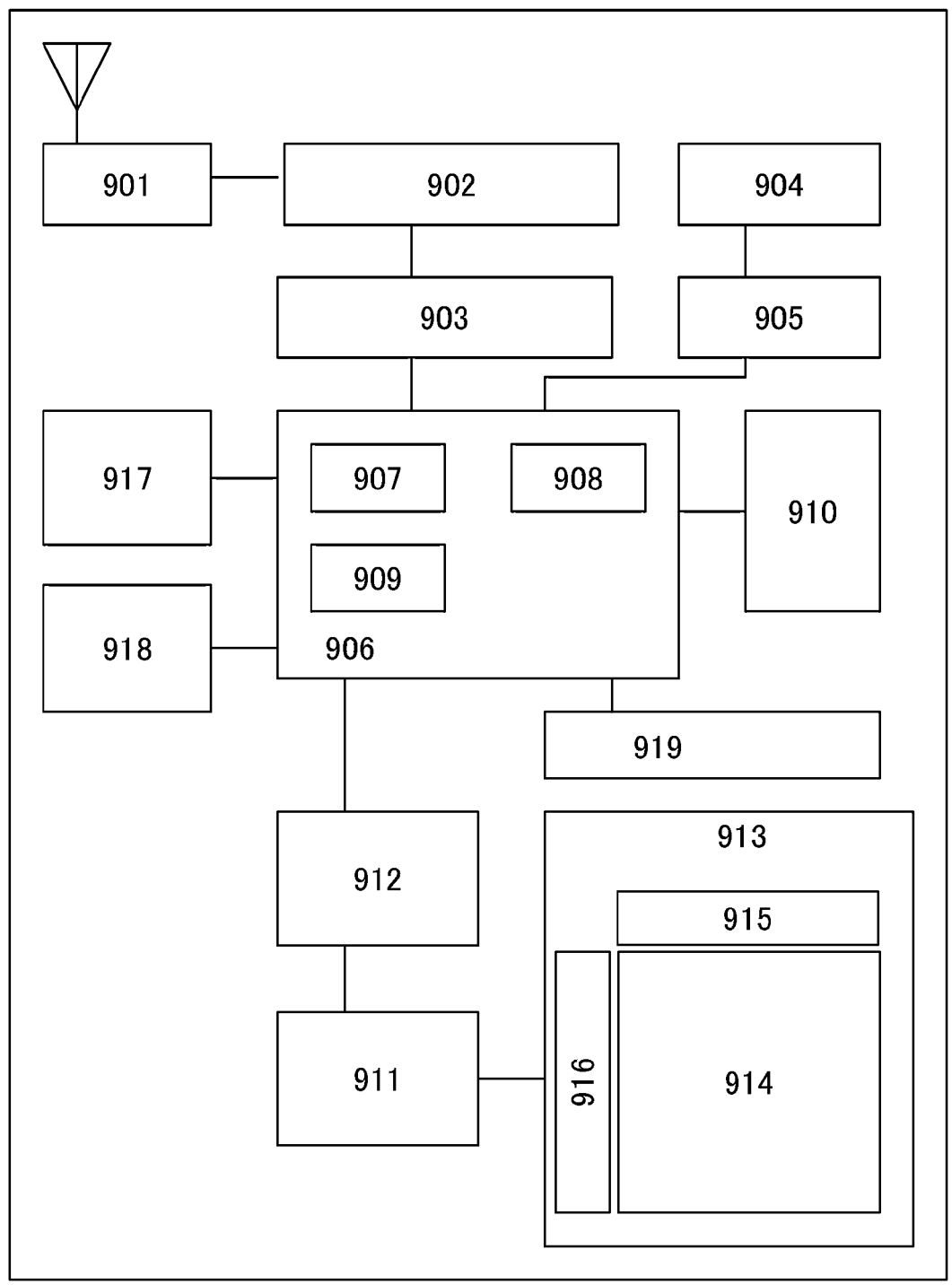
FIG. 15 is a block diagram illustrating one embodiment of a semiconductor device.

Next, a block diagram of a portable device is illustrated in FIG. 15. The portable device illustrated in FIG. 15 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a central processing unit (CPU) 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced. Further, the power consumption of the CPU 907 can be sufficiently reduced by employing the semiconductor device described in any of the above embodiments for a main memory device for storing data or an instruction or a buffer memory device capable of high-speed writing and reading of data, such as a register or a cache, which is included in the CPU 907.

Figure 16:
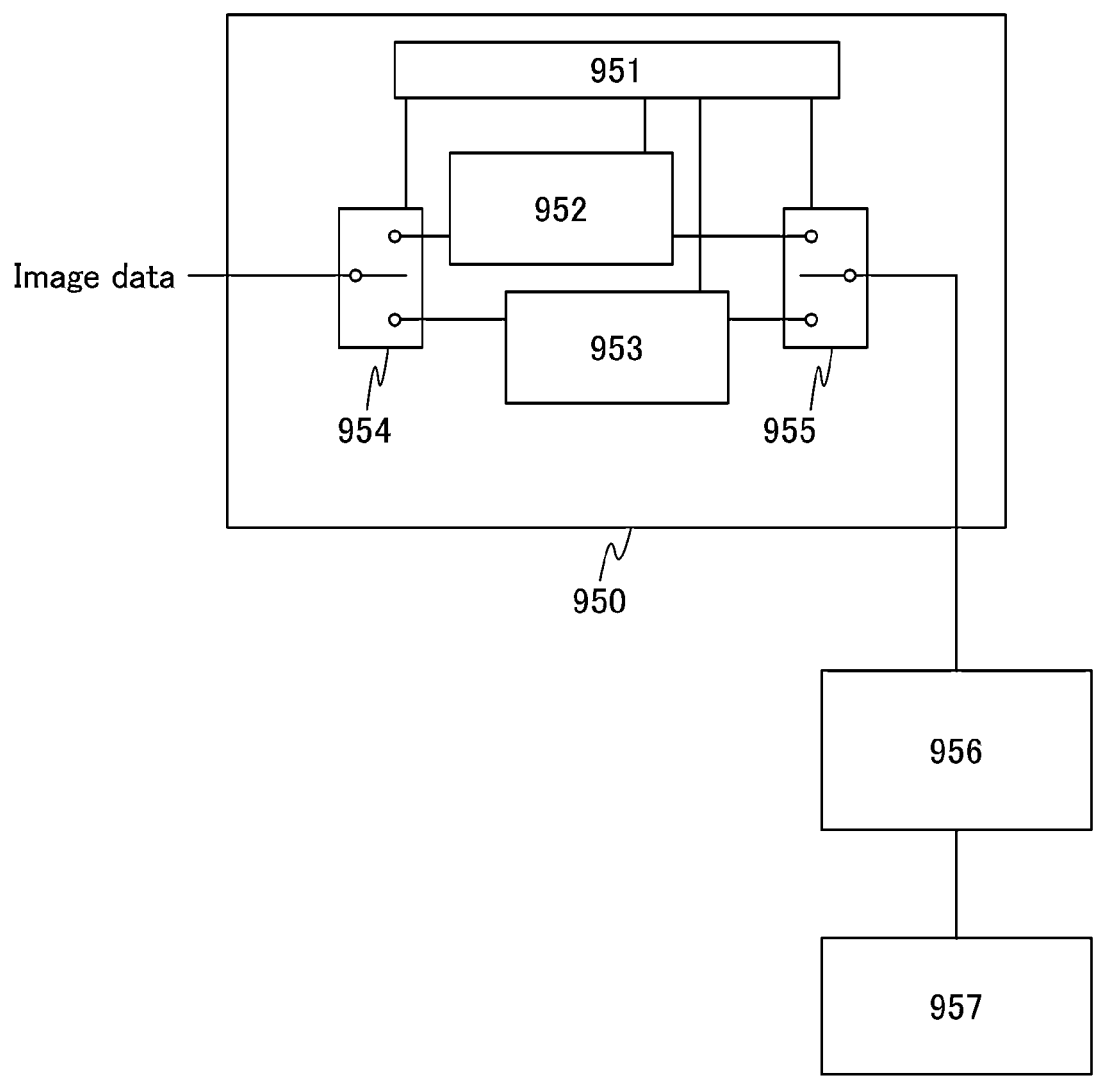
FIG. 16 is a block diagram illustrating one embodiment of a semiconductor device.

FIG. 16 illustrates an example of using the semiconductor device described in any of the above embodiments in a memory circuit 950 for a display. The memory circuit 950 illustrated in FIG. 16 includes a memory 952, a memory 953, a switch 954, a switch 955, and a memory controller 951. Furthermore, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is held in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 17:
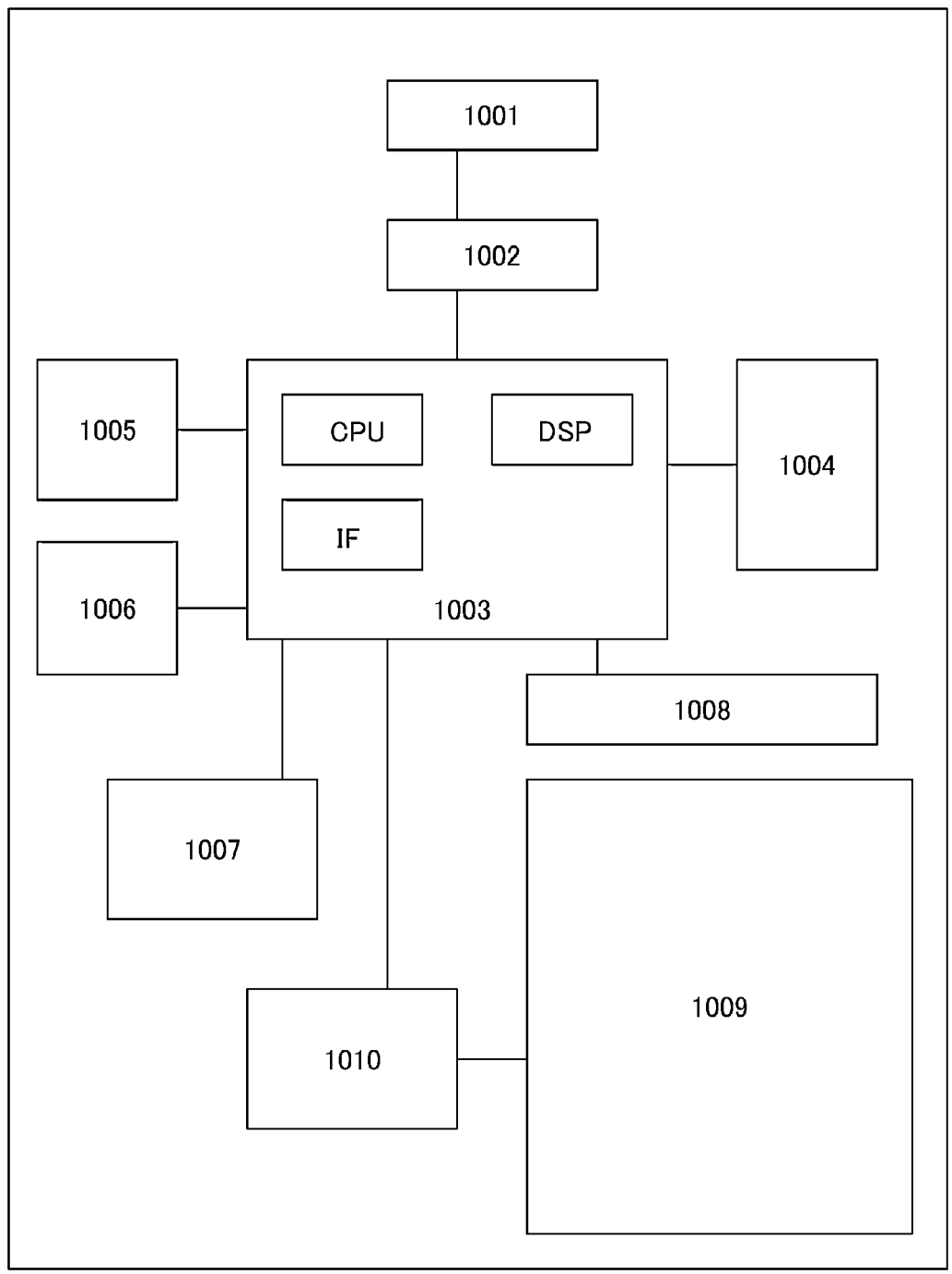
FIG. 17 is a block diagram illustrating one embodiment of a semiconductor device.

Next, a block diagram of an e-book reader is illustrated in FIG. 17. The e-book reader in FIG. 17 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 17. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, stored data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the other structures, methods, and the like described in this embodiment or any of the structures, methods, and the like described in the other embodiments.

EXAMPLE 1

In this example, characteristics of a silicon oxynitride film which is formed by the method for forming the protective film 23 described in Embodiment 1 will be described. Specifically, results of thermal desorption spectroscopy (TDS) conducted to analyze the amount of oxygen contained in the oxynitride silicon film formed by the above method are used for the description.

First, samples which were manufactured are described. Each of the samples has a structure in which a 400-nm-thick silicon oxynitride film is formed over a silicon wafer by employing the conditions for forming the protective film 23 described in Embodiment 1.

The conditions for forming the silicon oxynitride film are as follows: the silicon wafer was placed in a treatment chamber of a plasma CVD apparatus; silane and dinitrogen monoxide which were source gases were supplied at 160 sccm and 4000 sccm, respectively, into the treatment chamber; the pressure of the treatment chamber was adjusted to 200 Pa; and a power of 1500 W was supplied with a high-frequency power supply of 27.12 MHz. Further, the substrate temperature at which the silicon oxynitride film was formed was 220° C. The plasma CVD apparatus used in this example was a parallel plate plasma CVD apparatus with an electrode area of 6000 cm$^2$, and the power per unit area (power density) into which the supplied power is converted was 0.25 W/cm$^2$.

The sample manufactured by the above method is Sample A1.

Further, as a comparative example, Sample A2 in which a silicon oxynitride film is formed over a silicon wafer was manufactured with use of the plasma CVD apparatus used for manufacturing Sample A1. The silicon oxynitride film of Sample A2 was formed in the following manner: silane and dinitrogen monoxide were supplied at 30 sccm and 4000 sccm, respectively, into the treatment chamber; the pressure of the treatment chamber was adjusted to 200 Pa; and a power of 150 W was supplied with a high-frequency power supply of 27.12 MHz. Note that the power per unit area (power density) into which the power supplied to form the silicon oxynitride film of Sample A2 is converted was 0.025 W/cm$^2$.

Figure 18:
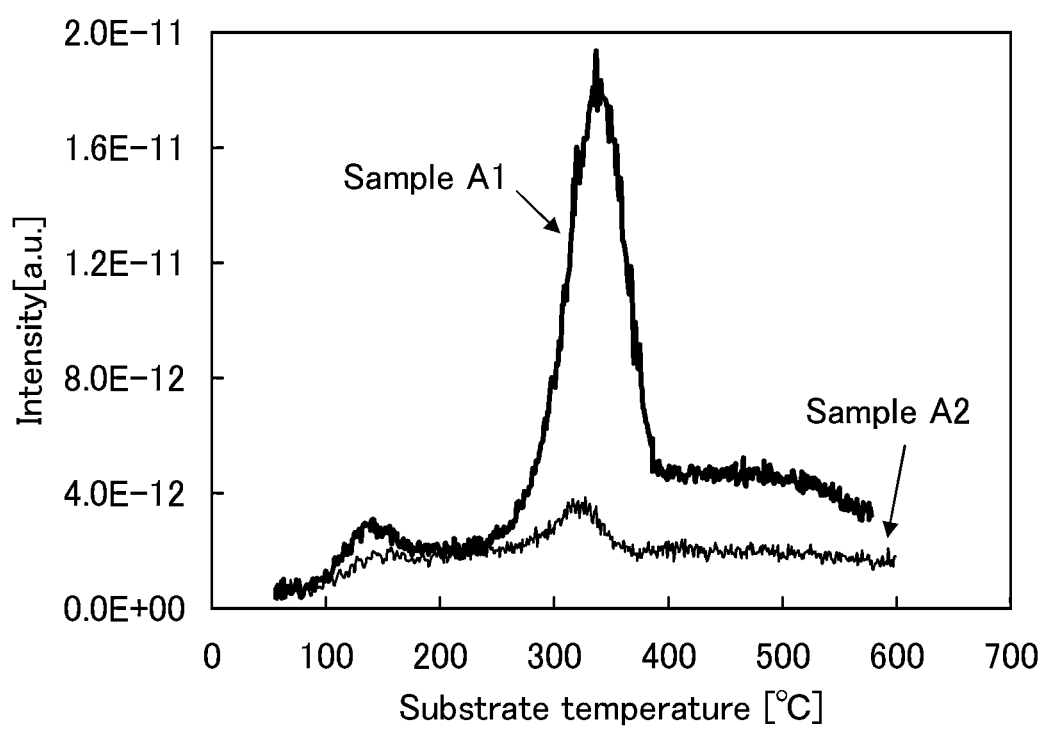
FIG. 18 is a graph showing results of TDS analysis of manufactured samples.

Next, Sample A1 and Sample A2 were subjected to TDS analysis. FIG. 18 shows the results of the TDS analysis. In FIG. 18, the horizontal axis indicates the substrate temperature of Sample A1 and Sample A2, and the vertical axis indicates the peak intensity of a TDS spectrum.

In the TDS analysis, a peak observed at a region where the substrate temperature is higher than or equal to 300° C. and lower than or equal to 400° C. is a peak derived from a release of oxygen (specifically, an oxygen atom or an oxygen molecule) contained in the analyzed sample (here, Sample A1 and Sample A2) to the outside. Note that the total amount of oxygen released to the outside corresponds to the integral value of a spectrum. In the case where the silicon oxynitride film contains oxygen in excess of the stoichiometric composition, it is considered that excess oxygen is easily released to the outside. Thus, with the degree of the peak intensity, the amount of oxygen contained in the silicon oxynitride film can be estimated.

As shown in FIG. 18, a peak of Sample A1 is higher than that of Sample A2. Here, the peak is derived from a release of oxygen to the outside. Thus, it is found that the amount of oxygen contained in the silicon oxynitride film in Sample A1 is larger than the amount of oxygen contained in the silicon oxynitride film in Sample A2.

Next, an effect of power supplied to form the insulating film by the method for forming the protective film 23 described in Embodiment 1 is described.

Samples which were manufactured are described below. Each of the samples had the same structure as Sample A1, but the power supplied to form the silicon oxynitride film as the insulating film was 1000 W (0.17 W/cm$^2$) or 2000 W (0.33 W/cm$^2$). Note that the other conditions for forming the silicon oxynitride film were the same as those of Sample A1.

Here, the sample obtained by supplying a power of 1000 W (0.17 W/cm$^2$) is Sample A3, and the sample obtained by supplying a power of 2000 W (0.33 W/cm$^2$) is Sample A4.

Figure 19A:
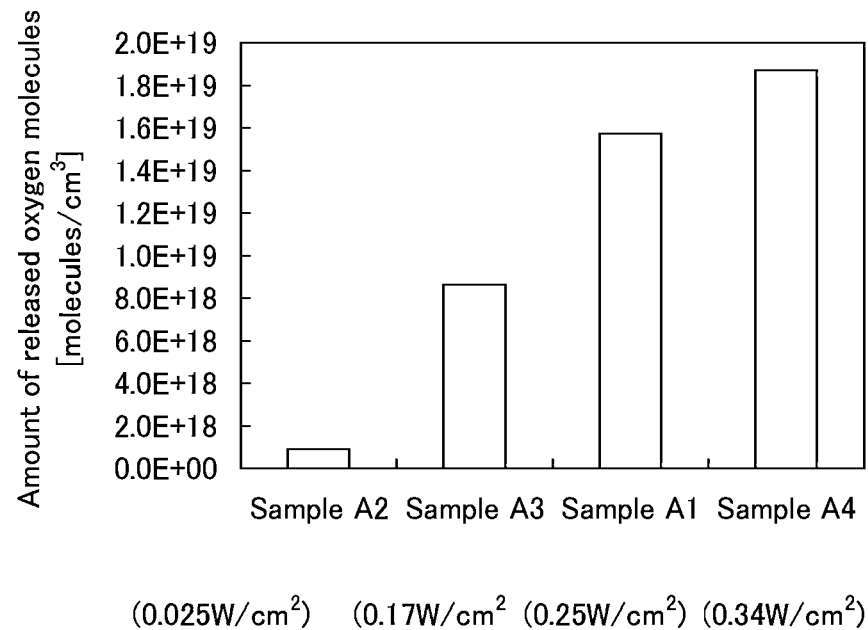
FIGS. 19A and 19B are graphs showing the number of released oxygen molecules from manufactured samples.

Sample A3 and Sample A4 were subjected to TDS analysis. The amount of oxygen estimated by the TDS analysis is described above. FIG. 19A shows the amounts of oxygen contained in Sample A1, Sample A3, Sample A4, and Sample A2, which were estimated by the TDS analysis.

According to FIG. 19A, the higher the power supplied to form the silicon oxynitride film is, the larger the amount of oxygen contained in the sample is.

Next, an effect of pressure adjusted to form the insulating film by the method for forming the protective film 23 described in Embodiment 1 is described.

Samples which were manufactured are described below. Each of the samples had the same structure as Sample A1, but the pressure adjusted to form the silicon oxynitride film was 120 Pa or 250 Pa. Note that the other conditions for forming the silicon oxynitride film were the same as those of Sample A1.

Here, the sample obtained under the pressure adjusted to 120 Pa is Sample A5, and the sample obtained under the pressure adjusted to 250 Pa is Sample A6.

Figure 19B:
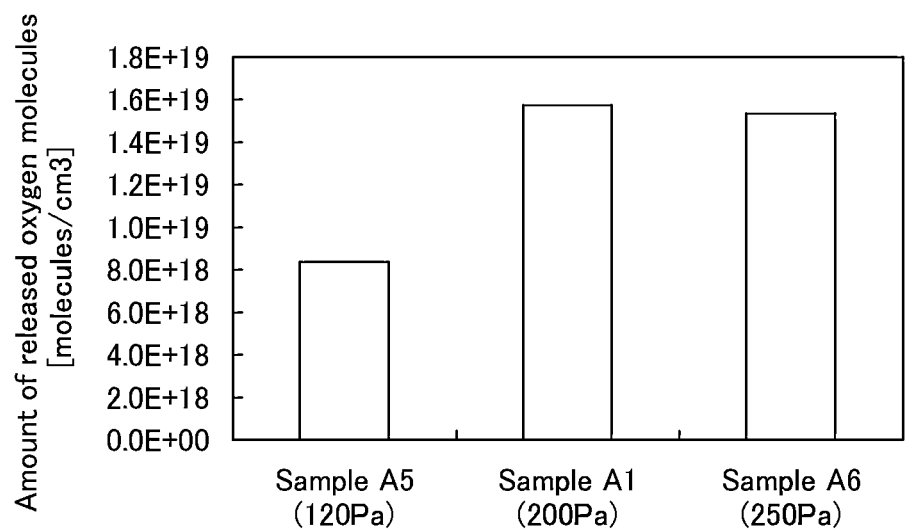

Sample A5 and Sample A6 were subjected to TDS analysis. The amount of oxygen estimated by the TDS analysis is described above. FIG. 19B shows the amounts of oxygen contained in Sample A1, Sample A5, and Sample A6, which were estimated by the TDS analysis.

According to FIG. 19B, when the pressure adjusted to form the silicon oxynitride film is increased, the amount of oxygen contained in the sample is increased.

As described above, it is found that by using the method for forming the protective film 23 described in Embodiment 1 for formation of a silicon oxynitride film, the silicon oxynitride film can contain oxygen in excess of the stoichiometric composition. Part of oxygen contained in the silicon oxynitride film is released by heating. Thus, when the silicon oxynitride film is used as a protective film of a transistor, the released oxygen can be diffused into an oxide semiconductor film of the transistor. As a result, the transistor can have excellent electric characteristics.

EXAMPLE 2

In this example, results of TDS analysis of samples with different structures from those of Example 1 will be described. The TDS analysis was conducted to evaluate characteristics of a silicon oxynitride film formed by the method for forming the protective film 23 described in Embodiment 1.

The samples which were manufactured in this example each have a stacked structure in which a 50-nm-thick silicon nitride film is formed over a silicon wafer and a 200-nm-thick silicon oxynitride film is formed over the silicon nitride film.

The silicon nitride film was formed in the following manner: the silicon wafer was placed in a treatment chamber of a plasma CVD apparatus; silane and nitrogen were supplied at 50 sccm and 5000 sccm, respectively, into the treatment chamber; the pressure in the treatment chamber was adjusted to 60 Pa; and a power of 150 W was supplied with a high-frequency power supply of 27.12 MHz. Further, the substrate temperature at which the silicon nitride film was formed was 350° C. Note that the plasma CVD apparatus used in this example is similar to that of Example 1, and the power density into which the supplied power is converted was 0.25 W/cm$^2$.

Then, over the silicon nitride film, a silicon oxynitride film was formed in the following manner: silane and dinitrogen monoxide were supplied at 160 sccm and 4000 sccm, respectively, into the treatment chamber; the pressure in the treatment chamber was adjusted to 200 Pa; and a power of 1500 W (0.25 W/cm$^2$) was supplied with a high-frequency power supply of 27.12 MHz. Further, the substrate temperature at which the silicon oxynitride film was formed was 220° C. A sample formed in this manner is as Sample B1.

In addition, Sample B2 in which over the silicon nitride film, a silicon oxynitride film was formed under different conditions from the above was formed. The conditions for forming a silicon oxynitride film in Sample B2 are as follows: silane and dinitrogen monoxide were supplied at 100 sccm and 3000 sccm, respectively, to the treatment chamber; the pressure in the treatment chamber was adjusted to 40 Pa; and a power of 1500 W (0.25 W/cm$^2$) was supplied with a high-frequency power supply of 27.12 MHz. Further, the substrate temperature at which the silicon oxynitride film was formed was 350° C.

Figure 20A:
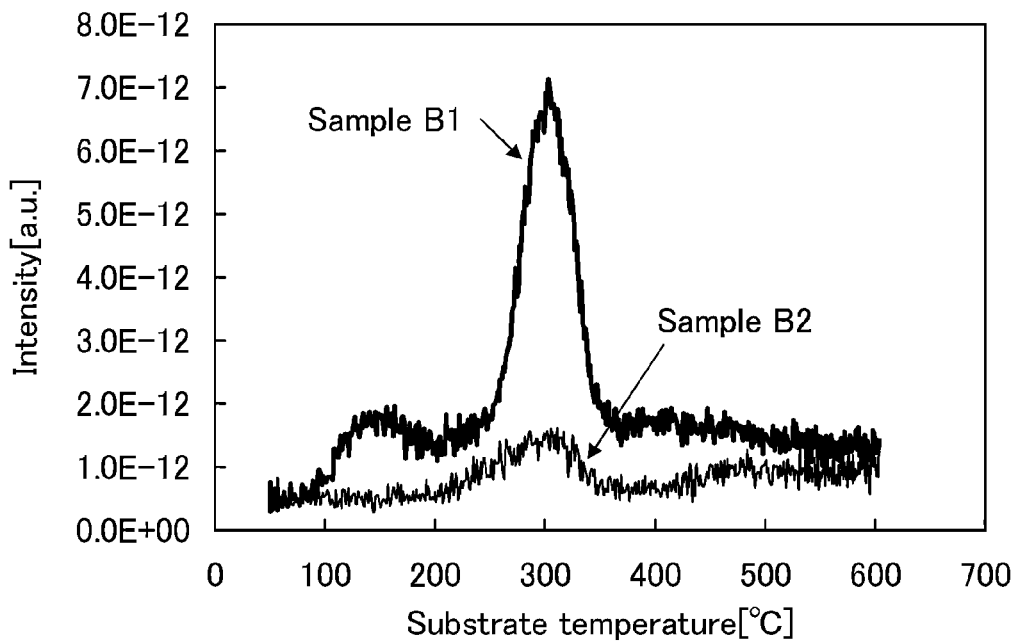
FIGS. 20A and 20B are graphs showing results of TDS analysis of manufactured samples.
Figure 20B:
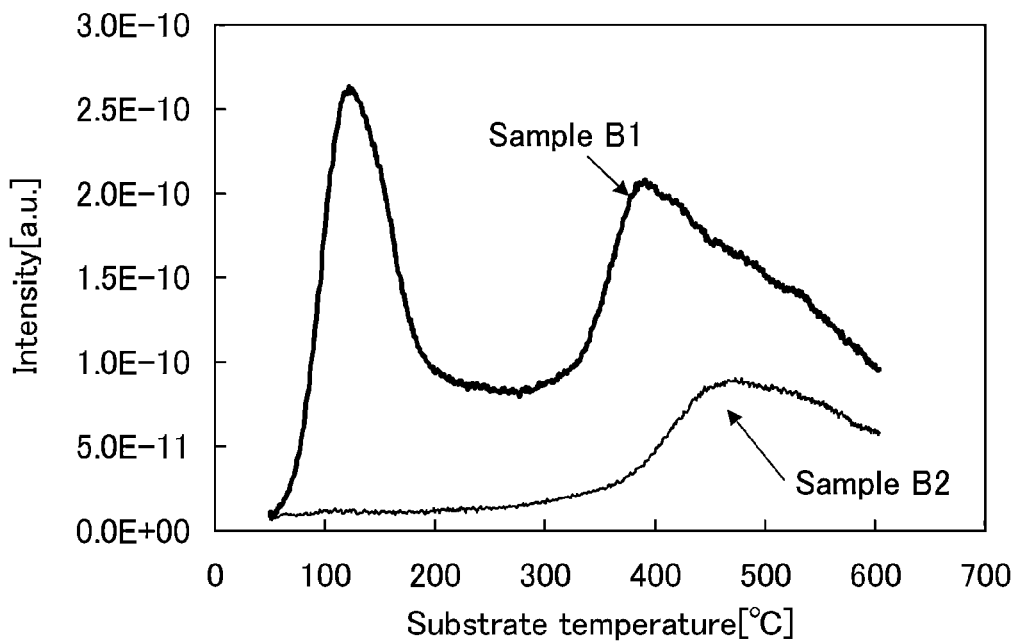

Next, Sample B1 and Sample B2 were subjected to TDS analysis. FIGS. 20A and 20B show the results of the TDS analysis. The TDS analysis in this example was conducted in a manner similar to that in Example 1. In each of FIGS. 20A and 20B, the horizontal axis indicates the substrate temperature of Sample B1 and Sample B2, and the vertical axis indicates the peak intensity of a TDS spectrum.

FIG. 20A indicates spectra representing the amounts of oxygen released from Sample B1 and Sample B2 to the outside. FIG. 20B indicates spectra representing the amounts of moisture released from Sample B1 and Sample B2 to the outside. As in Example 1, with the degrees of the peak intensities in FIGS. 20A and 20B, the amount of oxygen and the amount of moisture contained in the silicon oxynitride films in Sample B1 and Sample B2 can be estimated.

According to FIG. 20A, a peak of Sample B1 is higher than that of Sample B2. Here, the peak is derived from a release of oxygen to the outside. Thus, it is found that the amount of oxygen contained in the silicon oxynitride film in Sample B1 is larger than the amount of oxygen contained in the silicon oxynitride film in Sample B2.

From the above results, it is found that by using the method for forming the protective film 23 described in Embodiment 1 (the substrate temperature was higher than or equal to 180° C. and lower than or equal to 250° C.) for formation of a silicon oxynitride film, the silicon oxynitride film can contain oxygen in excess of the stoichiometric composition.

According to FIG. 20B, a peak of Sample B1 is higher than that of Sample B2. Here, the peak is derived from a release of moisture to the outside. Note that the peak around a substrate temperature of 100° C. is derived from a release of adsorbed moisture. This result indicates that Sample B1 has a sparse film compared with that in Sample B2, so that moisture easily adsorbs thereon. In other words, the amount of moisture contained in the silicon oxynitride film in Sample B1 is larger than that in Sample B2, which is probably caused by the facts that the flow rate of silane in forming the silicon oxynitride film in Sample B1 is higher than that of silane in forming the silicon oxynitride film in Sample B2 and that the temperature substrate of Sample B1 is lower than that of Sample B2.

EXAMPLE 3

In this example, the amount of defects generated in an oxide semiconductor film at the time when a silicon oxynitride film is formed over the oxide semiconductor film will be described. Specifically, the results of ESR measurement and the results of constant photocurrent method (CPM) conducted on samples in each of which a silicon oxynitride film is formed over an oxide semiconductor film are used for description.

First, the results of ESR measurement are described. Samples which were manufactured are described below. Each of the samples which were manufactured has a stacked structure in which a 100-nm-thick oxide semiconductor film is formed over a quartz substrate and a 400-nm-thick silicon oxynitride film is formed over the oxide semiconductor film.

An IGZO film which is a CAAC-OS film was formed over the quartz substrate. The IGZO film was formed in such a manner that a sputtering target where In:Ga:Zn=1:1:1 (atomic ratio) was used, argon and oxygen were supplied as a sputtering gas into a treatment chamber of a sputtering apparatus at a flow rate of 50 sccm for each, and film formation was performed at a DC power of 5 kW with the pressure in the treatment chamber adjusted to 0.6 Pa. Note that the IGZO film was formed at a substrate temperature of 170° C. After the IGZO film was formed, first heat treatment was performed in a nitrogen atmosphere, and then second heat treatment was performed in an atmosphere containing nitrogen and oxygen. The temperature of each of the first heat treatment and the second heat treatment was 350° C., and treatment time for each of the first heat treatment and the second heat treatment was 1 hour.

Next, a silicon oxynitride film was formed in the following manner: the quartz substrate over which the IGZO film was formed was placed in a treatment chamber of a plasma CVD apparatus; silane and dinitrogen monoxide which were a source gas were supplied at 160 sccm and 4000 sccm, respectively, to the treatment chamber; the pressure of the treatment chamber was adjusted to 120 Pa; and a power was supplied with a high-frequency power of 27.12 MHz. Note that the plasma CVD apparatus indicates a parallel plate plasma CVD apparatus with an electrode area of 6000 cm$^2$. There were three conditions of the supplied power (power density). The sample formed with a power of 1000 W (0.17 W/cm$^2$) is Sample C1, the sample formed with a power of 1500 W (0.25 W/cm$^2$) is Sample C2, and the sample formed with a power of 2000 W (0.33 W/cm$^2$) is Sample C3.

Then, ESR measurement was performed on Sample C1 to Sample C3. The conditions of the ESR measurement are as follows. The measurement temperature was room temperature (25° C.), a high-frequency power (power of microwaves) of 9.2 GHz was 20 mW, and the direction of a magnetic field was parallel to a surface of each of the silicon oxynitride films in the samples. The lower limit of the detection of the number of spins per unit area of a signal at g=1.93, which is due to oxygen vacancies in the IGZO film, was $1.0 \times 10^{12}$ spins/cm$^2$.

Figure 21:
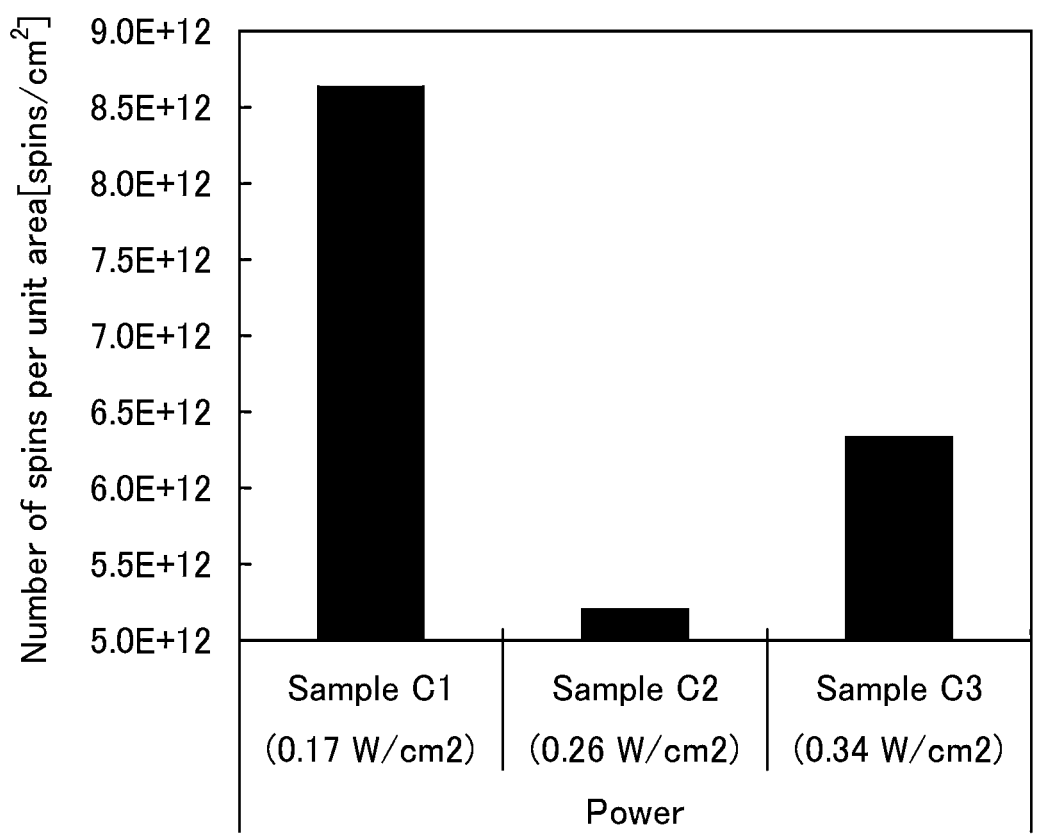
FIG. 21 is a graph showing a relation between power and the number of spins per unit area of manufactured samples.

Results of the ESR measurement are shown in FIG. 21. FIG. 21 shows a relation between power supplied to form the silicon oxynitride film and the number of spins per unit area of a signal at g=1.93 in the oxide semiconductor film. As the number of spins per unit area is small, the amount of oxygen vacancies in the oxide semiconductor film is small.

According to FIG. 21, the number of spins per unit area in Sample C2 and that in Sample C3 are smaller than that in Sample C1. Thus, with use of the method for forming the protective film 23 described in Embodiment 1 for formation of a silicon oxynitride film over the oxide semiconductor film, oxygen vacancies in the oxide semiconductor film, which are generated due to formation of the silicon oxynitride film, can be further reduced.

In addition, samples were manufactured. In each of the samples, a silicon oxynitride was formed in such a manner that the power for forming silicon oxynitride was constant at 1500 W (0.25 W/cm$^2$) and the flow rate of silane was 120 sccm or 200 sccm. The sample formed with a flow rate of silane of 120 sccm is Sample C4, and the sample formed with a flow rate of silane of 200 sccm is Sample C5.

Figure 22:
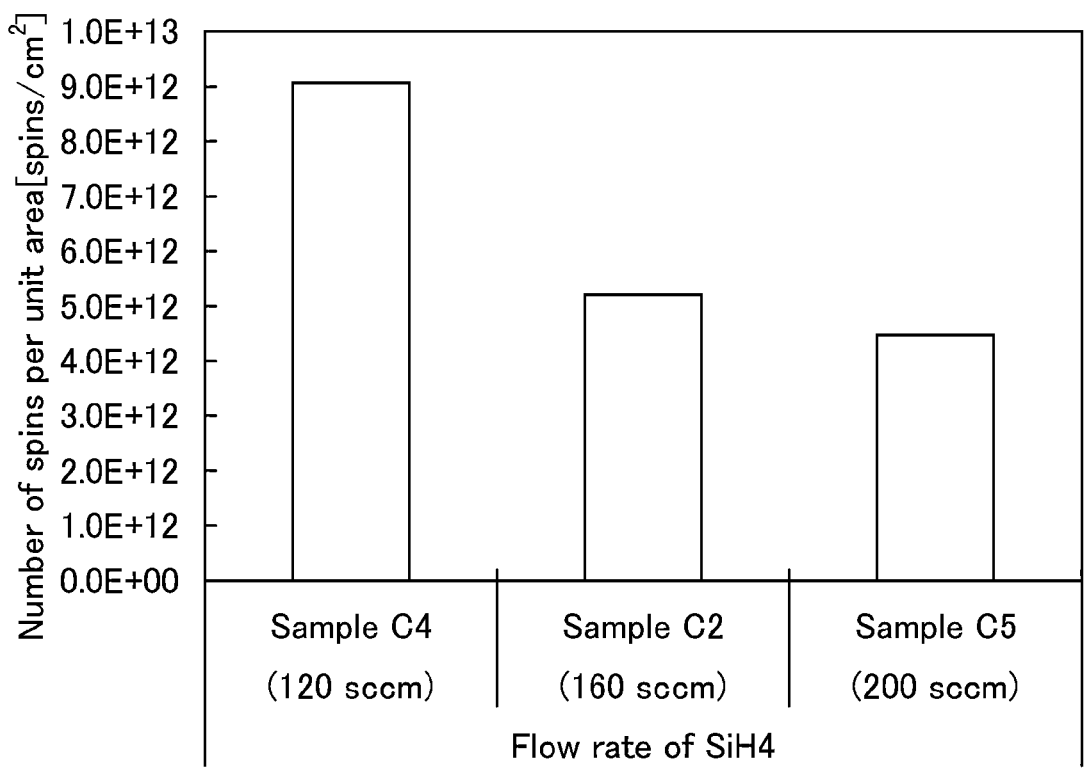
FIG. 22 is a graph showing a relation between the flow rate of silane and the number of spins per unit area of manufactured samples.

ESR measurement was performed on Sample C2, Sample C4 to Sample C5 under the conditions similar to the above. The results are shown in FIG. 22. FIG. 22 shows a relation between the flow rate of silane supplied to form the silicon oxynitride film and the number of spins per unit area of a signal at g=1.93 in the oxide semiconductor film.

According to FIG. 22, as the flow rate of silane in formation of the silicon oxynitride film is increased, the number of spins per unit area tends to be decreased. Thus, by forming the silicon oxynitride film over the oxide semiconductor film with a high flow rate of silane, oxygen vacancies in the oxide semiconductor film, which are generated due to formation of the silicon oxynitride film, can be further reduced.

Next, heat treatment was performed on Sample C2, Sample C4, and Sample C5 at 300° C., and then ESR measurement was performed thereon. From the results of the measurement, it is found that in each of Sample C2, Sample C4, and Sample C5, the number of spins per unit area of a signal at g=1.93, which is due to oxygen vacancies in the IGZO film, was lower than a lower limit of the detection ($1.0 \times 10^{12}$ spins/cm$^2$).

Accordingly, it is found that oxygen vacancies in the oxide semiconductor film can be reduced when heat treatment is performed after the silicon oxynitride film is formed over the oxide semiconductor film with use of the method for forming the protective film 23 described in Embodiment 1.

Next, CPM measurement results will be described. Samples which were manufactured are described below.

First, an oxide semiconductor film was formed over a substrate which was a glass substrate.

As the oxide semiconductor film, an IGZO film which was a CAAC-OS film was formed by a sputtering method, a mask is formed over the IGZO film by a photolithography step, and part of the IGZO film was etched with use of the mask.

Then, the etched IGZO film was subjected to heat treatment, so that the oxide semiconductor film was formed. Note that in this example, a 100-nm-thick IGZO film was formed.

The IGZO film was formed in such a manner that a sputtering target where In:Ga:Zn=1:1:1 (atomic ratio) was used, argon and oxygen were supplied as a sputtering gas into a treatment chamber of a sputtering apparatus at a flow rate of 50 sccm for each, and film formation was performed at a DC power of 5 kW with the pressure in the treatment chamber adjusted to 0.7 Pa. Note that the IGZO film was formed at a substrate temperature of 170° C.

The heat treatment performed on the etched IGZO film includes first heat treatment in a nitrogen atmosphere and second heat treatment in an atmosphere of nitrogen and oxygen, which follows the first heat treatment. The temperature of each of the first heat treatment and the second heat treatment was 450° C., and treatment time for each of the first heat treatment and the second heat treatment was 1 hour.

Next, a pair of electrodes was formed to be in contact with the oxide semiconductor film.

A conductive film was formed over the oxide semiconductor film, a mask was formed over the conductive film by a photolithography step, and part of the conductive film was etched with use of the mask, so that the pair of electrodes was formed. Note that the conductive film had such a structure that a 400-nm-thick aluminum film was formed over a 100-nm-thick titanium film and a 100-nm-thick titanium film was formed over the aluminum film.

Next, heat treatment was performed. The heat treatment was performed at 300° C. in an atmosphere of oxygen and nitrogen for 1 hour.

Then, an insulating film was formed over the oxide semiconductor film and the pair of electrodes.

As the insulating film, a silicon oxynitride film was formed by the method for forming the protective film 23 described in Embodiment 1. Specifically, a 400-nm-thick silicon oxynitride film was formed in a following manner: silane and dinitrogen monoxide were supplied at 160 sccm and 4000 sccm, respectively, were supplied to a treatment chamber of a plasma CVD apparatus; the pressure of the treatment chamber was adjusted to 200 Pa; and a power of 1500 W (0.25 W/cm$^2$) was supplied with a high-frequency power of 27.12 MHz. Further, the substrate at which the insulating film was formed was 220° C.

After the insulating film is formed, the structure obtained through the steps up to here was subjected to heat treatment. The heat treatment was performed at 300° C. in an atmosphere of oxygen and nitrogen for 1 hour.

The sample obtained through the above steps is Sample C6.

Here, steps for manufacturing a sample which is a comparative example are described. The sample of a comparative example (hereinafter, referred to as Sample C7) is a transistor in which an insulating film is formed by the following manner but the other steps are the same as those of Sample C6. As the insulating film in Sample C7, a 400-nm-thick silicon oxynitride film was formed under the conditions where silane and dinitrogen monoxide were supplied at 30 sccm and 4000 sccm, respectively, to a treatment chamber of a plasma CVD apparatus; the pressure of the treatment chamber was adjusted to 200 Pa; and a power of 150 W (0.025 W/cm$^2$) was supplied with a high-frequency power of 27.12 MHz. Further, the substrate at which the insulating film was formed was 220° C.

Next, CPM measurement was performed on Sample C6 and Sample C7. CPM measurement is carried out in such a manner that the amount of light with which a surface of a sample is irradiated is adjusted in the state where voltage is applied between a pair of electrodes included in the sample so that a photocurrent value is kept constant, and an absorption coefficient is calculated from the amount of the irradiation light. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be estimated.

Figure 23:
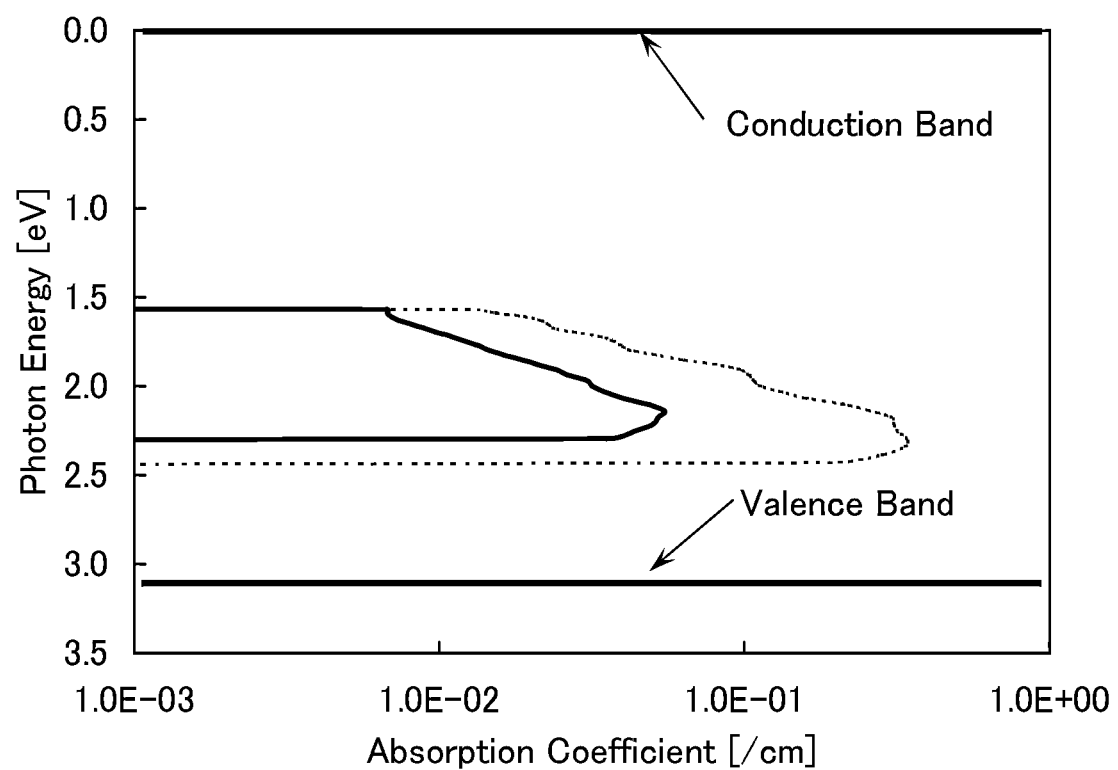
FIG. 23 is a graph showing results of CPM measurement of manufactured samples.

An absorption coefficient shown in FIG. 23 was obtained by removing an absorption coefficient due to the band tail from an absorption coefficient obtained by CPM measurement of Sample C6 and Sample C7. That is, an absorption coefficient due to defects is shown in FIG. 23. In FIG. 23, the horizontal axis indicates the absorption coefficient, and the vertical axis indicates the photon energy. On the vertical axis in FIG. 23, the bottom of the conduction band of the oxide semiconductor film is set to 0 eV, and the top of the valence band is set to 3.15 eV. Each curve in FIG. 23 represents a relation between the absorption coefficient and photon energy, which corresponds to defect levels. The curve indicated by a solid line corresponds to the defect level of Sample C6, and the curve indicated by a dashed line corresponds to the defect level of Sample C7. The absorption coefficient due to defect level of Sample C6 is $1.00 \times 10^{-2}$/cm, and the absorption coefficient due to defect level of Sample C7 is $6.52 \times 10^{-2}$/cm.

According to FIG. 23, the defect levels of Sample C6 are lower than those of Sample C7.

The above results indicate that oxygen vacancies in the oxide semiconductor film, which are generated due to formation of the silicon oxynitride film, can be further reduced when the flow rate of silane supplied to form the silicon oxynitride film over the oxide semiconductor film is increased and the supplied power is increased.

According to the above, with use of the method for forming the protective film 23 described in Embodiment 1 for formation of a silicon oxynitride film as a protective film over a transistor including an oxide semiconductor film, a transistor with excellent electric characteristics can be provided.

EXAMPLE 4

In this example, electric characteristics of a semiconductor device which is one embodiment of the present invention will be described. Specifically, measurement results of current-voltage characteristics of a transistor which is one embodiment of the present invention will be described.

First, steps of forming a transistor are described. In this example, the steps are described with reference to FIGS. 4A to 4E.

First, a glass substrate was used as the substrate 11, and the gate electrode 15 was formed over the substrate 11.

A 100-nm-thick tungsten film was formed by a sputtering method. A mask was formed over the tungsten film by a photolithography step, and part of the tungsten film was etched with use of the mask, so that the gate electrode 15 was formed.

Next, the gate insulating film 33 including the insulating film 31 and the insulating film 32 was formed over the gate electrode 15.

As the insulating film 31, a 50-nm-thick silicon nitride film was formed, and as the insulating film 32, a 200-nm-thick silicon oxynitride film was formed. The silicon nitride film was formed in the following manner: silane and nitrogen were supplied at 50 sccm and 5000 sccm, respectively, into a treatment chamber of a plasma CVD apparatus; the pressure of the treatment chamber was adjusted to 60 Pa; and a power of 150 W was supplied with a high-frequency power supply of 27.12 MHz. The silicon oxynitride film was formed in the following manner: silane and dinitrogen monoxide were supplied at 20 sccm and 3000 sccm, respectively, into the treatment chamber of the plasma CVD apparatus; the pressure of the treatment chamber was adjusted to 40 Pa; and a power of 100 W was supplied with a high-frequency power supply of 27.12 MHz. Note that each of the silicon nitride film and the silicon oxynitride film was formed at a substrate temperature of 350° C.

As the structure obtained through the steps up to here, FIG. 4A can be referred to. Note that although the base insulating film 13 is illustrated in FIG. 4A, the base insulating film 13 was not formed in this example.

Next, the oxide semiconductor film 19 was formed to overlap with the gate electrode 15 with the gate insulating film 33 interposed therebetween.

Here, as the oxide semiconductor film 19, an IGZO film which is a CAAC-OS film was formed by a sputtering method.

The IGZO film was formed in such a manner that a sputtering target where In:Ga:Zn=1:1:1 (atomic ratio) was used, argon (50 sccm) and oxygen (50 sccm) were supplied as a sputtering gas into a treatment chamber of a sputtering apparatus, the pressure in the treatment chamber was adjusted to 0.6 Pa, and a direct-current power of 5 kW was supplied. Note that the IGZO film was formed at a substrate temperature of 170° C.

Next, a mask was formed over the IGZO film by a photolithography step, and part of the IGZO film was etched with use of the mask. Then, the etched IGZO film was subjected to heat treatment, so that the oxide semiconductor film 19 was formed. Note that the IGZO film formed in this example has a thickness of 35 nm.

As the heat treatment performed on the etched IGZO film, first heat treatment was performed in a nitrogen atmosphere, and second heat treatment was performed in an atmosphere of nitrogen and oxygen after the first heat treatment. The temperature of each of the first heat treatment and the second heat treatment was 350° C., and treatment time for each of the first heat treatment and the second heat treatment was 1 hour.

The structure obtained through the steps up to here is illustrated in FIG. 4B.

Next, the pair of electrodes 21 in contact with the oxide semiconductor film 19 was formed.

A conductive film was formed over the gate insulating film 17 and the oxide semiconductor film 19. A mask was formed over the conductive film by a photolithography step, and part of the conductive film was etched with use of the mask, so that the pair of electrodes 21 was formed. Note that as the conductive film, a 400-nm-thick aluminum film was formed over a 50-nm-thick tungsten film, and a 100-nm-thick titanium film was formed over the aluminum film. After that, the mask is removed.

As the structure obtained through the steps up to here, FIG. 4C can be referred to. Note that in this example, treatment in which exposure to plasma generated in an oxygen atmosphere as illustrated in FIG. 4C was not performed.

Next, heat treatment was performed on an object obtained through the steps up to here. The heat treatment was performed at 300° C. in an atmosphere containing oxygen and nitrogen for 1 hour.

Next, the insulating film 34 was formed over the gate insulating film 17, the oxide semiconductor film 19, and the pair of electrodes 21. Then, the insulating film 34 was subjected to oxygen plasma treatment, so that the oxygen 35 was added to the insulating film 34.

In this example, as the insulating film 34, a 30-nm-thick silicon oxynitride film was formed in the following manner: silane and dinitrogen monoxide were supplied at 20 sccm and 3000 sccm, respectively, into a treatment chamber of a plasma CVD apparatus; the pressure of the treatment chamber was adjusted to 200 Pa; and a power of 100 W was supplied with a high-frequency power supply of 27.12 MHz. The substrate temperature at which the insulating film 34 was formed was 350° C.

Further, oxygen plasma was generated under such conditions that oxygen was supplied at 250 sccm to the treatment chamber of the plasma treatment apparatus, the pressure of the treatment chamber was adjusted to 15 Pa, the bias voltage was set to 0 W, and a power of 4500 W was supplied to a source electrode. The insulating film 34 was exposed to the oxygen plasma for 600 seconds.

As the structure obtained through the steps up to here, FIG. 4D can be referred to.

Next, the insulating film 36 was formed over the insulating film 34 to which the oxygen 35 had been added.

As the insulating film 36, a silicon oxynitride film was formed by the method for forming the protective film 23 described in Embodiment 1. Specifically, a 370-nm-thick silicon oxynitride film was formed in a following manner: silane and dinitrogen monoxide were supplied at 160 sccm and 4000 sccm, respectively, into a treatment chamber of a plasma CVD apparatus; the pressure of the treatment chamber was adjusted to 200 Pa; and a power of 1500 W (0.25 W/cm$^2$) was supplied with a high-frequency power supply of 27.12 MHz. The substrate temperature at which the insulating film 36 was formed was 220° C.

After the insulating film 36 was formed, the structure obtained through steps up to here was subjected to heat treatment. The heat treatment was performed at 350° C. in an atmosphere containing oxygen and nitrogen for 1 hour.

Through the above steps, a transistor which is one embodiment of the present invention was formed. Note that the transistor formed through the above steps is Sample D1.

Here, steps of forming a transistor as a comparative example are described. The transistor which is a comparative example (hereinafter, referred to as Sample D2) is a transistor in which the insulating film 36 is formed by a step described below, and the other steps are the same as those of forming Sample D1. As the insulating film 36 in Sample D2, a 370-nm-thick silicon oxynitride film was formed in the following manner: silane and dinitrogen monoxide were supplied at 30 sccm and 4000 sccm, respectively, into a treatment chamber of a plasma CVD apparatus; the pressure of the treatment chamber was adjusted to 200 Pa; and a power of 150 W (0.025 W/cm$^2$) was supplied with a high-frequency power supply of 27.12 MHz. The substrate temperature at which the insulating film 36 was formed was 350° C.

Figure 24A:
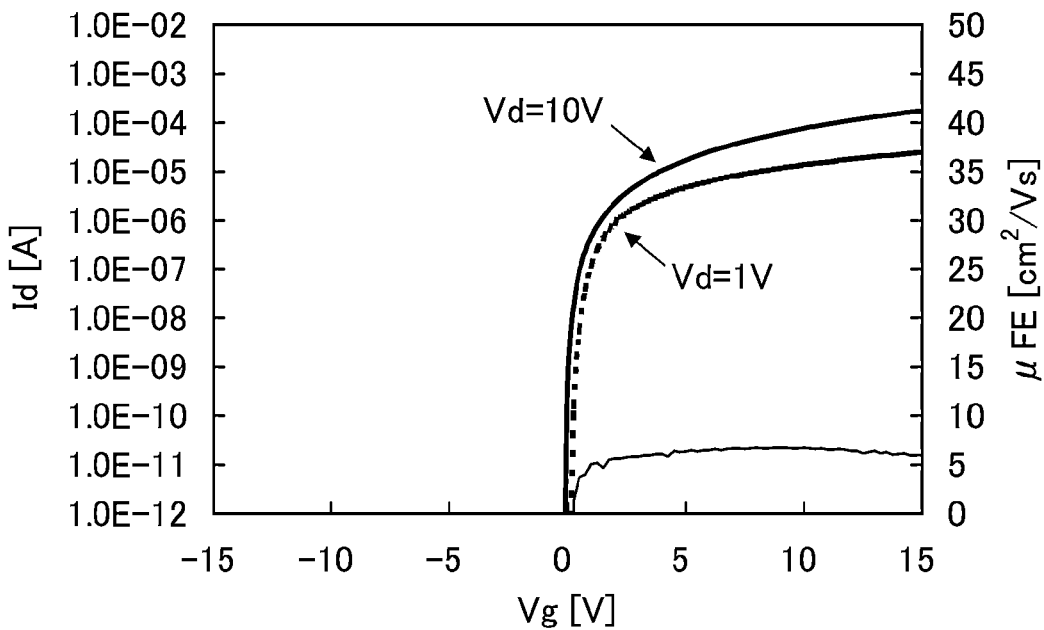
FIGS. 24A and 24B show initial characteristics of current-voltage characteristics of manufactured samples.
Figure 24B:
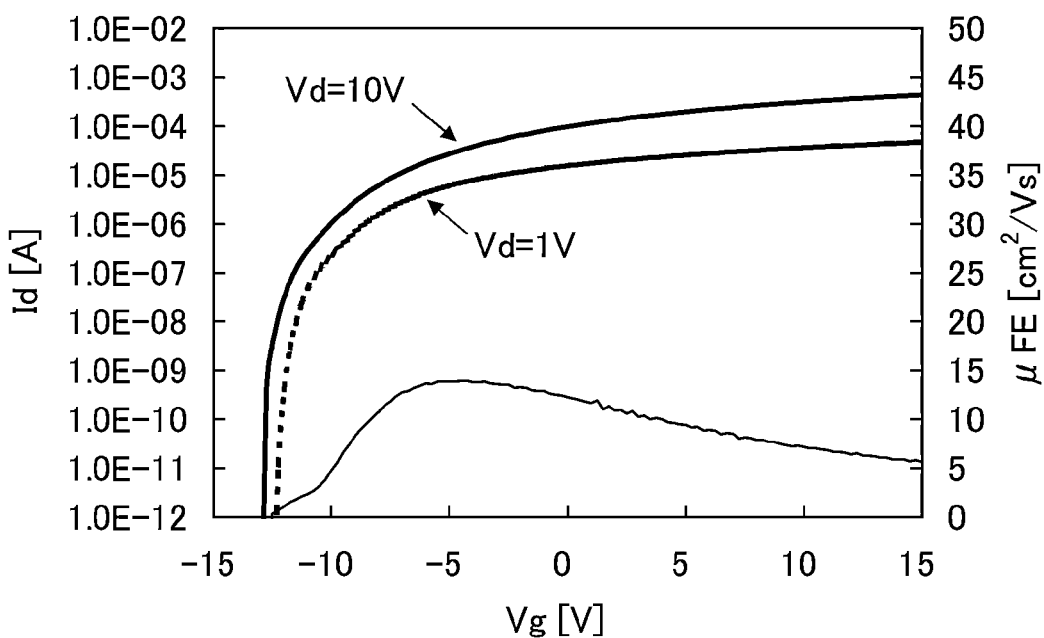

Then, initial characteristics of current-voltage characteristics of Sample D1 and Sample D2 were measured. FIGS. 24A and 24B show the results thereof. FIG. 24A shows initial characteristics of current-voltage characteristics of Sample D1, and FIG. 24B shows initial characteristics of current-voltage characteristics of Sample D2. In each of FIGS. 24A and 24B, the horizontal axis indicates the gate voltage (Vg), the left vertical axis indicates the drain current (Id) flowing between the pair of electrodes 21, and the right vertical axis indicates the field effect mobility (μFE). Further, the bold solid line indicates the initial characteristics of current-voltage characteristics at a drain voltage (Vd) of 10 V, the thick dashed line indicates the initial characteristics of current-voltage characteristics at a drain voltage of 1 V, and the thin solid line indicates the field effect mobility with respect to the gate voltage at a drain voltage of 10 V. Note that the field effect mobility was obtained by operation of each sample in a saturation region.

According to FIG. 24B, the threshold voltage of Sample D2 largely shifts in the negative direction, and thus Sample D2 has normally-on characteristics. On the other hand, according to FIG. 24A, the threshold voltage of Sample D1 is around 0 V (Vg); thus, normally-off characteristics found in Sample D2 are overcome.

Further, in the case of Sample D2, the rising voltage of on-state current when the drain voltage is 1 V is different from that when the drain voltage is 10 V. On the other hand, in the case of Sample D1, the rising voltage of on-state current when the drain voltage is 1 V is substantially the same as that when the drain voltage is 10 V.

As described above, Sample D1 formed by the method for forming the protective film 23 described in Embodiment 1 can be confirmed to have excellent characteristics. Therefore, according to one embodiment of the present invention, a transistor having excellent electric characteristics can be provided.

EXAMPLE 5

In this example, a relation between the electric characteristics of a semiconductor device which is one embodiment of the present invention and the defect density of an insulating film which is one embodiment of the present invention will be described. Specifically, description will be made on measurement results of initial characteristics of current-voltage characteristics of a transistor which is one embodiment of the present invention, the amount of hysteresis obtained by C-V measurement of an element with a structure similar to that of the transistor, and the defect density of a silicon oxynitride film that is an insulating film of one embodiment of the present invention.

First, steps of forming the transistor are described. In this example, the steps are described with reference to FIGS. 2A to 2D.

First, a glass substrate was used as the substrate 11, and the gate electrode 15 was formed over the substrate 11.

A 100-nm-thick tungsten film was formed by a sputtering method, a mask was formed over the tungsten film by a photolithography step, and part of the tungsten film was etched with use of the mask, so that the gate electrode 15 was formed.

Next, the gate insulating film 17 was formed over the gate electrode 15.

As the gate insulating film 17, a stacked layer including a 50-nm-thick silicon nitride film and a 200-nm-thick silicon oxynitride film was formed. The silicon nitride film was formed in the following manner: silane and nitrogen were supplied at 50 sccm and 5000 sccm, respectively, to a treatment chamber of a plasma CVD apparatus; the pressure in the treatment chamber was adjusted to 60 Pa; and a power of 150 W was supplied with a high-frequency power supply of 27.12 MHz.

As the silicon oxynitride film, a 10-nm-thick silicon oxynitride film was formed by a plasma CVD method using a microwave. Note that conditions of the plasma CVD method using a microwave are as follows. In order to stabilize plasma generated in a treatment chamber of a microwave plasma CVD apparatus, first, silane, dinitrogen monoxide, and argon were introduced at 10 sccm, 300 sccm, and 2500 sccm, respectively, to the treatment chamber, the pressure in the treatment chamber was adjusted to 20 Pa, the substrate temperature was kept at 325° C., and a power of 5 kW was supplied with a microwave power supply of 2.45 GHz. After the generated plasma was stabilized, the flow rates of silane, dinitrogen monoxide, and argon introduced into the treatment chamber were increased to 30 sccm, 1500 sccm, and 2500 sccm, respectively, so that the silicon oxynitride film was formed.

Next, the oxide semiconductor film 19 was formed to overlap with the gate electrode 15 with the gate insulating film 17 interposed therebetween.

Over the gate insulating film 17, an IGZO film which was a CAAC-OS film was formed by a sputtering method.

The IGZO film was formed in such a manner that a sputtering target where In:Ga:Zn=1:1:1 (atomic ratio) was used, argon and oxygen were supplied as a sputtering gas into a treatment chamber of a sputtering apparatus at a flow rate of 50 sccm for each, and film formation was performed at a DC power of 5 kW with the pressure in the treatment chamber adjusted to 0.6 Pa. Note that the IGZO film was formed at a substrate temperature of 170° C.

As the structure obtained through the steps up to here, FIG. 2A can be referred to. Note that although the base insulating film 13 is illustrated in FIG. 2A, the base insulating film 13 was not formed in this example.

Next, a mask was formed over the IGZO film by a photolithography step, and part of the IGZO film was etched with use of the mask. Then, the etched IGZO film was subjected to heat treatment, so that the oxide semiconductor film 19 was formed. Note that in this example, a 35-nm-thick IGZO film was formed.

The heat treatment performed on the etched IGZO film includes first heat treatment performed in a nitrogen atmosphere and second heat treatment performed in an atmosphere of nitrogen and oxygen, which follows the first heat treatment. The temperature of each of the first heat treatment and the second heat treatment was 450° C., and treatment time for each of the first heat treatment and the second heat treatment was 1 hour.

As the structure obtained through the steps up to here, FIG. 2B can be referred to.

Next, the pair of electrodes 21 in contact with the oxide semiconductor film 19 was formed.

A conductive film was formed over the gate insulating film 17 and the oxide semiconductor film 19, a mask was formed over the conductive film by a photolithography step, and part of the conductive film was etched with use of the mask, so that the pair of electrodes 21 was formed. Note that the conductive film had a stacked structure in which a 400-nm-thick aluminum film was formed over the 100-nm-thick titanium film and a 100-nm-thick titanium film was formed over the aluminum film.

As the structure obtained through the steps up to here, FIG. 2C can be referred to.

Next, heat treatment was performed on an object obtained through the steps up to here. The heat treatment was performed at 300° C. in an atmosphere of oxygen and nitrogen for 1 hour.

Next, the protective film 23 was formed over the gate insulating film 17, the oxide semiconductor film 19, and the pair of electrodes 21.

In this example, as the protective film 23, a 370-nm-thick silicon oxynitride film was formed in the following manner: silane and dinitrogen monoxide were supplied at 200 sccm and 3000 sccm, respectively, to a treatment chamber of a plasma CVD apparatus; the pressure in the treatment chamber was adjusted to 200 Pa; and a power of 1500 W was supplied with a high-frequency power supply of 27.12 MHz. The substrate temperature at which the protective film 23 was formed was 220° C.

As the structure obtained through the steps up to here, FIG. 2D can be referred to.

After the protective film 23 was formed, the structure obtained through steps up to here was subjected to heat treatment. The heat treatment was performed at 300° C. in an atmosphere of oxygen and nitrogen for 1 hour.

Next, a planarization film (not illustrated) was formed over the protective film 23. Here, the protective film 23 was coated with a composition, and exposure and development were performed, so that a planarization film having an opening through which the pair of electrodes is partly exposed was formed. Note that as the planarization film, a 1.5-μm-thick acrylic resin was formed. Then, heat treatment was performed. The heat treatment was performed at a temperature of 250° C. in a nitrogen atmosphere for 1 hour.

Next, a conductive film connected to part of the pair of electrodes is formed (not illustrated). Here, a 100-nm-thick ITO film containing silicon oxide was formed as the conductive film by a sputtering method. Then, heat treatment was performed. The heat treatment was performed at a temperature of 250° C. in a nitrogen atmosphere for 1 hour.

Through the above-described steps, the transistor was formed. Note that the transistor formed through the above steps is Sample E1.

Other transistors were formed. In each of the transistors, the protective film 23 was formed using silane whose flow rate was different from that in Sample E1.

A transistor in which the protective film 23 was formed using silane with a flow rate of 160 sccm is Sample E2.

A transistor in which the protective film 23 was formed using silane with a flow rate of 120 sccm is Sample E3.

Another transistor was formed. In the transistor, the protective film 23 was formed under such conditions that the flow rate of silane and the supplied power were different from those in Sample E1.

A transistor in which the protective film 23 was formed using silane with a flow rate of 30 sccm and a power of 150 W is Sample E4.

Note that in each of Sample E2 to Sample E4, the base insulating film 13 illustrated in FIG. 2A was formed. Further, the gate insulating film 17 was formed to have a single layer of a silicon oxynitride film without a silicon nitride film.

Then, initial characteristics of current-voltage characteristics of Sample E1 to Sample E4 were measured. FIGS. 25A to 25D show the results thereof. FIG. 25A shows initial characteristics of current-voltage characteristics of Sample E1, FIG. 25B shows initial characteristics of current-voltage characteristics of Sample E2, FIG. 25C shows initial characteristics of current-voltage characteristics of Sample E3, and FIG. 25D shows initial characteristics of current-voltage characteristics of Sample E4. In each of FIGS. 25A to 25D, the horizontal axis indicates the gate voltage (Vg), the left vertical axis indicates the drain current (Id) flowing between the pair of electrodes 21, and the right vertical axis indicates the field effect mobility (μFE). Further, the solid line indicates the initial characteristics of current-voltage characteristics at a drain voltage (Vd) of 1 V or 10V, and the dashed line indicates the field effect mobility with respect to the gate voltage at a drain voltage of 10 V. Note that the field effect mobility was obtained by operation of each sample in a saturation region.

As the initial characteristics of current-voltage characteristics shown in each of FIGS. 25B and 25C, the rising voltage of on-state current when the drain voltage is 1 V and the rising voltage of on-state current when the drain voltage is 10 V are different from each other. As the initial characteristics of current-voltage characteristics shown in FIG. 25D, the threshold voltage shifts in the negative direction and varies. On the other hand, as the initial characteristics of current-voltage characteristics shown in FIG. 25A, the rising voltage of on-state current when the drain voltage is 1 V is substantially the same as that when the drain voltage is 10 V. In addition, the threshold voltage is around 0 V (Vg) and does not vary.

Next, film characteristics of the protective films 23 formed under the conditions of Sample E1 to Sample E4 are described. In this example, metal oxide semiconductor (MOS) elements were formed, and capacitance-voltage (C-V) measurement was conducted thereon. The results are shown in FIGS. 27A to 27D.

First, steps of manufacturing MOS elements for C-V measurement are described. In this example, the steps are described with reference to FIG. 26.

Figure 26:
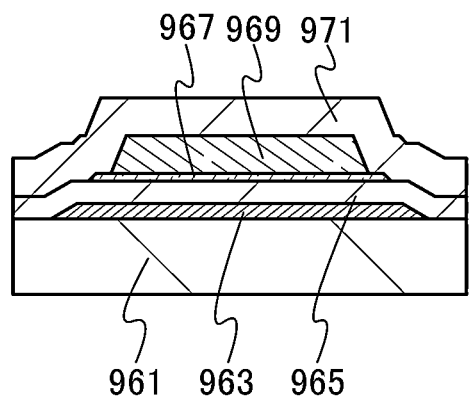
FIG. 26 illustrates a MOS element used for C-V measurement.

As illustrated in FIG. 26, a first electrode 963 was formed over a substrate 961. A glass substrate was used as the substrate 961. The first electrode 963 was formed under the same conditions as the gate electrode 15 formed in each of Sample E1 to Sample E4.

An insulating film 965 was formed over the substrate 961 and the first electrode 963. The insulating film 965 was formed under the same conditions as the gate insulating film 17 formed in each of Sample E1 to Sample E4.

An oxide semiconductor film 967 was formed over the insulating film 965. The oxide semiconductor film 967 was formed under the same conditions as the oxide semiconductor film 19 formed in each of Sample E1 to Sample E4.

A second electrode 969 was formed over the oxide semiconductor film 967. The second electrode 969 was formed under the same conditions as the pair of electrodes 21 formed in each of Sample E1 to Sample E4.

An insulating film 971 was formed over the insulating film 965, the oxide semiconductor film 967, and the second electrode 969. The insulating film 971 was formed under the same conditions as the protective films 23 formed in each of Sample E1 to Sample E4.

Through the above steps, MOS elements for C-V measurement were formed. Note that the MOS element formed under the same conditions as Sample E1 is Sample E5, the MOS element formed under the same conditions as Sample E2 is Sample E6, the MOS element formed under the same conditions as Sample E3 is Sample E7, and the MOS element structure formed under the same conditions as Sample E4 is Sample E8.

FIGS. 27A to 27D respectively show the C-V measurement results of Sample E5 to Sample E8. Further, Table 1 shows the amount of hysteresis (ΔVfb) of each sample. The amount of hysteresis is an absolute value of a difference between a flat-band voltage Vfb1 when the voltage V of the first electrode 963 was swept from −10 V to 10 V and a flat-band voltage Vfb2 when the voltage V of the first electrode 963 was swept from 10 V to −10 V.

TABLE 1

|  | Sample E1 | Sample E2 | Sample E3 | Sample E4 |
|---|---|---|---|---|
| ΔVfb (V) | 1.17 | 2.86 | 6.93 | 0.2 |

Figure 27A:
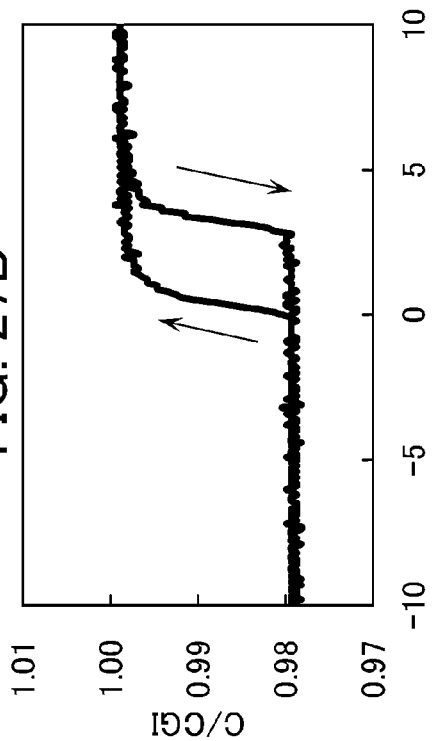
FIGS. 27A to 27D show results of C-V measurement of manufactured samples.
Figure 27B:
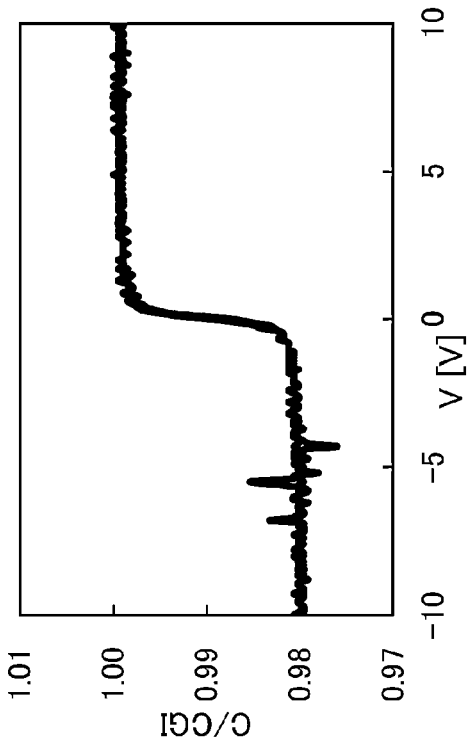
Figure 27C:
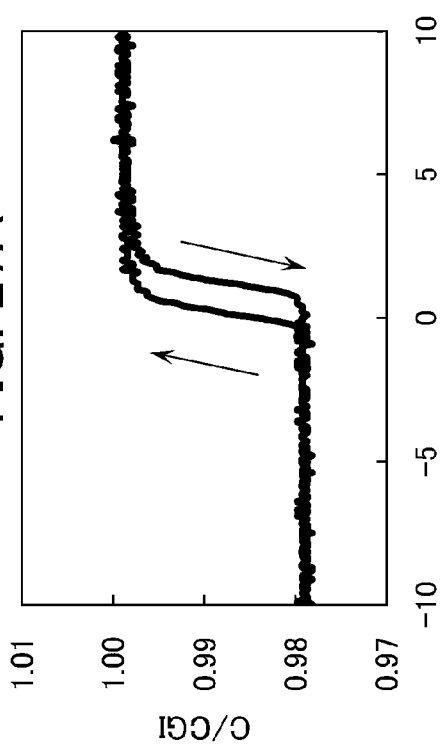
Figure 27D:
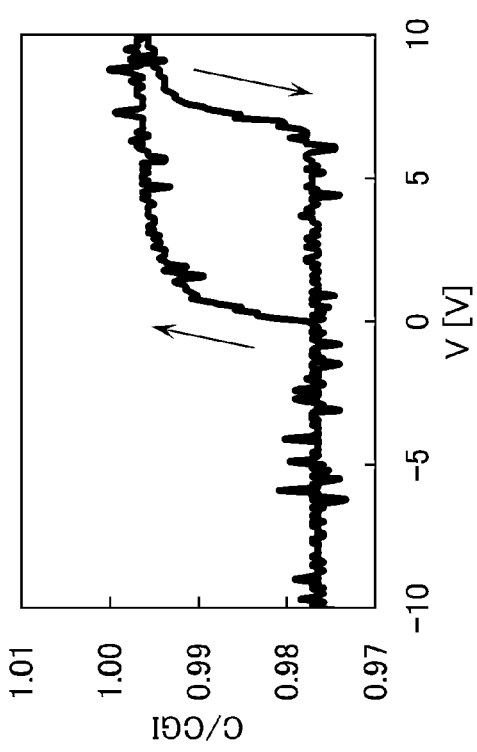
Figure 28A:
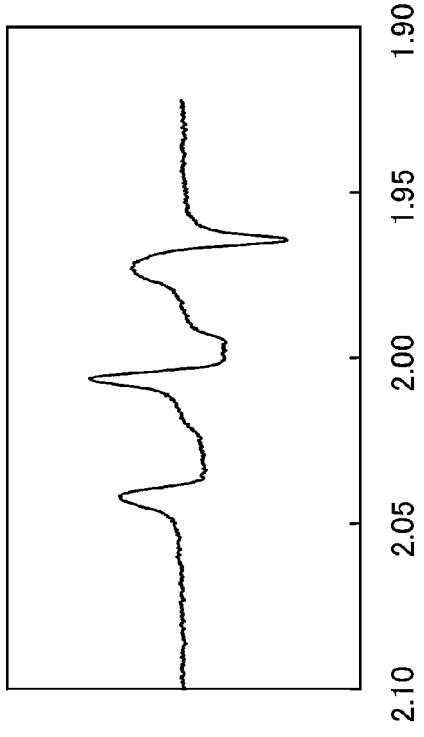
FIGS. 28A to 28D show results of ESR measurement of manufactured samples.
Figure 28B:
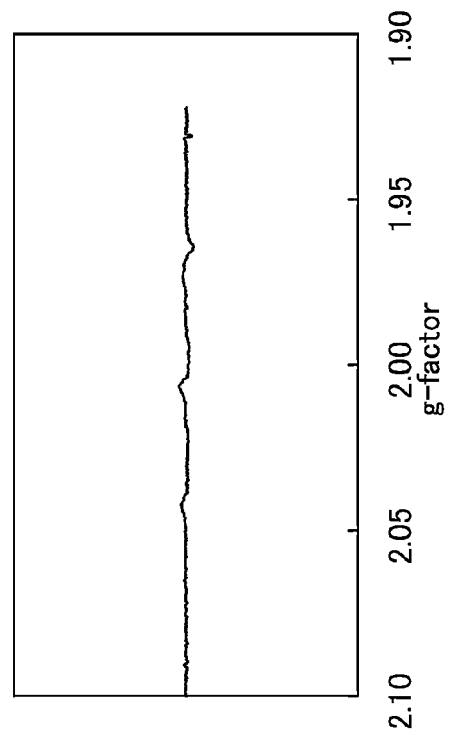
Figure 28C:
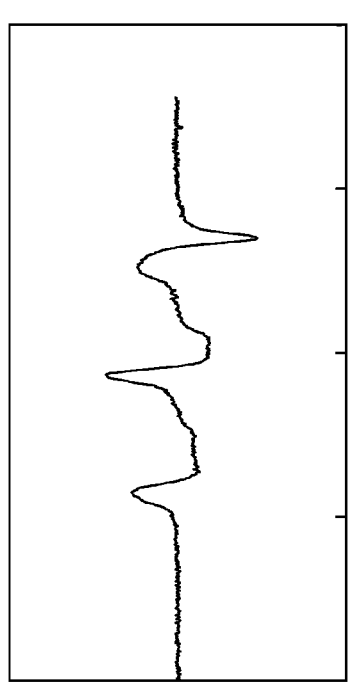
Figure 28D:
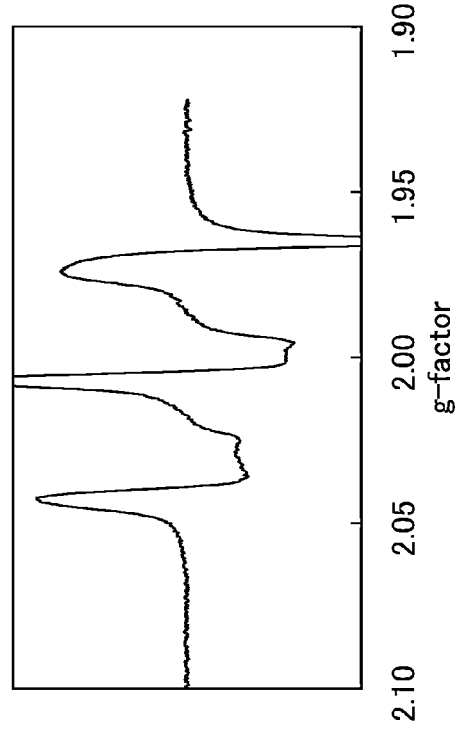

According to FIGS. 27A to 27C and Table 1, as the amount of hysteresis (ΔVfb) is increased, the difference in the rising voltage of the on-state current between the case of the drain voltage of 1 V and the case of 10 V is increased as shown in FIGS. 25A to 25C. Thus, as the initial characteristics of the current-voltage characteristics of the transistor, the rising voltage of the on-state current is related to the amount of hysteresis (ΔVfb).

Further, the defect densities of the protective films 23 formed in Sample E1 to Sample E4 are described with ESR measurement results thereof.

Samples which were manufactured are described below. First, a 400-nm-thick silicon oxynitride film was formed over a quartz substrate under the same conditions as the protective film 23 in each of Sample E1 to Sample E4. Then, heat treatment was performed at 300° C. in an atmosphere containing nitrogen and oxygen for 1 hour.

The sample in which the silicon oxynitride film was formed under the same conditions as the protective film 23 in Sample E1 is Sample E9. The sample in which the silicon oxynitride film was formed under the same conditions as the protective film 23 in Sample E2 is Sample E10. The sample in which the silicon oxynitride film was formed under the same conditions as the protective film 23 in Sample E3 is Sample E11. The sample in which the silicon oxynitride film was formed under the same conditions as the protective film 23 in Sample E4 is Sample E12.

Next, Sample E9 to Sample E12 were subjected to ESR measurement. The ESR measurement was performed under the following conditions. The measurement temperature was room temperature (25° C.), a high-frequency power (power of microwaves) of 9.2 GHz was 20 mW, and the direction of a magnetic field was parallel to a surface of each of the silicon oxynitride films in Sample E9 to Sample E12. The lower limit of the detection of the spin density of a signal at g=2.001 which is due to dangling bonds of silicon in the silicon oxynitride film is $1.0 \times 10^{15}$ spins/cm$^2$.

FIGS. 28A to 28D show the ESR measurement results. Specifically, FIGS. 28A to 28D show first derivative curves of the silicon oxynitride films in Sample E9 to Sample E12, respectively. According to FIGS. 27A to 27D and FIGS. 28A to 28D, as the ΔVfb becomes small, the signal intensity at a g-factor of 2.001 becomes small. Thus, when the insulating film 971 is a film with fewer defects, the amount of hysteresis in C-V measurement can be decreased, and excellent characteristics of the transistor can be obtained: the rising voltage of the on-state current when the drain voltage is 1 V is the substantially same as the rising voltage of the on-state current when the drain voltage is 10 V.

Next, MOS elements which have a structure similar to those of Sample E5 to Sample E8 were formed. However, in each of the MOS elements, the insulating film 971 was formed under different conditions from Sample E5 to Sample E8. In addition, samples for ESR measurement, which have a structure similar to those of Sample E9 to Sample E12 were formed. However, in each of the samples, the silicon oxynitride film was formed under different conditions from Sample E9 to Sample E12.

Next, C-V measurement was conducted on each MOS element. Further, ESR measurement was conducted on each sample for ESR measurement.

Figure 29:
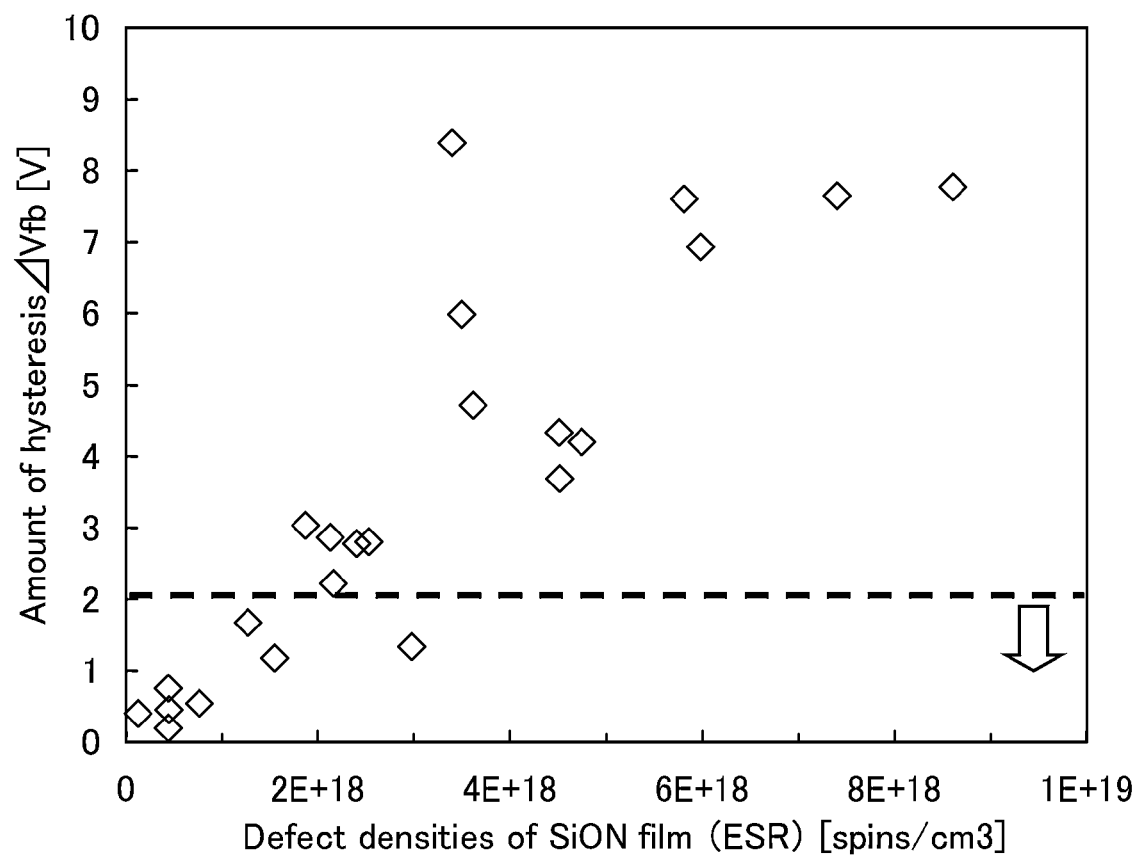
FIG. 29 shows a relation between the defect density and the amount of hysteresis of manufactured samples.

FIG. 29 shows a relation between the spin densities of signals at g=2.001 and the amount of hysteresis. Here, the spin densities were obtained from Sample E5 to Sample E8 and the MOS elements including the insulating film 971 formed under the different conditions from Sample E5 to Sample E8. The amount of hysteresis was obtained from Sample E9 to Sample E12 and the samples for ESR measurement which include the silicon oxynitride film formed under the different conditions from Sample E9 to Sample E12.

According to FIGS. 25A to 25D and FIGS. 27A to 27D, the preferable amount of hysteresis (ΔVfb) is 2.0 V or lower, in which case the rising voltage of the on-state current when the drain voltage is 1 V is the substantially same as that when the drain voltage is 10 V. Further, according to FIG. 29, the spin density of a signal at g=2.001, which satisfies the above amount of hysteresis, is lower than $1.5 \times 10^{18}$ spins/cm$^3$, preferably lower than or equal to $1.0 \times 10^{18}$ spins/cm$^3$.

Accordingly, an oxide insulating film in which the spin density of a signal at g=2.001, measured by electron spin resonance, is lower than $1.5 \times 10^{18}$ spins/cm$^3$, preferably lower than or equal to $1.0 \times 10^{18}$ spins/cm$^3$ is provided as a protective film over a transistor, in which case a transistor with excellent electric characteristics can be manufactured.

EXPLANATION OF REFERENCE

10: transistor, 11: substrate, 13: base insulating film, 15: gate electrode, 17: gate insulating film, 18: oxide semiconductor film, 19: oxide semiconductor film, 20: oxide semiconductor film, 21: electrode, 22: oxygen, 23: protective film, 30: transistor, 31: insulating film, 32: insulating film, 33: gate insulating film, 34: insulating film, 35: oxygen, 36: insulating film, 37: protective film, 100: transistor, 101: substrate, 103: base insulating film, 105: oxide semiconductor film, 107: electrode, 109: gate insulating film, 110: opening, 111: gate electrode, 113: protective film, 115: wiring, 120: transistor, 121: oxide semiconductor film, 123: region, 125: region, 127: region, 130: transistor, 131: oxide semiconductor film, 133: region, 135: region, 137: region, 139: electrode, 140: transistor, 141: sidewall insulating film, 150: transistor, 151: sidewall insulating film, 160: transistor, 161: oxide semiconductor film, 163: region, 165: region, 167: region, 169: region, 170: transistor, 171: gate electrode, 191: substrate, 210: transistor, 211: oxide semiconductor film, 213: region, 215: region, 17: protective film, 219: wiring, 220: transistor, 221: sidewall insulating film, 223: gate insulating film, 225: electrode, 230: transistor, 231: gate electrode, 233: insulating film, 701: substrate, 702: STI, 704$a$: transistor, 704$b$: transistor, 704$c$; transistor, 705: impurity region, 706: gate insulating film, 707: gate electrode, 708: gate electrode, 709: insulating film, 710: sidewall insulating film, 711: insulating film, 712: insulating film, 713: insulating film, 714$a$: contact plug, 714$b$: contact plug, 715: insulating film, 716: insulating film, 717: barrier film, 718: wiring, 719: barrier film, 720: insulating film, 721: insulating film, 722: barrier film, 723: wiring, 724: barrier film, 725$a$: insulating film, 725$b$: insulating film, 726: gate insulating film, 727: insulating film, 728: insulating film, 729: insulating film, 730$a$: contact plug, 730$b$: contact plug, 731: insulating film, 732: insulating film, 733: barrier film, 734$a$: wiring, 734$b$: wiring, 735: barrier film, 740: protective film, 750: transistor, 751: gate electrode, 801: transistor, 803: transistor, 804: transistor, 805: transistor, 806: transistor, 807: X decoder, 808: Y decoder, 811: transistor, 812: storage capacitor, 813: X decoder, 814: Y decoder, 901: RF circuit, 902: analog baseband circuit, 903: digital baseband circuit, 904: battery, 905: power supply circuit, 906: application processor, 907: CPU, 908: DSP, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 961: substrate, 963: electrode, 965: insulating film, 967: oxide semiconductor film, 969: electrode, 971: insulating film, 1001: battery, 1002: power supply circuit, 1003: microprocessor, 1004: flash memory, 1005: audio circuit, 1006: keyboard, 1007: memory circuit, 1008: touch panel, 1009: display, 1010: display controller This application is based on Japanese Patent Application serial no. 2012-087432 filed with Japan Patent Office on Apr. 6, 2012, and Japanese Patent Application serial no. 2012-156492 filed with Japan Patent Office on Jul. 12, 2012, the entire contents of which are hereby incorporated by reference.

The invention claimed is:

1. A semiconductor device comprising:
a first oxide semiconductor film;
a second oxide semiconductor film over the first oxide semiconductor; and
an insulating film over the second oxide semiconductor film,
wherein each of the first oxide semiconductor film and the second oxide semiconductor film comprises indium, gallium, and zinc,
wherein an indium concentration is larger than a gallium concentration in the first oxide semiconductor film,
wherein the insulating film is an oxide insulating film in which a spin density of a signal at g=2.001, measured by electron spin resonance, is lower than $1.5\times10^{18}$ spins/cm$^3$, and
wherein the insulating film contains oxygen which is released by heating.

2. The semiconductor device according to claim 1, wherein an atomic ratio of indium, gallium, and zinc in the second oxide semiconductor film is 1:1:1.

3. The semiconductor device according to claim 1, wherein the insulating film is a silicon oxide film or a silicon oxynitride film.

4. The semiconductor device according to claim 1, wherein at least one of the first oxide semiconductor film and the second oxide semiconductor film comprises a c-axis aligned crystal part.

5. The semiconductor device according to claim 1, wherein a hydrogen concentration in the first oxide semiconductor film is lower than $5\times10^{19}$ atoms/cm$^3$.

6. The semiconductor device according to claim 1, wherein a hydrogen concentration in the second oxide semiconductor film is lower than $5\times10^{19}$ atoms/cm$^3$.

7. A semiconductor device comprising:
a first oxide semiconductor film;
a second oxide semiconductor film over the first oxide semiconductor; and
an insulating film over the second oxide semiconductor film,
wherein each of the first oxide semiconductor film and the second oxide semiconductor film comprises indium, gallium, and zinc,
wherein a gallium concentration is larger than an indium concentration in the second oxide semiconductor film,
wherein the insulating film is an oxide insulating film in which a spin density of a signal at g=2.001, measured by electron spin resonance, is lower than $1.5\times10^{18}$ spins/cm$^3$, and
wherein the insulating film contains oxygen which is released by heating.

8. The semiconductor device according to claim 7, wherein an atomic ratio of indium, gallium, and zinc in the first oxide semiconductor film is 1:1:1.

9. The semiconductor device according to claim 7, wherein the insulating film is a silicon oxide film or a silicon oxynitride film.

10. The semiconductor device according to claim 7, wherein at least one of the first oxide semiconductor film and the second oxide semiconductor film comprises a c-axis aligned crystal part.

11. The semiconductor device according to claim 7, wherein a hydrogen concentration in the first oxide semiconductor film is lower than $5\times10^{19}$ atoms/cm$^3$.

12. The semiconductor device according to claim 7, wherein a hydrogen concentration in the second oxide semiconductor film is lower than $5\times10^{19}$ atoms/cm$^3$.

* * * * *